(12) United States Patent
Weikle, II et al.

(10) Patent No.: US 9,366,697 B2
(45) Date of Patent: Jun. 14, 2016

(54) MICROMACHINED ON-WAFER PROBES AND RELATED METHOD

(75) Inventors: Robert M. Weikle, II, Crozet, VA (US); Arthur Weston Lichtenberger, Charlottesville, VA (US); Nicolas Scott Barker, Charlottesville, VA (US); Theodore James Reck, Charlottesville, VA (US); Haiyong Xu, Charlottesville, VA (US); Lihan Chen, Charlottesville, VA (US)

(73) Assignee: University of Virginia Patent Foundation, Charlottesville, VA (US)

(*) Notice: Subject to any disclaimer, the term of this patent is extended or adjusted under 35 U.S.C. 154(b) by 379 days.

(21) Appl. No.: 13/699,255

(22) PCT Filed: May 20, 2011

(86) PCT No.: PCT/US2011/037473
§ 371 (c)(1),
(2), (4) Date: Jan. 15, 2013

(87) PCT Pub. No.: WO2012/024007
PCT Pub. Date: Feb. 23, 2012

(65) Prior Publication Data
US 2013/0106456 A1    May 2, 2013

Related U.S. Application Data

(60) Provisional application No. 61/347,013, filed on May 21, 2010, provisional application No. 61/484,004, filed on May 9, 2011.

(51) Int. Cl.
  *G01R 1/04*    (2006.01)
  *G01R 1/067*    (2006.01)
  *G01R 3/00*    (2006.01)

(52) U.S. Cl.
  CPC .............. *G01R 1/0416* (2013.01); *G01R 1/067* (2013.01); *G01R 1/06744* (2013.01); *G01R 3/00* (2013.01)

(58) Field of Classification Search
  CPC .............................. G01R 1/0416; G01R 1/067
  USPC ............................ 324/754.01–754.2, 750.01
  See application file for complete search history.

(56) References Cited

U.S. PATENT DOCUMENTS

| 4,727,319 A | 2/1988 | Shahriary |
| 4,827,211 A | 5/1989 | Strid et al. |

(Continued)

FOREIGN PATENT DOCUMENTS

| EP | 0367542 A2 | 5/1990 |
| EP | 0367542 A3 | 5/1990 |

(Continued)

OTHER PUBLICATIONS

"International Application Serial No. PCT/US2011/037473, International Search Report mailed Feb. 10, 2012", 2 pgs.

(Continued)

*Primary Examiner* — Vincent Q Nguyen
(74) *Attorney, Agent, or Firm* — Schwegman Lundberg & Woessner, P.A.

(57) ABSTRACT

A micromachining process to fabricate a single chip that simple drops into a supporting structure. The micromachining process provides the ability to create a probe that will interface with integrated circuits, for example, operating at frequencies in the range of about 100 GHz to about 3,000 GHz (3 THz). This approach creates a silicon structure (or other applicable choice of material) that provides mechanical force for probing while supporting the transfer of the high frequency energy between a measurement system and the integrated circuit, individual device or material.

27 Claims, 51 Drawing Sheets

(56) References Cited

U.S. PATENT DOCUMENTS

| | | | |
|---|---|---|---|
| 4,849,689 | A | 7/1989 | Gleason et al. |
| 4,894,612 | A | 1/1990 | Drake et al. |
| 5,003,253 | A | 3/1991 | Majidi-Ahy et al. |
| 5,231,349 | A | 7/1993 | Majidi-Ahy et al. |
| 5,477,159 | A | 12/1995 | Hamling |
| 5,565,788 | A | 10/1996 | Burr et al. |
| 6,242,930 | B1 | 6/2001 | Matsunaga et al. |
| 6,759,859 | B2 | 7/2004 | Deng et al. |
| 6,930,497 | B2 | 8/2005 | Deng et al. |
| 7,057,404 | B2 | 6/2006 | Gleason |
| 7,233,160 | B2 | 6/2007 | Hayden et al. |
| 7,271,603 | B2 | 9/2007 | Gleason et al. |
| 7,304,488 | B2 | 12/2007 | Gleason et al. |
| 7,394,269 | B2 | 7/2008 | Gleason et al. |
| 7,427,868 | B2 | 9/2008 | Strid et al. |
| 7,436,194 | B2 | 10/2008 | Gleason et al. |
| 7,449,899 | B2 | 11/2008 | Campbell |
| 7,456,646 | B2 | 11/2008 | Hayden et al. |
| 7,495,461 | B2 | 2/2009 | Hayden et al. |
| 7,498,829 | B2 | 3/2009 | Gleason et al. |
| 7,501,842 | B2 | 3/2009 | Gleason et al. |
| 7,504,842 | B2 | 3/2009 | Schwindt |
| 7,619,419 | B2 | 11/2009 | Campbell |
| 7,688,097 | B2 | 3/2010 | Hayden et al. |
| 7,898,273 | B2 | 3/2011 | Gleason et al. |
| 2003/0112024 | A1 | 6/2003 | Deng |
| 2004/0017215 | A1 | 1/2004 | Mule et al. |
| 2004/0189334 | A1 | 9/2004 | Deng et al. |
| 2005/0194961 | A1 | 9/2005 | Summers et al. |
| 2005/0201683 | A1 | 9/2005 | Ghiron et al. |
| 2007/0075412 | A1* | 4/2007 | Reid et al. ............... 257/686 |
| 2008/0042671 | A1 | 2/2008 | Gleason |
| 2008/0068034 | A1* | 3/2008 | Bogatin et al. ........... 324/761 |
| 2009/0206369 | A1 | 8/2009 | Dang et al. |
| 2010/0026331 | A1 | 2/2010 | Chong et al. |
| 2010/0219513 | A1* | 9/2010 | Zhang et al. ............ 257/659 |
| 2011/0050371 | A1* | 3/2011 | Deal et al. ............... 333/239 |

FOREIGN PATENT DOCUMENTS

| | | |
|---|---|---|
| WO | WO-2004107401 A2 | 12/2004 |
| WO | WO-2012024007 A2 | 2/2012 |

OTHER PUBLICATIONS

"International Application Serial No. PCT/US2011/037473, International Written Opinion mailed Feb. 10, 2012", 14 pgs.

"Infinity probe: High-frequency performance with low, stable contact resistance on aluminum pads.", Cascade Microtech, Inc, Beaverton, Oregon 97006, Tech. Rep., (2002), 4 pgs.

"The infinity probe for on-wafer device characterization and modeling to 110 GHZ,", Cascade Microtech, Tech. Rep., (2004), 6 pgs.

"Virginia Diodes Inc. waveguide band designations", Virginia Diodes Inc., Tech. Rep, [Online]. Retrieved from the Internet: <URL: http://www.virginiadiodes.com, (Jun. 29, 2010), 1 pg.

Bass, R.B., "Ultra-thin silicon chips for submillimeter-wave applications", In Proceedings of the Fifteenth International Symposium on Space THz Technology, (Mar. 2004), 8 pgs.

Belsinger, H., et al., "A fracture criterion for gallium arsenide wafers", Engineering Fracture Mechanics, vol. 48, No. 2 (May 1994), 199-205.

Broue, Adrien, et al., "Thermal and topological characterization of Au, Ru and Au/Ru based MEMS contacts using nanoindenter", IEEE, (2010), 544-547.

Chasiotis, I., et al., "Strain rate effects on the mechanical behavior of nanocrystalline Au films", Thin Solid Films, vol. 515, No. 6,, (2007), 3183-3189.

Chen, Lihan, et al., "Terahertz micromachined onwafer 30 probes: Repeatability and robustness", International Microwave Symposium, (2011), 4 pgs.

Danel, J.S., "Quartz: a material for microdevices", Journal of Micromechanics and Microengineering, vol. 1, No. 4, (1991), 187-198.

Fung, A., "Onwafer vector network analyzer measurements in the 220-325 GHz frequency band", Microwave Symposium Digest,2006. IEEE MTT-S International, (2006), 1931-1934.

Godshalk, E.M., "Wafer probing at w-band", IEEE MTT-S Digest, (Sep. 1993), 171-174.

Hjort, K., et al., "Gallium arsenide as a mechanical material", Journal of Micromechanics and Microengineering, vol. 4, No. 1, (1994), 1-13.

Kooi, J. W., et al., "A full-height waveguide to thinfilm microstrip transition with exceptional RF bandwidth and coupling efficiency", International Journal of Infrared and Millimeter Waves, vol. 24, No. 3, (Mar. 2003), 261-284.

Li, Xueping, et al., "Measurement for fracture toughness of single crystal silicon film with tensile test", Sensors and Actuators A 119, (2005), 229-235.

Liu, S.M. Joseph, et al., "A New Probe for W-band On-wafer Measurements", Microwave Symposium Digest,vol. 3, (1993), 1335-1338.

Ou, Jack, et al., "Determine two-ports-parameters from oneport measurements using calibration substrate standards", IEEE Electronic Components and Technology Conference, (May 2005), 1765-1768.

Reck, Theodore, "Calibration accuracy of a 625 GHZ on-wafer probe", 76th ARFTG Microwave Measurement Conference Digest,, (Dec. 2010), 5 pgs.

Reck, Theodore J., et al., "Micromachined On-wafer Probes", Microwave Symposium Digest (MTT), 2010 IEEE MTT-S International,, (May 2010), 65-68.

Risacher, Christophe, et al., "Waveguidetomicrostrip transition with integrated bias-T", IEEE Microwave and Wireless Components Letters, vol. 13, No. 7, (Jul. 2003), 262-264.

Schimkat, J., "Contact measurements providing basic design data for microrelay actuators", Sensors and Actuators A: Physical, vol. 73, No. 1-2, (1999), 138-143.

Son, Dongik, "Evaluation of fatigue strength of LIGA nickel film by microtensile tests", Scripta Materialia, vol. 50, (May 2004), 1265-1269.

Wong, Ken, "Uncertainty analysis of the weighted least squares VNA calibration", ARFTG Microwave Measurements Conference, (2004), 23-31.

Zhou, Zhen, et al., "Development of a Broadband Coplanar Waveguide-to-Microstrip Transition With Vias", Advanced Packaging, IEEE Transactions on, vol. 31, No. 4, (Nov. 2008), 861-872.

* cited by examiner

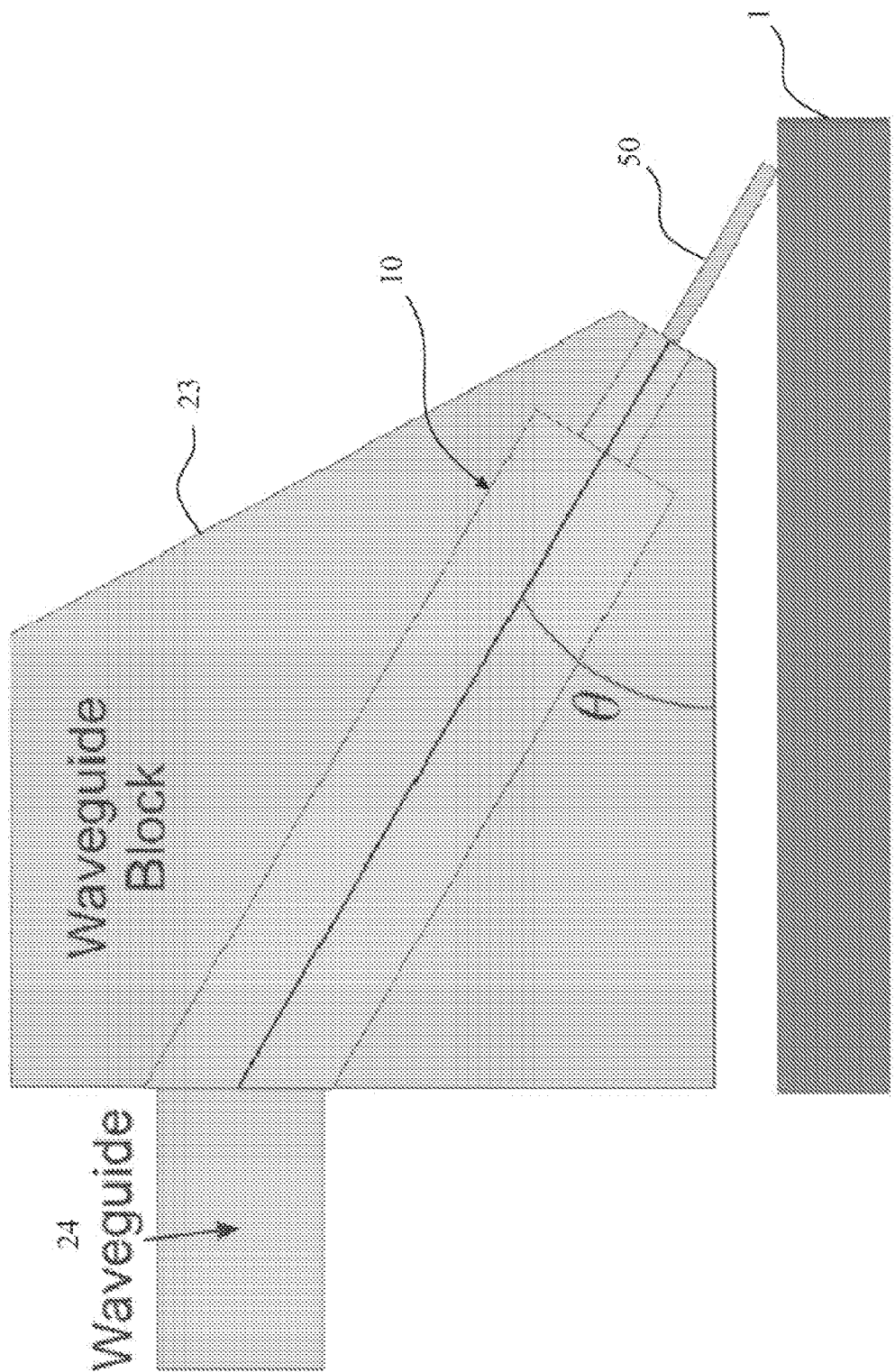

Microstrip Design

Coaxial Design

|←――― 1 mm ―――→|

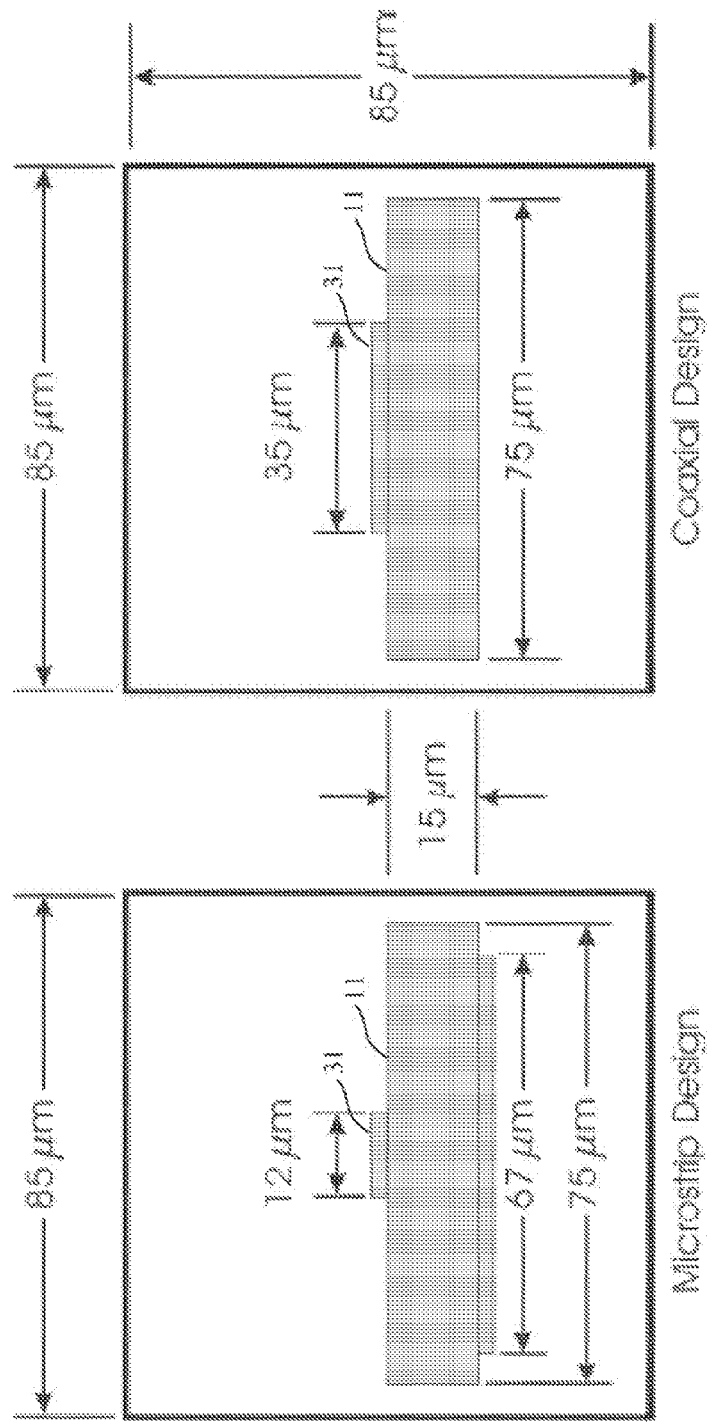

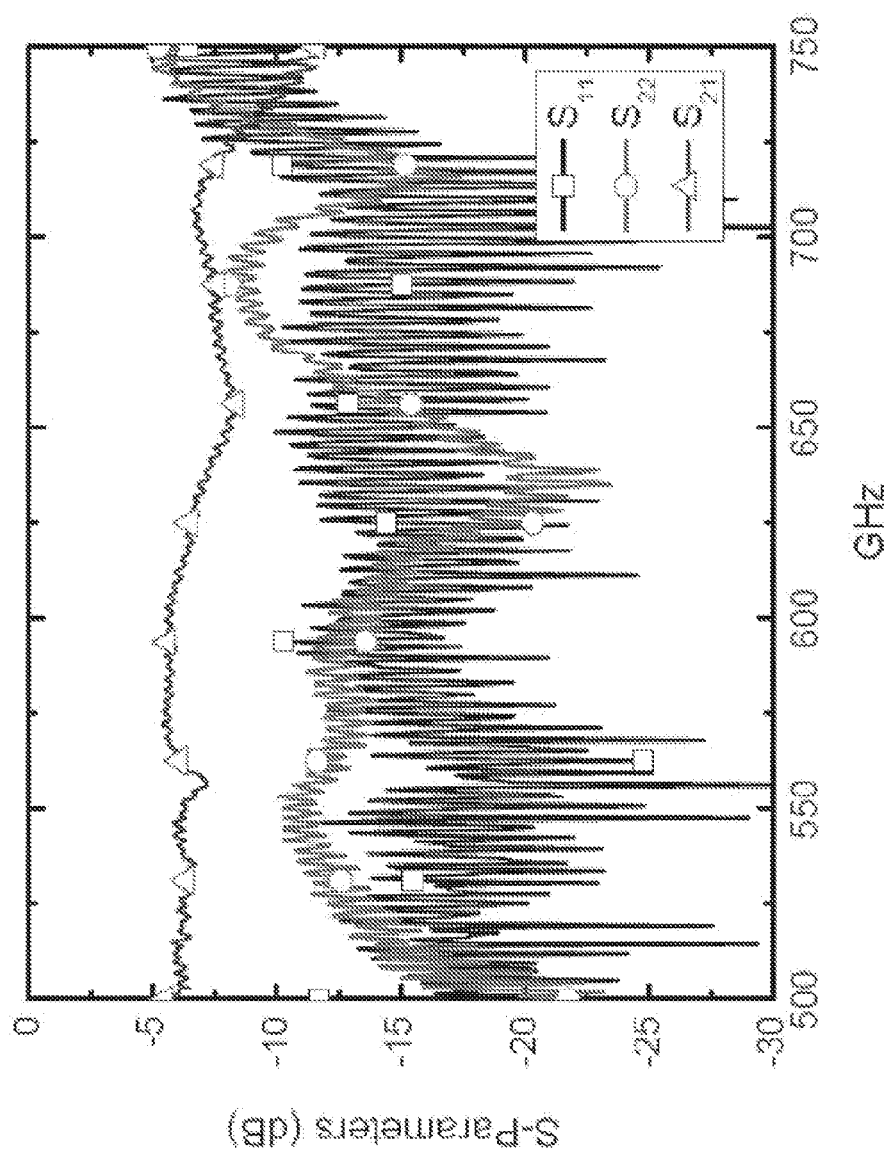

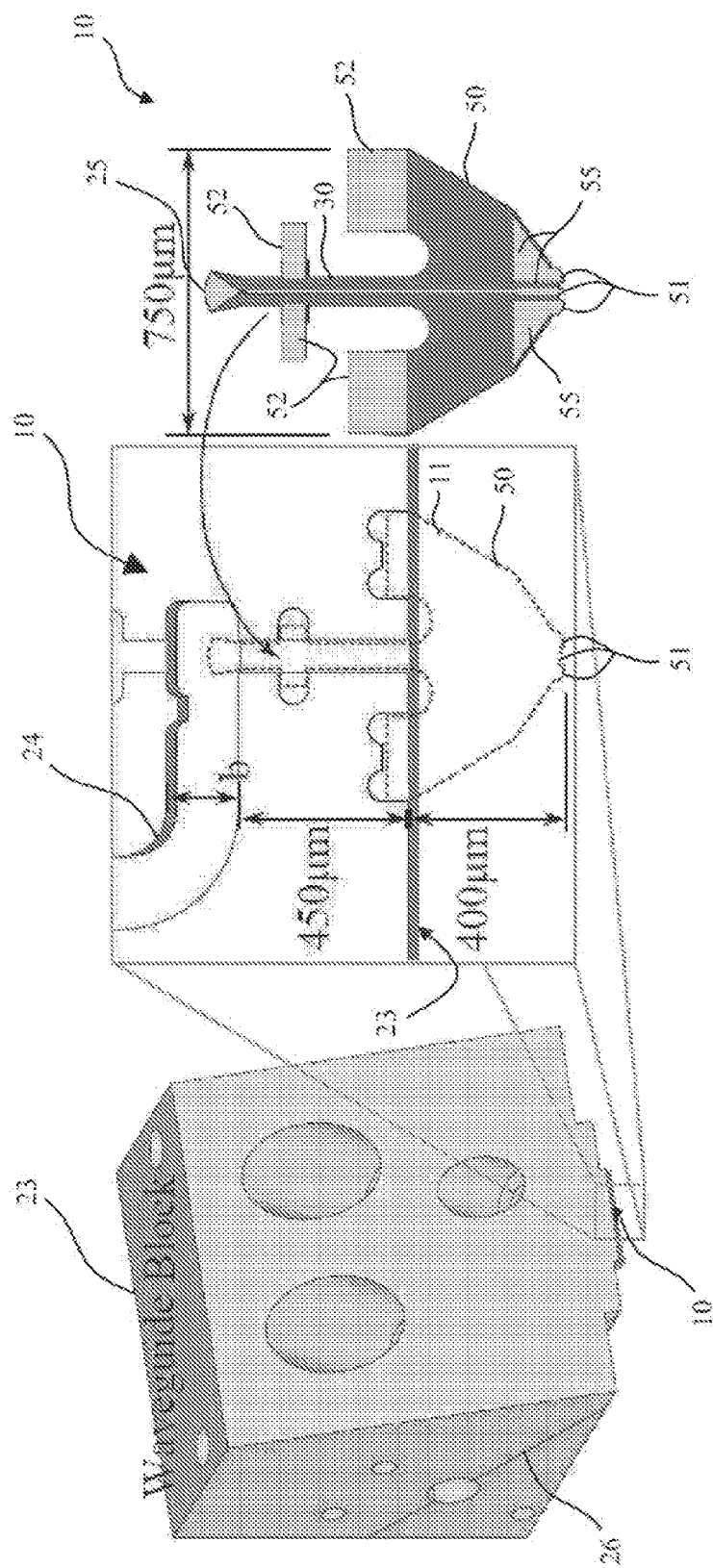

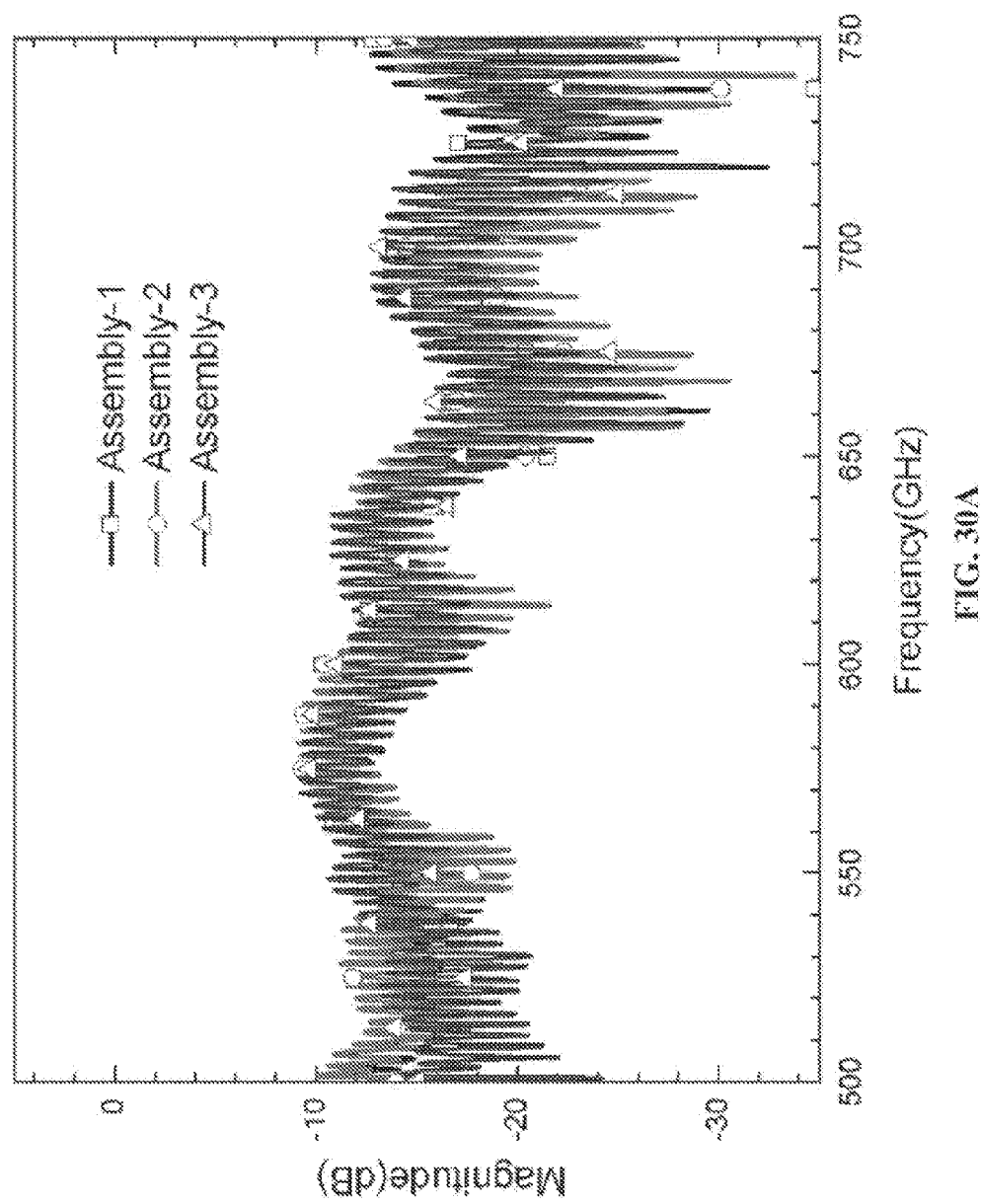

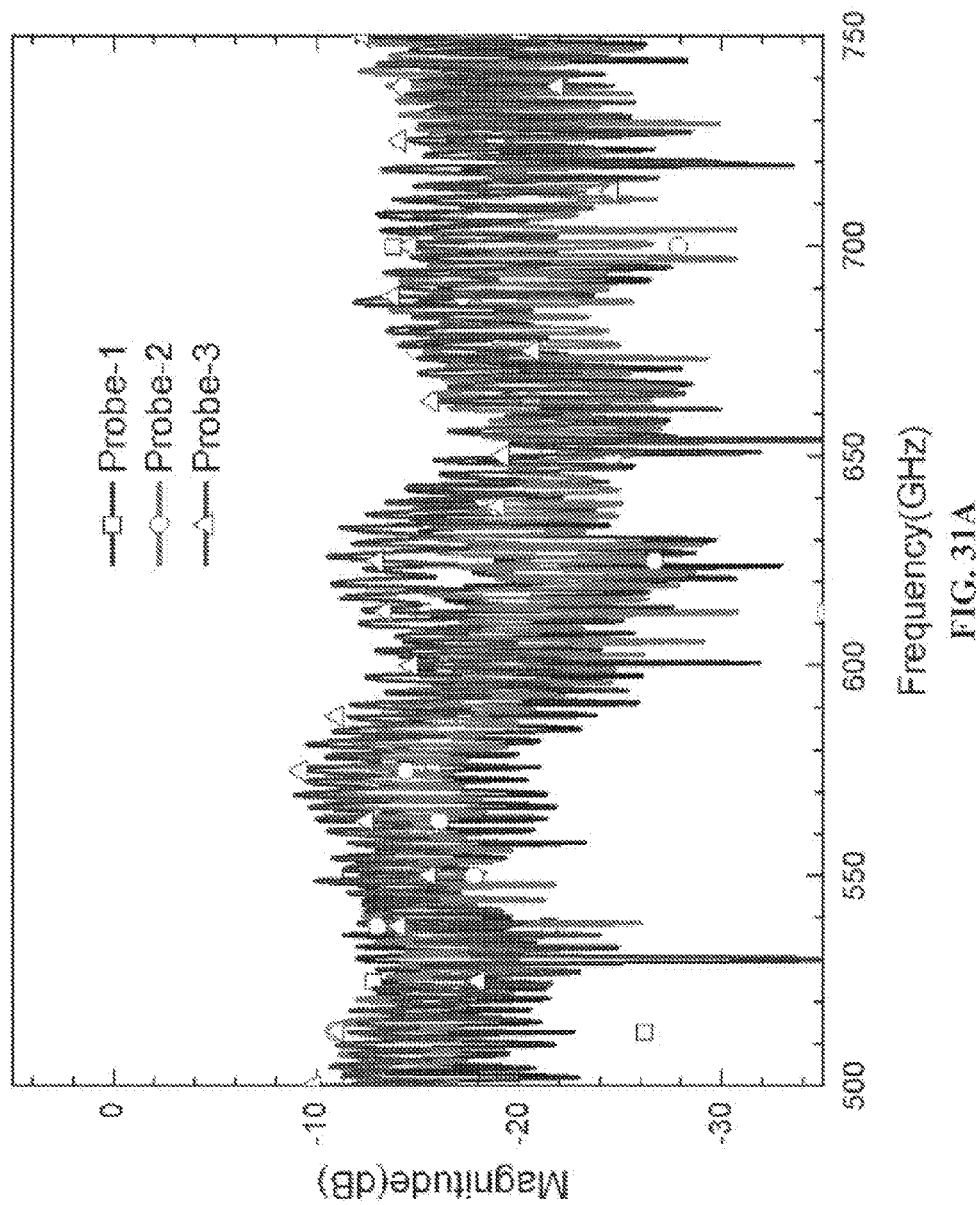

MICROMACHINED ON-WAFER PROBES AND RELATED METHOD

RELATED APPLICATIONS

The present application is a U.S. National Stage Filing under 35 U.S.C. §371 from International Patent Application Serial No. PCT/US2011/037473, filed on May 20, 2011, and published on Feb. 23, 2012 as WO 2012/024007 A2, which claims priority from U.S. Provisional Application Ser. No. 61/347,013, filed May 21, 2010, entitled "Micromachined On-wafer Probes and Related Method" and U.S. Provisional Application Ser. No. 61/484,004 filed May 9, 2011, entitled "Micromachined On-wafer Probes and Related Method;" the disclosures of which are hereby incorporated by reference herein in their entirety.

GOVERNMENT SUPPORT

Work described herein was supported by Federal Grant No. HR0011-09-C-0062, awarded by DARPA. The Government has certain rights in the invention.

BACKGROUND OF THE INVENTION

While significant progress has been made in the range of 0.5-2 terahertz integrated circuit fabrication, the measurement infrastructure for characterizing such components remains largely undeveloped. Currently, individual devices must be diced, or separated by other means, and mounted to a fixture for measurement. Further, for commercial probes that are currently available up to 340 GHz, their associated manufacturing techniques would not be transferable for higher frequency designs.

Probe structures that interface with integrated circuits exist commercially up to 500 GHz, but are very expensive since they typically rely on hand assembly of several components. At higher frequencies hand assembly becomes increasingly difficult to the point where a different approach is necessary. Moreover, even at 500 GHz and lower, for instance, it is a difficult assembly and yields a fragile product.

The conventional means of using fixtures for calibrated measurements of integrated circuits is extremely time-consuming and expensive (e.g., both in having to make the fixture and then assemble the device into the fixture and then make the measurement). By mounting a device in a fixture, additional "parasitic" effects are created that can mask the true response of the device itself. De-embedding the device response from the effects of the fixture is often difficult. It is preferable to measure the bare device on wafer prior to dicing and mounting. Moreover, a variety of calibration techniques have been developed to remove measurement errors due to probes and allow direct on-wafer measurements. Applying this to a fixtured device is difficult if not impossible.

Accordingly, there is a need in the art for direct on-wafer probing that allows rapid prototyping and characterization and also eliminates parasitic effects and responses associated with fixtures Accordingly, there is a need in the art for calibrated on-wafer measurements of submillimeter-wave devices (about 300 GHz to about 3,000 GHz) and Terahertz devices (about 100 GHz to about 10,000 GHz), which in turn would significantly reduce the effort and cost required to characterize a wafer of devices while increasing the accuracy of the measurement by eliminating errors and effects associated with the fixture.

Moreover, there is a need in the art for improved manufacturing and reliability of probe structures pertaining to millimeter-wave devices (about 30 GHz to about 300 GHz).

SUMMARY OF THE INVENTION

An aspect of an embodiment of the present invention provides, but not limited thereto, a micromaching process to fabricate a single chip that simply drops into a supporting structure. Micromachining includes processes based on integrated circuit fabrication techniques that create structures with dimensions on the order of microns. Since much of the technology from integrated circuits can be leveraged, a higher volume of devices at a lower cost can be produced with the parallel processing techniques commonly used in industry.

An aspect of an embodiment of the present invention provides, but not limited thereto, a micromaching process to create a probe that will interface with integrated circuits operating at frequencies of 100 GHz and higher. This approach creates a silicon structure (or other applicable choice of material) that provides mechanical force for probing while supporting the transfer of the high frequency energy between a measurement system and an integrated circuit, individual device or material. The integrated circuit, individual device or material may be, for example, at the micron-scale, as well as sub-micron scale such as nano-scale. Moreover, related components of the system and device of the embodiments may be micron or sub-micron scale as well.

An aspect of an embodiment provides the mechanical design and characterization of a micromachined on-wafer probe scalable to submillimeter-wave frequencies. The design may comprise a silicon micromachined probe (i.e., microfabricated compliant chip, and which may be of other suitable materials) with a ground-signal-ground (GSG) configuration on a silicon substrate. In an approach, the silicon substrate may be about 15 µm thick, or the silicon substrate could be thicker or thinner within reason, as desired or required. This micromachined chip is housed in a metal waveguide block that provides mechanical support for the probe and enables coupling to a waveguide flange. In an exemplary embodiment, loadcell measurements of the microfabricated compliant chip (i.e., probe) show a DC contact resistance below 0.07 Ω with an applied force of 1 mN.

As mentioned above, the substrate of the probe may be thicker or thinner within reason even at a design frequency of 500 GHz. Moreover, as the system design moves to higher frequencies, a thinner Silicon substrate may be implemented. For example, in an approach a 5um thick substrate is utilized for a higher frequency.

As will be discussed later, while Silicon may have been selected for a substrate material for a number of design reasons, it should be appreciated that the substrate may be realized utilizing alternative materials. For instance, besides Silicon the substrate may be anyone of the following materials: Polyimide, Fused Quartz, Gallium Arsenide, Alumina, Silicon Nitride, Kapton HN Polyimide, Single Crystalline Quartz, or synthetic diamond, as well as any other suitable synthetic materials as desired or required.

An aspect of an embodiment of the present invention provides a new approach to making millimeter-wave (about 30 GHz to about 300 GHz), sub-millimeter-wave (about 300 GHz to about 3,000 GHz) and Terahertz frequency (about 100 GHz to about 10,000 GHz) on-wafer probes. A micromaching process is applied to create more accurate probe structures so that frequencies as high as the Terahertz range (about 100 GHz to about 10,000 GHz) can be on-wafer probes. Moreover, the mechanically active component is easy to replace so repairs to the probes are feasible and economical.

Moreover, it should be appreciated that an aspect of an embodiment of the present invention provides a new approach to making on-wafer probes for direct current (DC), i.e., zero frequency.

An aspect of various embodiments of the present invention may provide a number of features, elements and characteristics, such as but not limited thereto, the following:

Integration of the waveguide probe with the probe tip in a single chip.

Use of a thin chip, such as but not limited to a silicon chip, as the mechanically active component.

Avoids expensive and challenging hand assembly of the devices that commercial probes currently rely upon.

Capability to be made smaller since the critical components are defined with microfabrication processes, and therefore can operate at frequencies higher than existing commercial probes.

Further, an embodiment of the present invention allows a design and fabrication to registrate/align the different features of the probe to tighter/better specifications. For example, an embodiment includes two outer ground tips/lines and an inner signal tip/line. These are all put down in one material and their registration to each other is better than 0.1 um. Whereas, in conventional practice, the features that are put down in different layers are typically registered to better than 2 um to each other. As a result, an aspect of an embodiment of the present invention also provides the capability to, among other things, operate at frequencies higher than existing commercial probes.

Moreover, currently there are no commercial on-wafer probes available above 500 GHz.

Further yet, an embodiment of the present invention provides an approach that may also be produced at lower frequencies for a probe at a lower cost.

Further still, an embodiment of the present invention allows the fixture (e.g. housing or block) to be used over and over again while the probe can be easily replaced. In an approach, the housing or block may be relatively more expensive compared to the probe and therefore a replaceable/disposable probe in conjunction with reusable or more permanent block would lead to economic savings.

An aspect of an embodiment of the present invention provides a device for probing a structure on a surface of an object substrate. The device comprises: a microfabricated compliant chip, wherein the microfabricated compliant chip comprises integrated electrical interconnects.

An aspect of an embodiment of the present invention provides a device for probing a structure on a surface of an object substrate. The device being configured to be secured by a housing that is configured to be able to electrically interconnect to a measurement instrument. The device comprises: a microfabricated compliant chip, wherein the microfabricated compliant chip comprises integrated electrical interconnects.

An aspect of an embodiment of the present invention provides a housing that is configured to be able to electrically interconnect to a measurement instrument. The housing comprises: an aperture that is configured to detachably engage with a microfabricated compliant chip that is used for probing a structure on a surface of an object substrate.

An aspect of an embodiment of the present invention provides a method of fabricating a device for probing a structure on a surface of an object substrate. The method may comprise: providing a substrate; and integrating electrical interconnects in the substrate to provide a microfabricated compliant chip.

An aspect of an embodiment of the present invention provides a method of fabricating a device used for probing a structure on a surface of an object substrate. The device being configured to be secured by a housing that is configured to be able to electrically interconnect to a measurement instrument. The method comprises: providing a substrate; and integrating electrical interconnects in the substrate to provide a microfabricated compliant chip.

An aspect of an embodiment of the present invention provides a method of testing a structure on a surface of an object substrate. The testing method comprises probing the surface of an object substrate with a device, wherein the device includes a microfabricated compliant chip, wherein the microfabricated compliant chip comprises integrated electrical interconnects.

A micromaching process to fabricate a single chip that simply drops into a supporting structure. The micromaching process provides the ability to create a probe that will interface with integrated circuits, for example, operating at frequencies in the range of about 100 GHz to about 3,000 GHz (3 THz), or greater. This approach creates a silicon structure (or other applicable choice of material) that provides mechanical force for probing while supporting the transfer of the high frequency energy between a measurement system and the integrated circuit, individual device or material.

These and other objects, along with advantages and features of various aspects of embodiments of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings FIG. 1A provides a schematic diagram of a device 10 for probing a structure (not shown) on a surface of an object substrate 1.

FIG. 4 schematically illustrates a side view of waveguide showing the effect of the angle on the coupling to the input waveguide.

FIGS. 20A-20B schematically illustrate the transmission line designs for the microstrip and coaxial-based probe chips, respectively.

FIG. 24B graphically illustrates the one-port measurements of the 625 GHz waveguide probes for the coaxial design.

FIG. 26A schematically illustrates a waveguide block housing the microfabricated compliant chip.

FIG. 26B provides an enlarged partial view of the area identified in FIG. 26A.

FIG. 26C schematically illustrates the front side of the microfabricated compliant chip (i.e., probe chip).

FIGS. 30A-30C graphically illustrate the measured S-parameters of the same microfabricated compliant chip (i.e., micromachined probe chip) mounted in the waveguide block three times for (a) Magnitude of $S_{11}$ (Waveguide port); (b) Magnitude of $S_{21}$; and (c) Magnitude of $S_{22}$ (CPW port), respectively.

FIGS. 31A-31C graphically illustrate the measured S-parameters of three different microfabricated compliant chips (i.e., micromachined probe chips) for: (a) Magnitude of $S_{11}$ (Waveguide port); (b) Magnitude of $S_{21}$; and (c) Magnitude of $S_{22}$ (CPW port), respectively.

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

DETAILED DESCRIPTION OF THE EXEMPLARY EMBODIMENTS OF THE INVENTION

An aspect of an embodiment provides a scalable approach to wafer probe development that integrates a rectangular waveguide probe and coplanar waveguide (CPW) wafer probe onto a single chip, such as but not limited to, a silicon chip. In an embodiment, this silicon structure can support submillimeter-wave (about 300 GHz to about 3,000 GHz) or terahertz frequency (about 100 GHz to about 10,000 GHz) transmission lines as the substrate can be made about 1 μm to about 15 μm thick to suppress coupling to parasitic substrate modes. It should be appreciated that the substrate may be less than 1 μm thick or greater than about 15 μm thick. Alternatively, the structure may be provided to support millimeter-wave (about 30 GHz to about 300 GHz) transmission lines. The mechanical characteristics of single-crystal silicon allows for a robust probe to be fabricated which supplies sufficient force for low-resistance contacts, enabling low-insertion loss coupling to the device under test (DUT) and DC biasing of probed circuits.

Figure 1A:
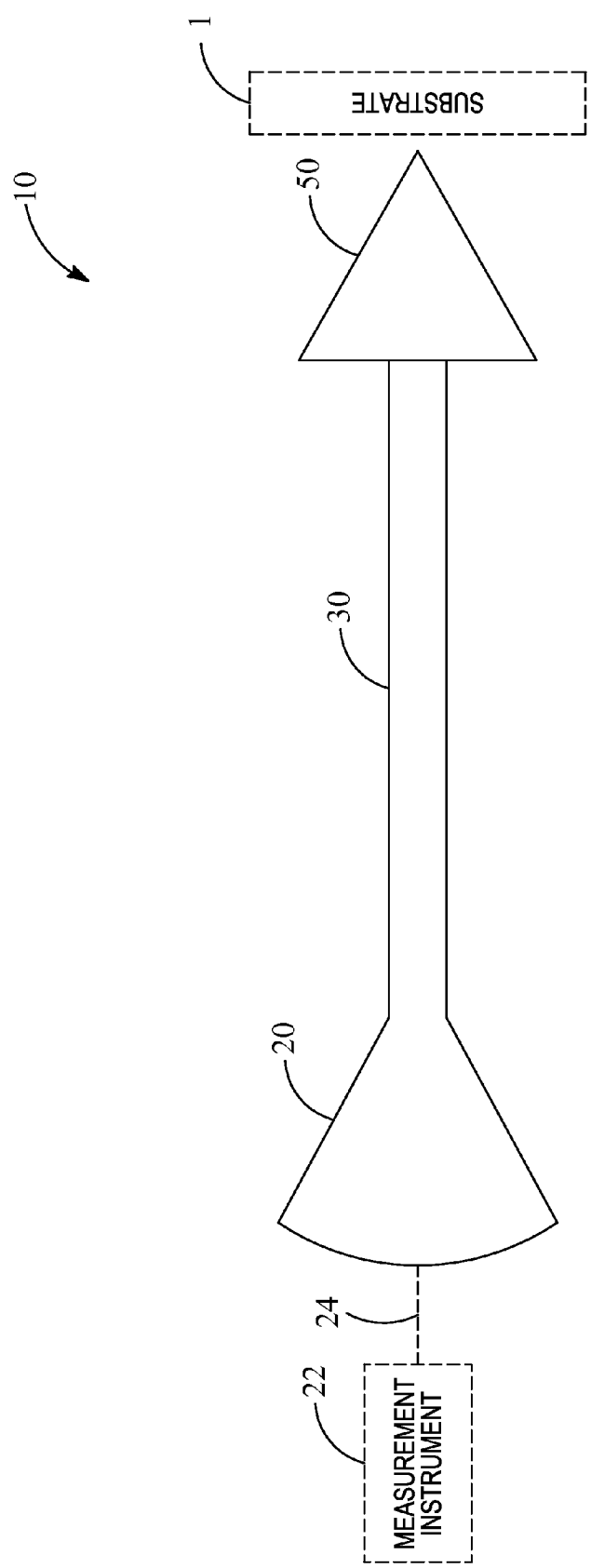
FIG. 1B provides a schematic diagram of a device 10 for probing a structure 2 on a surface of an object substrate.

FIG. 1A provides a schematic diagram of a device 10 for probing a structure (not shown) on a surface of an object substrate 1. The device 10 is a microfabricated compliant chip, wherein said microfabricated compliant chip includes integrated electrical interconnects 12 (shown in FIG. 1B). Accordingly, in an embodiment the microfabricated compliant chip is monolithic due to its single-piece circuit construction. The structure or area on the object substrate 1 may be anyone one of one or more of the following: integrated circuit or any type of microelectronic device, microelectromechanical (MEM) device, non-electronic device, or a sample of material with appropriate contacts or some other geometric feature that has been fabricated on the substrate surface. The structure may be of interest for purpose of characterizing a material on the object substrate rather than characterizing a device on the object substrate. For instance, the material of interest for characterizing may be a biological material, such as DNA, RNA, proteins, etc. or any other biological materials as desired or required. Moreover, the material of interest for characterizing may be graphene, an atomic scale lattice structure, or an atomic scale lattice structure, as well as any other applicable structure or material. The structure or area on the object substrate may be, for example, an integrated circuit, electric device, non-electric device, individual device or material that may be at, for example, the micron-scale, as well as sub-micron scale such as nano-scale. Still referring to FIG. 1A, in an embodiment, the integrated electrical interconnects 12 (shown in FIG. 1B) of the microfabricated compliant chip 10 may generally comprise one of the following: at least one compliant beam 50, at least one transmission circuit 30; and a waveguide transition element 20, whereby the transmission circuit 30 is suitable to electrically interconnect the compliant beam 50 with the waveguide transition element 20. The waveguide transition element 20 is configured to be electrically interconnected with a measurement instrument 22, by way of a waveguide 24, for example. The measurement instrument 22 may be a network analyzer or vector network analyzer (VNA), or any system or device capable of measuring, analyzing, storing, processing and/or recording the data. Although not shown, the integrated electrical interconnects 12 may be further configured to supply a bias current (or bias voltage as well) to the object substrate. Moreover, other active and passive circuit components may be added to the integrated electrical interconnects 12 as desired or required.

Figure 1B:
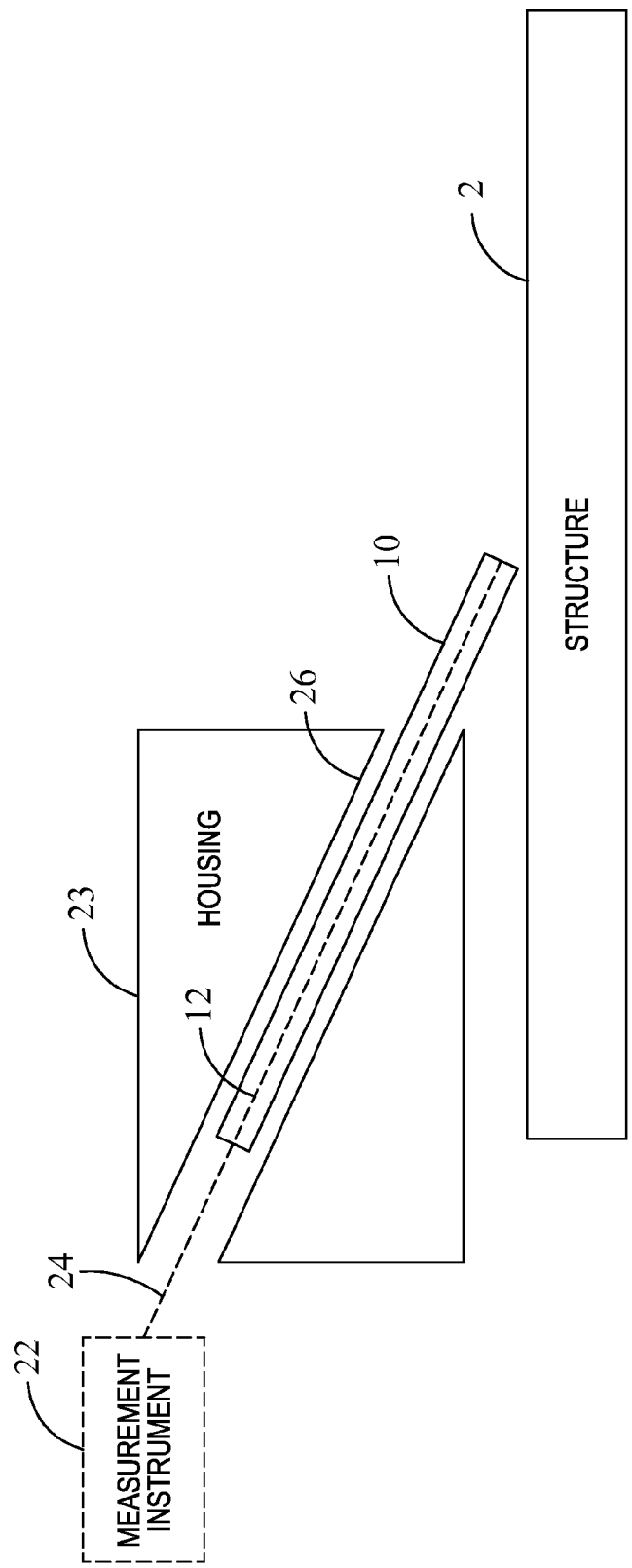

As shown in FIG. 1B, the microfabricated compliant chip device 10 is configured to be secured by a housing 23 by an aperture 26 (or other retention mechanisms or means) provided by the housing 23 or it's related components. The aperture 26 may be a block split, or other available configurations such as a slot, groove, recess, channel, tunnel, indentation, passage, slit, or port. Further yet, the microfabricated compliant chip 10 may be secured to the housing in a manner that is deatachably engaged with the housing (e.g., so as to be releasable from the housing). For instance, if the microfabricated compliant chip device is damaged then the chip may be readily removed and replaced. Alternatively, the chip may be substituted with a different chip or device if desired or required. Compressive forces induced by the housing or it's related components will secure and align the microfabricated compliant chip 10 in place. And further, the amount of compressive force may be altered (as desired or required) by increasing or decreasing its magnitude, as well as changing the area or location of the applied force. The housing may be configured to be reusable, but not necessarily.

As will be discussed in greater detail below, the microfabricated compliant chip 10 is configured whereby when it is presented to a structure 2 on a surface of an object substrate 1 and when the prerequisite force is applied, then the entire structure (or at least substantially) of the microfabricated compliant chip 10 (that is not clamped in the housing) deflects. The thickness and length of the structure of the microfabricated compliant chip 10, as well as the angle that it is presented to the structure 2 on a surface of an object substrate 1, is optimally designed such that enough force is generated with a modest amount of flexure of the microfabricated compliant chip 10. The force exerted by the microfabricated compliant chip 10 on the object substrate 1 is what is needed to insure a good electrical contact.

Figures 2A, 2B:
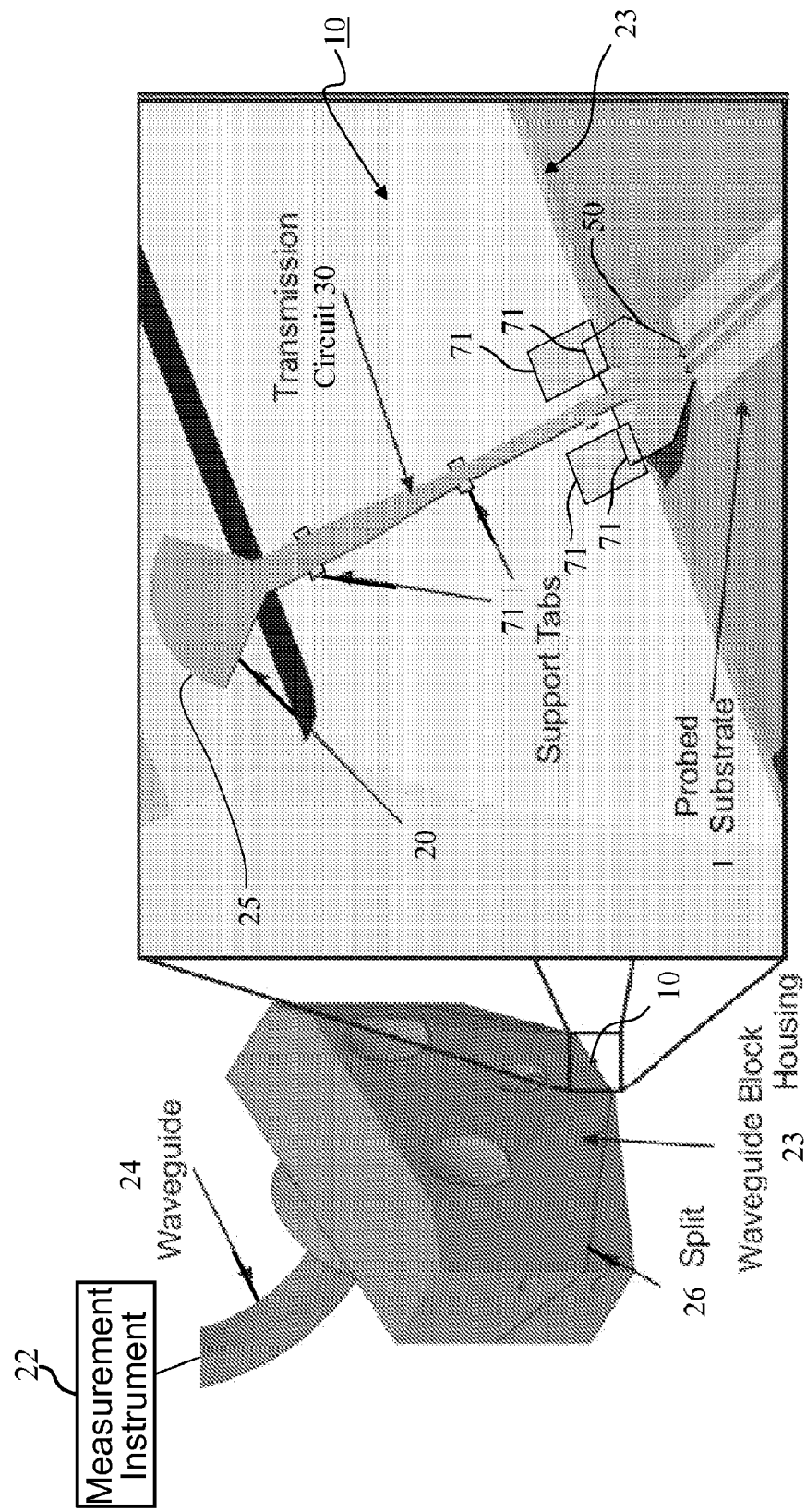
FIG. 2A schematically illustrates a waveguide block housing the microfabricated compliant chip.
FIG. 2B schematically illustrates an enlarged partial view of FIG. 2A including the microfabricated compliant chip in relation to waveguide block housing. The top half of the block is removed for clarity. Not visible on the underside of the chip is the conductor connecting the waveguide to the compliant beam.

As illustrated in FIG. 2, a housing 23 is provided, such as a waveguide block. In an embodiment, the waveguide block may be an E-plane split waveguide block type having a split 26 that houses the microfabricated compliant chip 10, such as silicon chip. FIG. 2B schematically shows tabs 71 of silicon, for example, that are electroplated with gold which are clamped between the two halves of the waveguide block, providing mechanical support and alignment of the chip 10 (e.g., wafer probe) to the housing 23. The chip 10 couples from waveguide 24, through a waveguide probe 25, such as a radial probe (e.g., radial E plane waveguide probe) into the transmission circuit 30, e.g., a transmission line channel. This channel emerges from the block 23 where the mode is converted to the Ground-Signal-Ground (GSG) of the compliant beam 50 of the microfabricated compliant chip 10 (e.g., wafer probe).

In an embodiment, silicon may be used (as opposed to alumina or polyimide or other suitable material, for example) because it is more compatible with micromachining processes and its high elastic modulus produces significant force for low-resistance contacts, even with the thin substrates required at submillimeter-wave or terahertz frequencies. Secondly, the fabrication process allows for full lithographic control over the extents of the silicon substrate, allowing excellent matching between functional transmission lines and precise control of the geometry of the probe. Finally, use of a split waveguide block design and drop-in probe chip modules allow for user friendly replacement of any worn, damaged or unwanted microfabricated compliant chips 10.

EXAMPLES

Practice of an aspect of an embodiment (or embodiments) of the invention will be still more fully understood from the following examples and experimental results, which are presented herein for illustration only and should not be construed as limiting the invention in any way.

Example and Experimental Results Set No. 1

An exemplary embodiment presented in this Example and Experimental Set provides the mechanical design and performance of a microfabricated compliant chip 10 (i.e., a micromachined probe) for a W-Band (75-110 GHz) prototype and a waveguide probe 25 (e.g., WR-1.5 (500-750 GHz)) developed to measure emerging planar submillimeter-wave devices. The electromagnetic design is presented in the Example and Experimental Results Set No. 2 that is found later in this disclosure.

I. Mechanical Design

The structure of microfabricated compliant chip 10 must provide sufficient force to create a low resistance electrical contact to the device (e.g., planar or non planar device) that is being measured. This minimizes insertion loss and enables biasing of active devices. Commercial probes quote contact resistances at or below 0.1 Ω. Based on microactuator measurements it is hypothesized that at least 0.2 mN of force per tip is required between the probe and the device under test (DUT) to achieve this contact resistance for gold-to-gold contacts.

Figure 3:
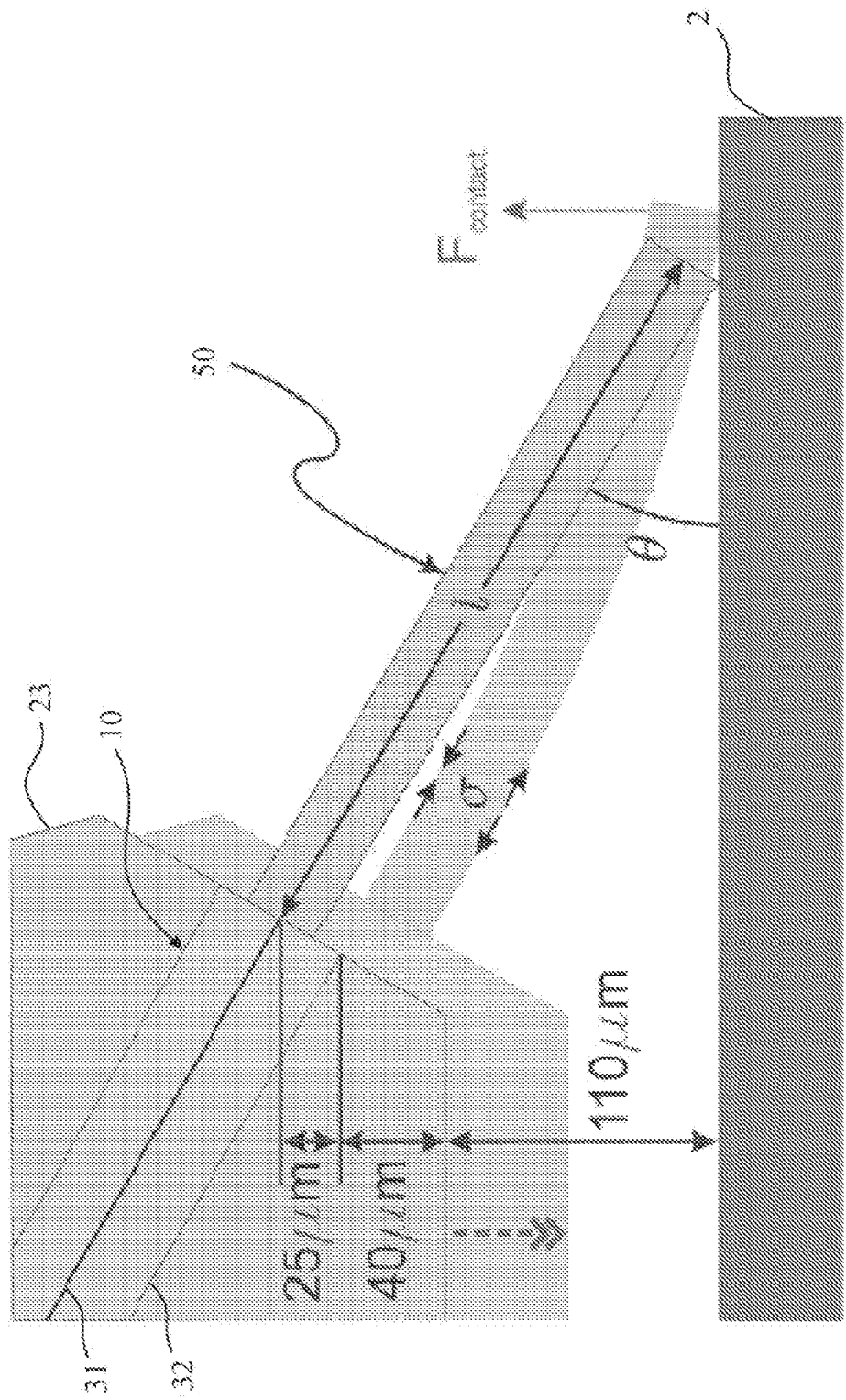
FIG. 3 schematically illustrates the compliant beam of the microfabricated compliant chip pressing against the device under test (DUT). As the chip is lowered from a first position to a second position onto the DUT, a stress a is introduced into the chip.

This force is generated by the cantilever beam formed by fixing the microfabricated compliant chip 10 (e.g., silicon chip) to the housing 23 (e.g., waveguide block) in the areas indicated in FIG. 2. As the compliant beam 50 of the microfabricated compliant chip device presses against the device under test (DUT) 2, the deflection of the compliant beam 50 (or applicable portion of the microfabricated compliant chip) generates the contact force, as illustrated in FIG. 3. The reaction to this force is the stress, σ, induced in the beam. If this stress exceeds the yield strength of the material used in the microfabricated compliant chip 10, the chip will fail. Table I lists the yield strengths of several materials compatible with micromachining processes. FIG. 3 illustrates the chip being lowered from an initial position to a subsequent position, whereby the compliant beam 50 is shown deflected or flexed.

A. Angle of Approach and Microfabricated Compliant Chip Length

The angle of the microfabricated compliant chip 10 with respect to the object substrate 1 (θ in FIG. 4) impacts several critical elements of the microfabricated compliant chip 10 design. First, the compliant beam 50 must be sufficiently long to extend beyond the block 23 so as to be visible from an overhead microscope (not shown) or other instrument. Second, the compliant beam 50 must reach below the level of the waveguide block 23 so that the microfabricated compliant chip 10 makes contact with sufficient margin as to prevent the waveguide block 23 from touching the object substrate 1 or DUT. Finally, the coupling from the input waveguide 24 to the split-waveguide probe housing 23 is an important factor in choosing θ.

Figure 5A:
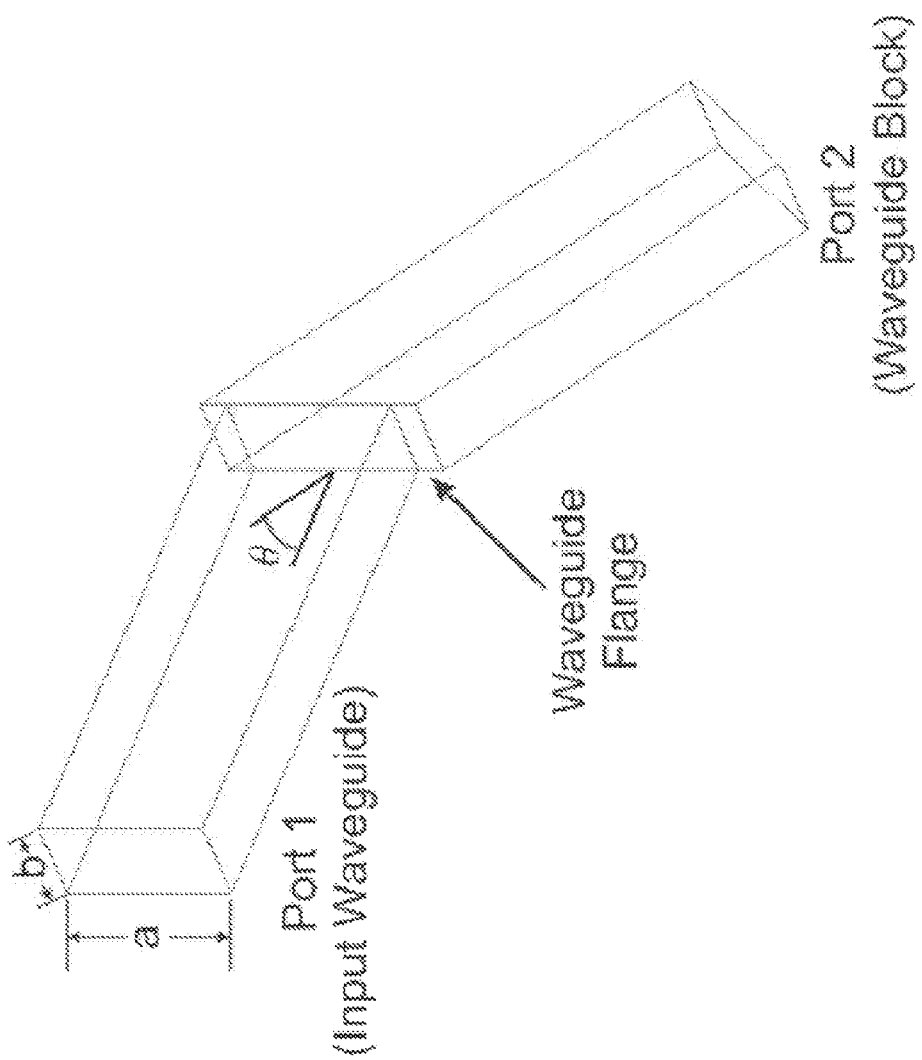
FIG. 5A schematically represents a simulation demonstrating the effect of the angle of approach ($\theta$) coupling between the input waveguide and the chip's related waveguide block.
Figure 5B:
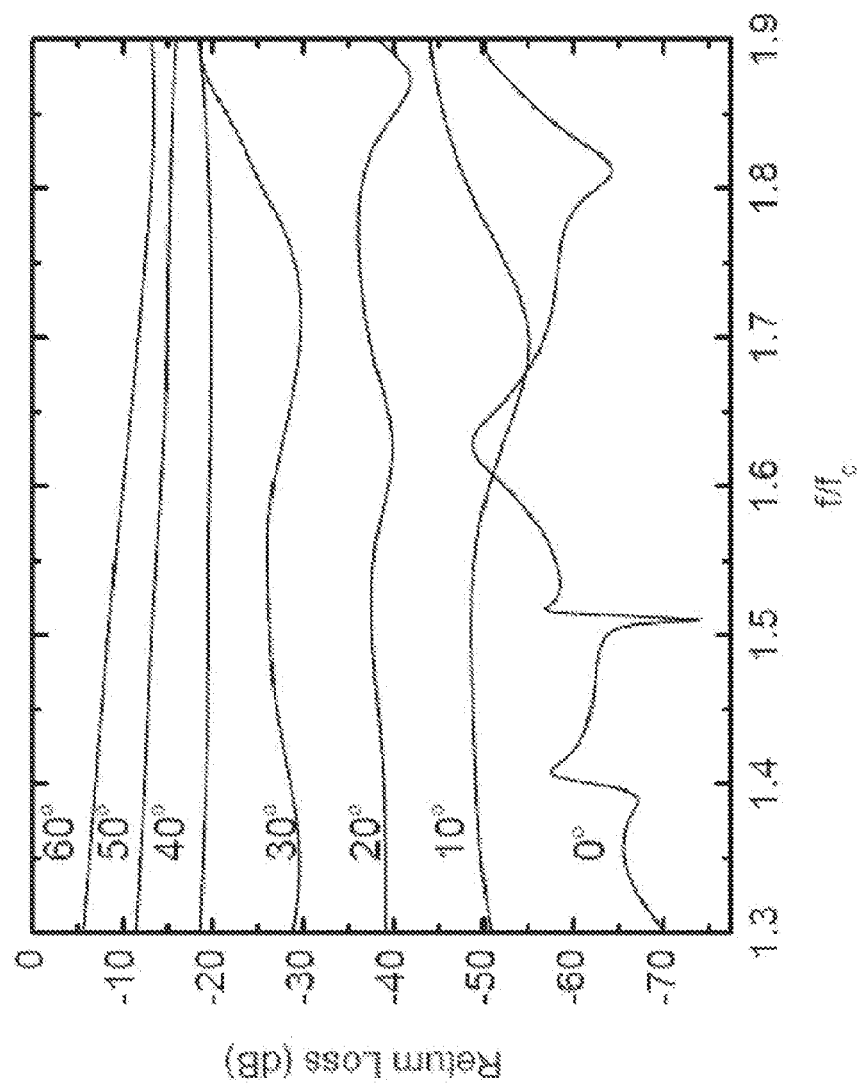
FIG. 5B graphically represents a simulation demonstrating the effect of the angle of approach ($\theta$) coupling between the input waveguide and chips's related waveguide block.

A direct connection between the input waveguide 24 and the angled waveguide of the split block 23, illustrated in FIG. 4, is analyzed to simplify the design of the housing 23. FIG. 5 shows a finite element model of the two waveguides connected at an angle θ. The angled waveguide is simply cut flush at the end of the waveguide block, exposing a cross section of the waveguide that is $a/\cos(\theta)$ long, and centered on the input waveguide. Using HFSS™, simulations of this transition show that the return loss is better than 20 dB for angles less than or equal to 30°. Consequently, 30° is chosen as the angle of approach for the microfabricated compliant chip 10 so that no additional transition structures are necessary to couple to the input waveguide 24.

The length of the microfabricated compliant chip 10 is chosen based on the constraints shown in FIG. 3, for example. The channel 32 enclosing the transmission line 31 of the microfabricated compliant chip 10 is 100 μm high, so the vertical projection of the distance from the center of the microfabricated compliant chip 10 to the base of the channel 32 is 25 μm. A minimum of 40 μm is left between the bottom of the block and the transmission line channel 32 to avoid deformation of the machined material. Lapping the bottom of the waveguide block after milling permits the block thickness below the channel to be set to 40±3 μm. A separation of at least 110 μm between the block and the DUT 2 is left when the probe initially contacts the DUT, so the length of microfabricated compliant chip 10 (i.e., probe length) is calculated as:

$$l = (40\ \mu m + 110\ \mu m + 25\ \mu m)/\sin(30°) = 350\ \mu m \quad (1)$$

B. Beam Analysis and Material Selection

Figure 6:
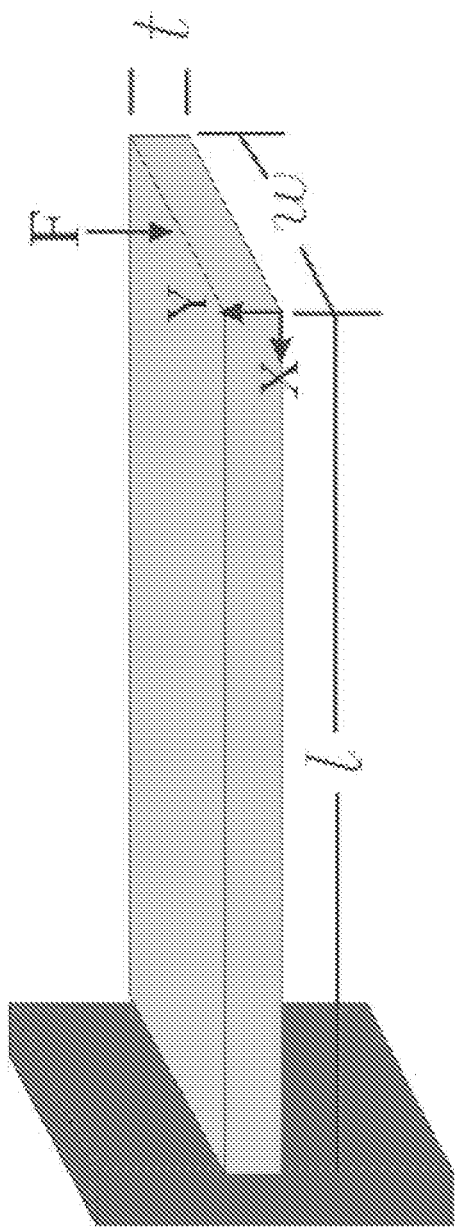
FIG. 6 schematically represents dimensions of a cantilever beam.

Many different materials compatible with microfabrication processes are available to form the microfabricated compliant chip 10, with some of the more common listed in Table I along with their relevant material properties. To compare these materials, the maximum deflection and force of a prismatic cantilever beam for each are calculated. Although the actual microfabricated compliant chip 10 structure is more complex, this simple structure can be analyzed directly, and allows straightforward comparison between the materials. FIG. 6 shows a cantilever beam with a single point force, F, on the end of the beam. The maximum stress, $$\frac{max}{x},$$

is at the base of the beam and given by:

$$\sigma_x^{max} = \frac{Flt}{2I}. \quad (2)$$

TABLE I

MATERIAL PROPERTIES OF CANDIDATE BEAM MATERIALS. E IS THE ELASTIC MODULUS AND $\sigma^{yield}$ IS THE YIELD STRENGTH.

| Material | E (GPa) | $\sigma^{yield}$ (MPa) | $E_r$ | Modulus of Resilience (kJ/m³) |
|---|---|---|---|---|
| Gold | 80 | 220 | N/A | 302 |
| Nickel | 207 | 320 | N/A | 447 |
| Fused Quartz | 73 | 50 | 3.8 | 17 |
| Gallium Arsenide | 118 | 85 | 12.9 | 30 |
| Alumina | 300 | 330 | 9.1 | 181 |
| Silicon Nitride | 310 | 830 | 5-8 | 1,111 |
| Kapton HN Polyimide | 2.5 | 230 | 3.2 | 10,580 |

TABLE I-continued

MATERIAL PROPERTIES OF CANDIDATE BEAM MATERIALS. E IS THE ELASTIC MODULUS AND $\sigma^{yield}$ IS THE YIELD STRENGTH.

| Material | E (GPa) | $\sigma^{yield}$ (MPa) | $\in_r$ | Modulus of Resilience (kJ/m³) |
|---|---|---|---|---|
| Single Crystalline Quartz | 97 | 1700 | 4.6 | 14,897 |
| Silicon | 185 | 4500 | 11.9 | 54,730 |

By setting $$\sigma \frac{max}{x} = \sigma^{yield}$$

(the yield stress) we can solve for the maximum force and deflection the beam can withstand at the point of failure $$F^{max} = \frac{wt^2}{6l}\sigma^{yield} \quad (3)$$

$$y^{max} = \frac{-2l^2}{3Et}\sigma^{yield} \quad (4)$$

for a rectangular cross section.

It should be noted that this analysis assumes the force applied is perpendicular to the beam, along the y-axis in FIG. 6. As can be seen in FIG. 3 this is not quite correct since the microfabricated compliant chip 10 approaches the probed DUT 2 at an angle (It should be appreciated that the angle may vary as desired or required). This will generate an additional component of the force along the length of the cantilever. However, by comparing simulations of the probe with experiment, it has been found that this axial force is largely relieved as the probe slides against the probed DUT. Therefore we neglect the axial component of the stress in the remaining analysis.

The beam material must support a high maximum force for a given deflection. This is to ensure the probe is rugged and will not easily break during normal use. It is noted that a higher yield strength is preferable, but the elastic modulus has a diminishing effect on the maximum deflection, based on equation (4). A figure of merit that is related to these two material parameters is the modulus of resilience. The modulus of resilience, $u^y$, is defined as the amount of strain-energy density that a material can support before failure:

$$u^y = \frac{(\sigma^{yield})^2}{2E}\left(\frac{J}{m^3}\right). \quad (5)$$

The modulus of resilience for different materials is listed in Table I and allows for direct comparison of the various candidate substrates.

Figure 7:
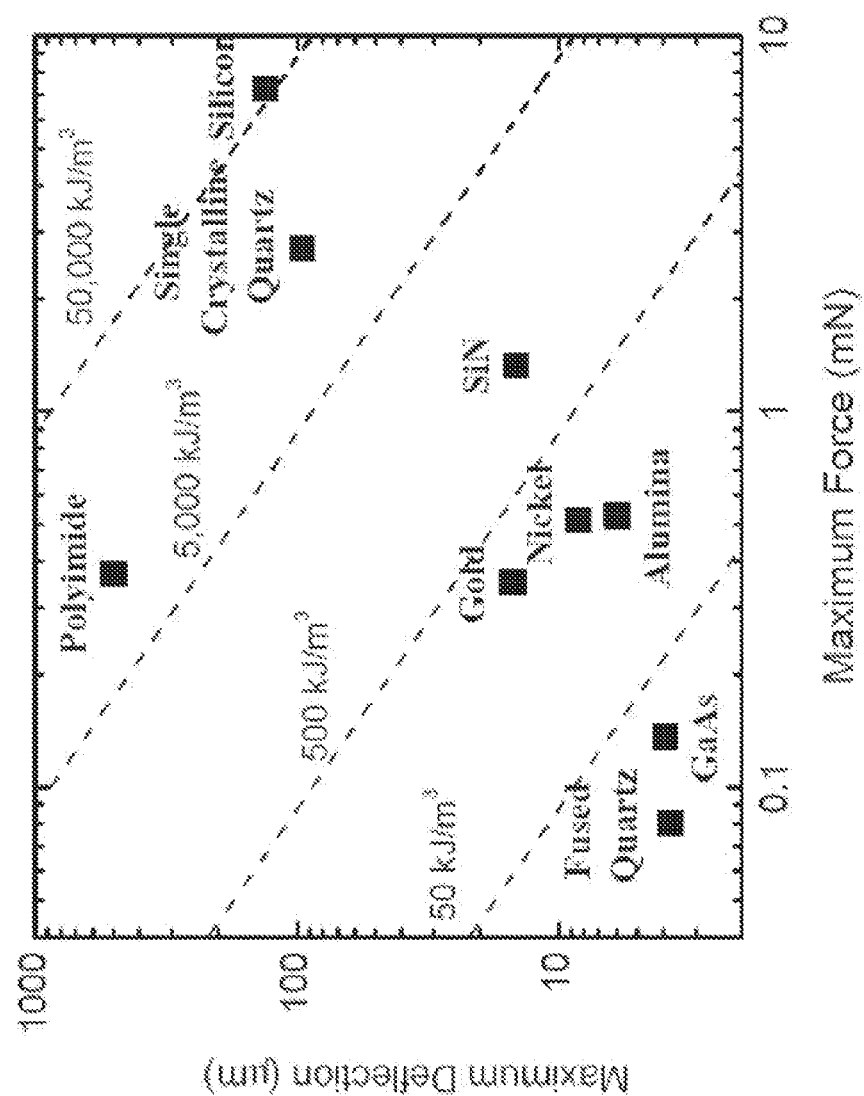
FIG. 7 provides a graphical comparison of the materials in Table I in a cantilever structure. These results are for a cantilever 350 μm long, 15 μm wide and 15 μm thick. Lines of constant strain-energy density for the cantilever are indicated.

The modulus of resilience allows for comparison independent of the geometry, but it fails to provide a sense of the material's performance with respect to the maximum force and deflection. Choosing a specific geometry for the beam allows these maximums to be calculated and different probe materials to be compared. This comparison is shown in FIG. 7 for a beam that is 350 μm long with a width and thickness of 15 μm. Contours of constant strain-energy density for the cantilever are indicated on the plot, for comparison to the modulus of resilience.

From this most of the materials listed in Table I can be eliminated compared to the performance of polyimide, single crystalline quartz and silicon. The anisotropic nature of single crystalline quartz may complicate the electromagnetic design of the probe so this is eliminated. Polyimide has a lower maximum force for this particular geometry due to its relatively low elastic modulus. If the polyimide beam is made thicker it can provide a maximum force on the same order as silicon, with the tradeoff being that the maximum deflection is reduced. For instance, a polyimide beam 66 μm thick would generate a maximum force of 7 mN with a corresponding deflection of 96 μm, which is similar to the performance of a 15 μm thick silicon beam.

For high frequency operation, we wish to minimize the electrical thickness of the dielectric to avoid coupling to substrate or surface modes. A 15 μm thick silicon beam ($\in_r$=11:9) will be $\lambda_d/10$ thick at 625 GHz (the center of the WR-1.5 waveguide band), while the 66 μm thick polyimide beam ($\in_r$=3:2) will be $\lambda_d/4$ thick. Although the dielectric constant of polyimide is lower than silicon, its smaller elastic modulus forces the beam to be electrically thicker than silicon to achieve comparable contact forces. In addition, the higher modulus of resilience of silicon allows for greater design freedom over that of polyimide, helping ease other design constraints. For these reasons silicon is chosen as the substrate material of the microfabricated compliant chip 10.

C. Drop-In Microfabricated Compliant Chip 10 Assembly

Figure 8:
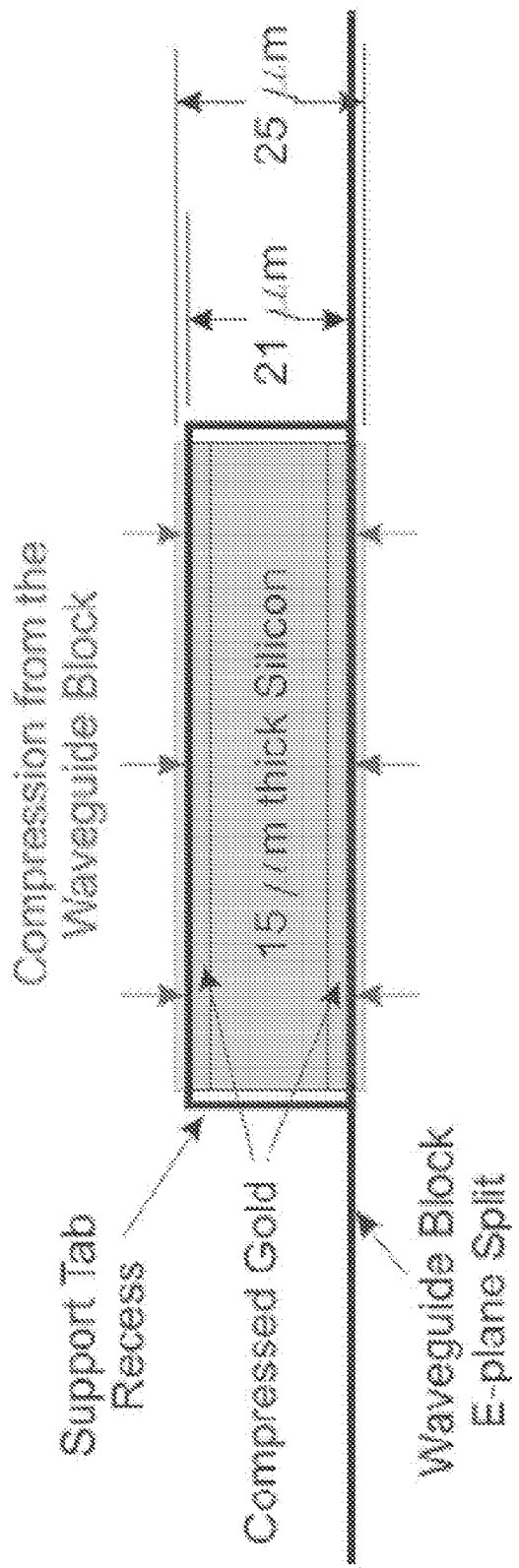
FIG. 8 schematically illustrates a side view of a clamping recess with the silicon chip in place. When the two halves of the waveguide block are pressed together, the total chip thickness of 25 μm is compressed down to 21 μm. This compressed gold protects the silicon from the waveguide block while fixing the chip in place, providing mechanical support for the chip.

To facilitate assembly, the microfabricated compliant chip 10 is secured to the housing 23 by clamping the microfabricated compliant chip 10 between the two halves of the waveguide block 23, eliminating the need for adhesives or the like during assembly. As schematically shown in FIG. 8, recesses are milled into one half of the waveguide block to a depth sufficient to support the thickness of the silicon substrate tabs, but compress the 5 μm of electroplated gold that is applied to both sides of the microfabricated compliant chip 10. This gold provides a cushion between the silicon and the relatively rough surface of the waveguide block, preventing chipping or cracking of the microfabricated compliant chip 10. This approach simultaneously provides alignment of the chip to the waveguide block and mechanical support for the chip. The gold must be sufficiently thick to compensate for variations in the depth of the recess, but with modern machining techniques a tolerance of ±3 μm can be achieved. Other materials besides gold may be implemented if desired or required, such as but not limited thereto Indium (could be plated), various alloys of gold, as well as other suitable materials.

D. Additional Design and Stress Analysis

Figure 9:
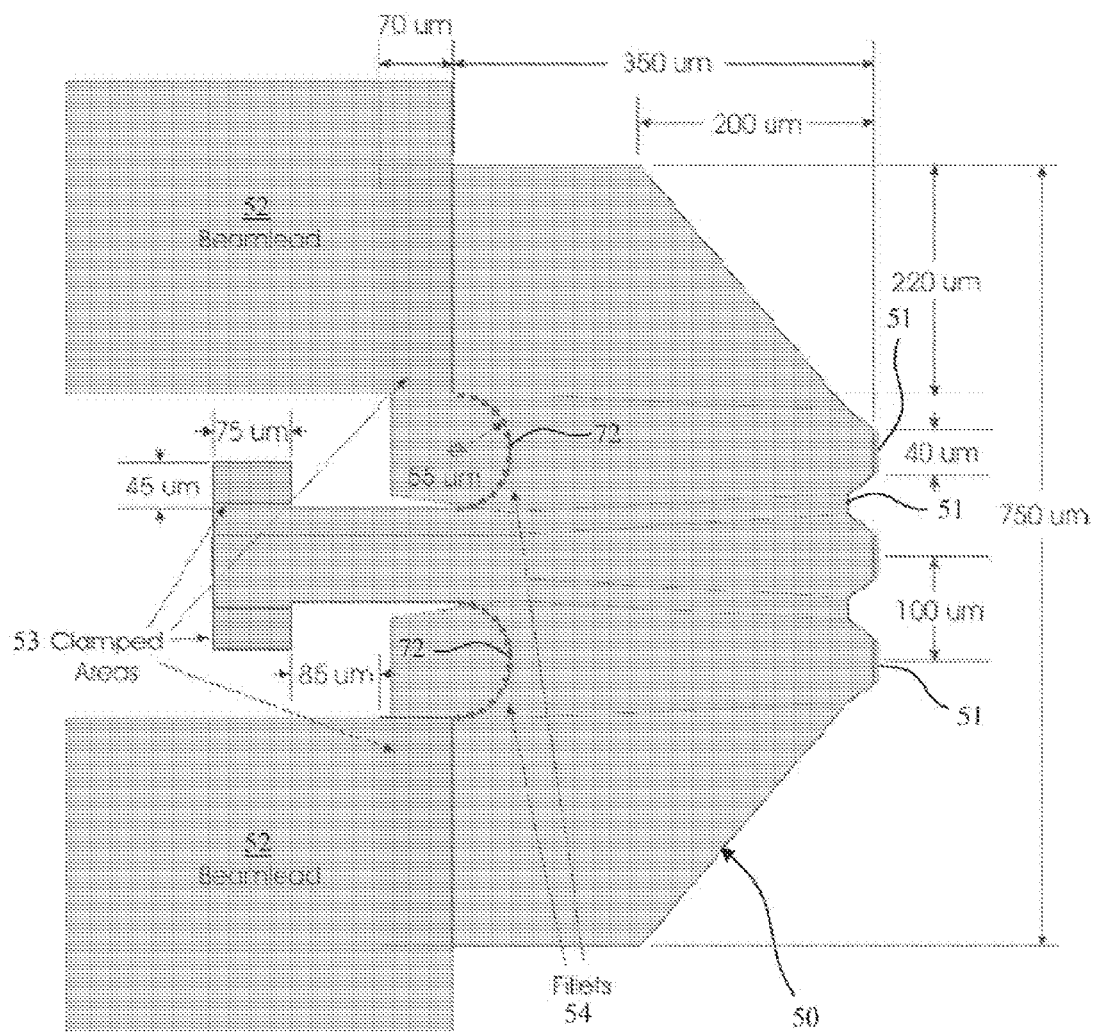
FIG. 9 schematically illustrates at op view of the W-Band compliant beam indicating the clamped area and relevant dimensions. The outline of the substrate is visible through the beamlead so the shape of the silicon can be observed.

Additional considerations of shape of the microfabricated compliant chip 10 may be guided by two goals, for example. First, the geometry of the microfabricated compliant chip 10 must reduce the concentration of the stress induced into the microfabricated compliant chip 10 by the contact force. A minimum of 0.2 mN of force must be applied to create a low-resistance gold-to-gold contact. The force applied is to the entire structure of the compliant beam 50, but it is the force at the contact tip 51 that we measure with our load cell. This force at the contact tip 51 is what is needed to insure a good electrical contact. As a margin of safety, 1 mN of force per contact tip 51 is chosen for this design. The maximum stress induced under this force must not exceed the yield strength of silicon, 4.5 GPa. Second, the mechanical design must allow for a transmission line 31 to connect the waveguide 24 to the microfabricated compliant chip 10. Therefore, the microfabricated compliant chip 10 is designed to be 750 μm wide (i.e. have a width of 750 μm) to support a transmission line while allowing sufficient area for the silicon to be clamped to the housing in a region that is far from the electromagnetically active portion of the microfabricated compliant chip 10. This results in the clamped areas 53 being located at the edges of the microfabricated compliant chip 10 so that the transmission line can emerge from the waveguide block along the center, as shown in FIG. 9.

A substrate thickness of 15 μm is chosen for this design as it will ensure sufficient contact force and is electrically thin at W-Band. It is noted that at this W-band, we could have obtained a working design with modestly thicker and certainly with thinner Si. Therefore, it is not the case that 15 μm is the only or necessarily the perfect thickness at W-band. For the submillimeter probe operating at 625 GHz and above, this thickness is greater than $\lambda_d/10$. Although this electrical thickness is greater than the design guideline, full-wave electromagnetic simulations verify that there is not excessive radiation into the substrate. Once characterized, the mechanical performance of this design will inform the use of thinner substrates for higher frequency probes.

Figure 10:
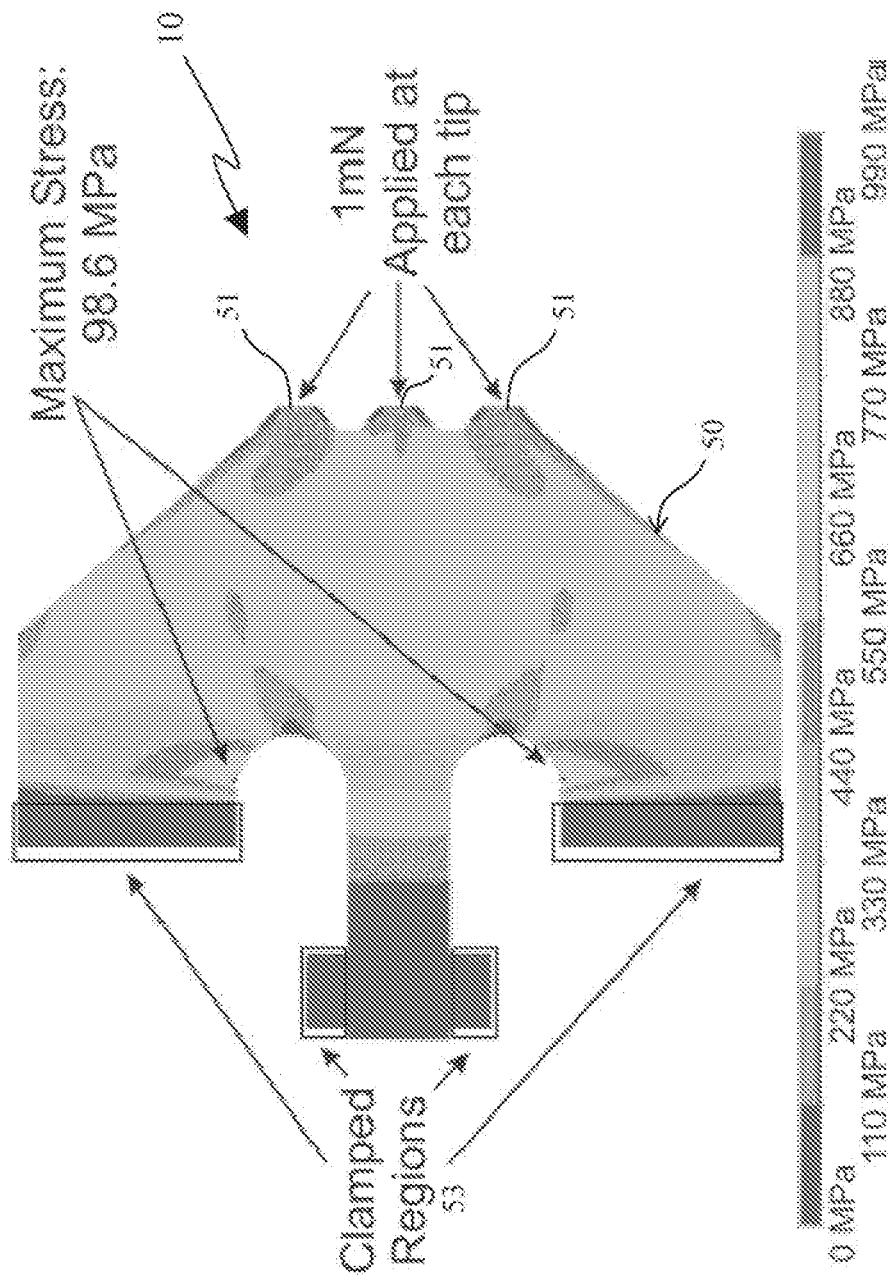
FIG. 10 provides a plot of the stress under a 1 mN load at each tip. Not shown is the 2.3 μm deflection of the tips under this load.

The mechanical performance of the structure of the microfabricated compliant chip 10 is analyzed with ANSYS, a finite element simulator. FIG. 10 shows simulation results for the compliant beam 50 of the microfabricated compliant chip 10 structure under a load of 1 mN per contact tip 51.

Figure 11:
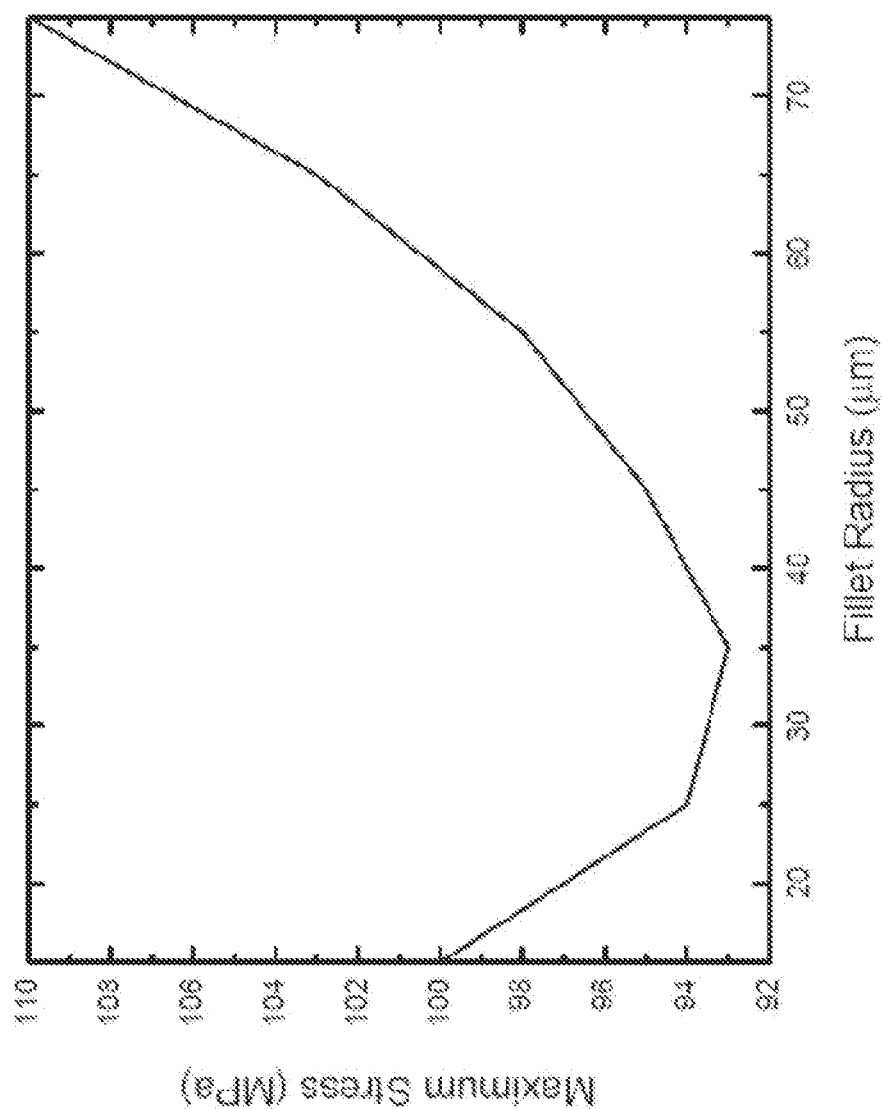
FIG. 11 graphically represents the maximum stress induced into the microfabricated compliant chip (e.g., probe) under a 3 mN load as the fillet radius is varied between 15 μm and 75 μm. The total width is held constant at 750 μm.

Fillets 54 are used adjacent to the clamped areas 53 to avoid high stress concentrations in the microfabricated compliant chip 10. FIG. 11 shows the maximum stress induced in the probe by a 3 mN force as the radius of the fillet curve is varied from 15 μm to 75 μm. The total width of the microfabricated compliant chip 10 is held constant at 750 μm. For small radii, the stress is concentrated into a tight corner, increasing the maximum stress. For the larger radii, the fillet curve consumes a large proportion of the total width of the beam and reduces the area of the clamping region 53, again driving the maximum stress up.

A radius of 55 μm is chosen for this exemplary design. Although it is not optimum, the difference in the maximum stress from the optimum fillet radius of 35 μm is only 4 MPa. This results in the clamped areas being 220 μm wide, distributing the force over a broad area. Final dimensions of the exemplary embodiment of the microfabricated compliant chip 10 design are shown in FIG. 9.

The maximum stress in the silicon under this 3×1 mN load is 98 MPa. Accordingly, a deflection of 2.3 μm is produced at the tip 51. Assuming fracture will occur at 4.5 GPa there is a safety factor of 46. This wide safety margin provides a degree of protection against user error. For instance, an excessive 20 μm deflection imposed on the microfabricated compliant chip 10 would result in a stress of 1 GPa which is still well below the expected failure point of the silicon. However, excessive deflection will result in higher forces being placed on at the contact tips 51. This drastically reduces the lifetime of the microfabricated compliant chip 10, and this aspect shall be discussed later in the disclosure at Example and Experimental Set No. 3.

II. Fabrication and Measurements

The microfabricated compliant chips 10 were fabricated using a silicon-on insulator process developed to produce thin substrates for submillimeter-wave components, although it may be applicable for substrates greater than or less than submillimeter-wave components as well. And this process may be augmented to include vias and allow patterning of both front-side and back-side electroplated gold.

Figure 12A:
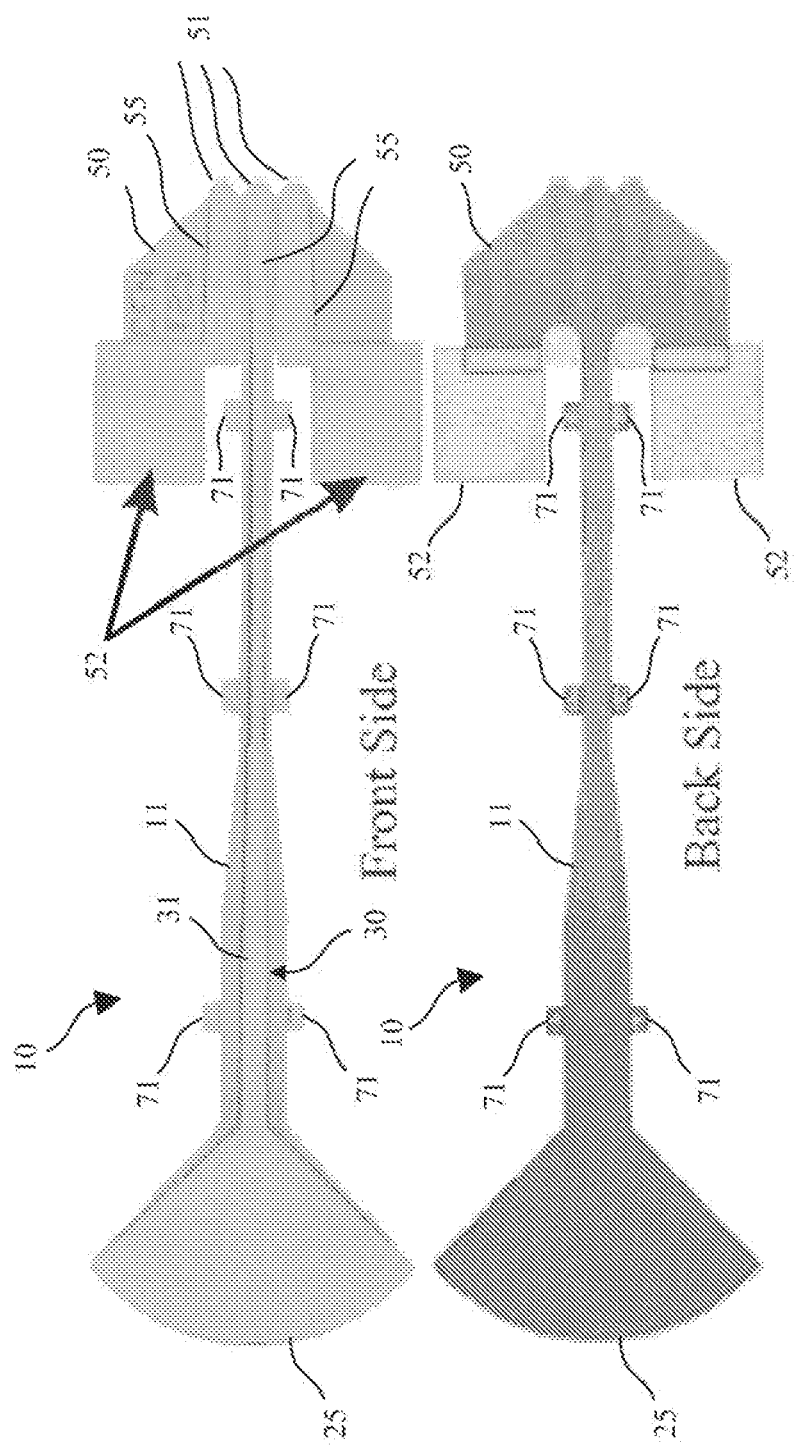
FIG. 12A is a photomicrograph depiction of the front view and back view of each of the micromachined W-Band chip as it relates to a transmission line of the coaxial design.
Figure 12B:
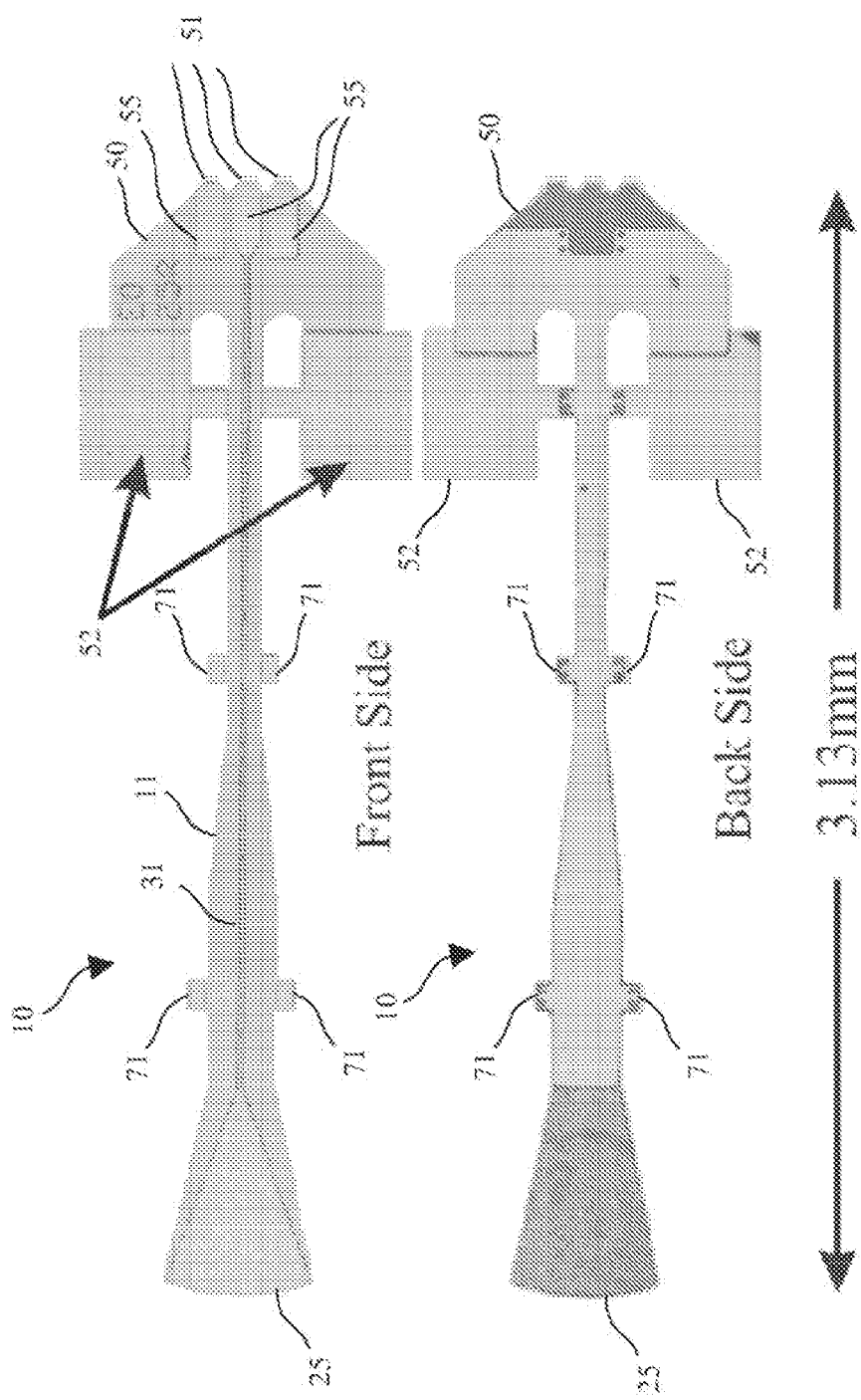
FIG. 12B is a photomicrograph depiction of the front view and back view of each of the micromachined W-Band chip as it relates to a transmission line of the microstrip design.

The fabrication process begins with a silicon-on-insulator wafer with a 15 μm thick device layer. Gold conductors and beamlead areas 52 are electroplated to a thickness of 6 μm. The wafer is subsequently bonded to a carrier wafer and the handle area is removed with a combination of lapping and plasma etching. Backside alignment is used to define and etch the 20 μm wide via-holes (not shown). Gold is then plated on the backside to a thickness of 4 μm. Finally, a substrate extents etch is performed and the devices are released from the carrier wafer. Representative microfabricated compliant chips 10 are shown in FIG. 12.

The waveguide probe housing was machined with a Kern MMP 5-axis CNC-micromachining tool. The bottom face of the block is lapped after milling so that the distance between the probe transmission line channel and the base of the block can be precisely controlled to ±3 μm.

Figure 13:
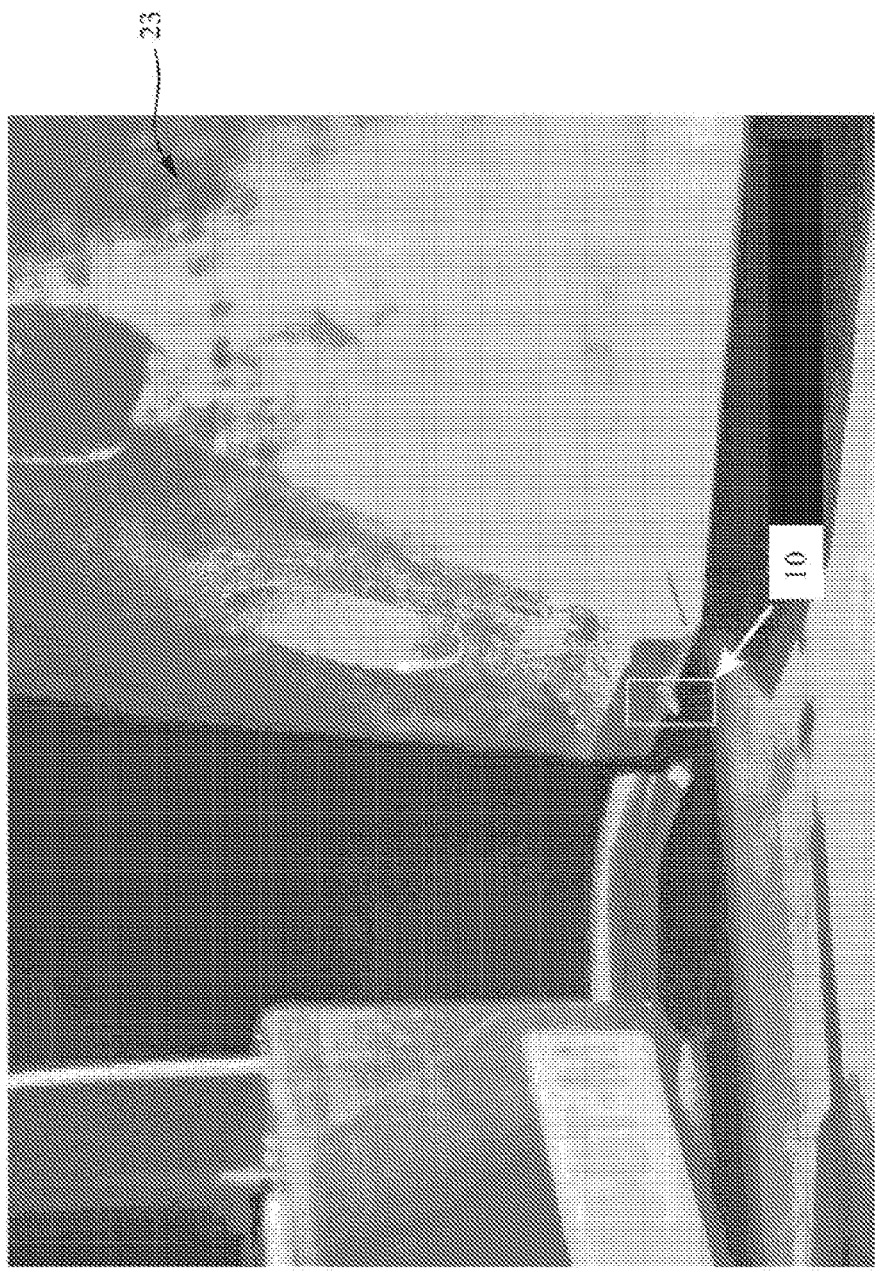
FIG. 13 is micrographic depiction of the microfabricated compliant chip mounted in the waveguide block housing (right side of figure) shown next to a commercial probe for comparison (left side of figure).

Mounting of the microfabricated compliant chip 10 in the waveguide block is done by handling the chips by the beamlead 52 (e.g., gold beamleads or other material as desired or required), thus avoiding damage to the silicon substrate 11. The depth of the clamping recesses were within design specification and the probe chips were readily aligned to the block by observing when the chip dropped into place. An assembled waveguide block 23 with the mounted microfabricated compliant chip 10 (e.g., probe chip) protruding from the front face of the block is shown in FIG. 13. Next to it is a commercial probe provided for comparison (left side of figure).

A. Contact Resistance Measurement

Figure 14B:
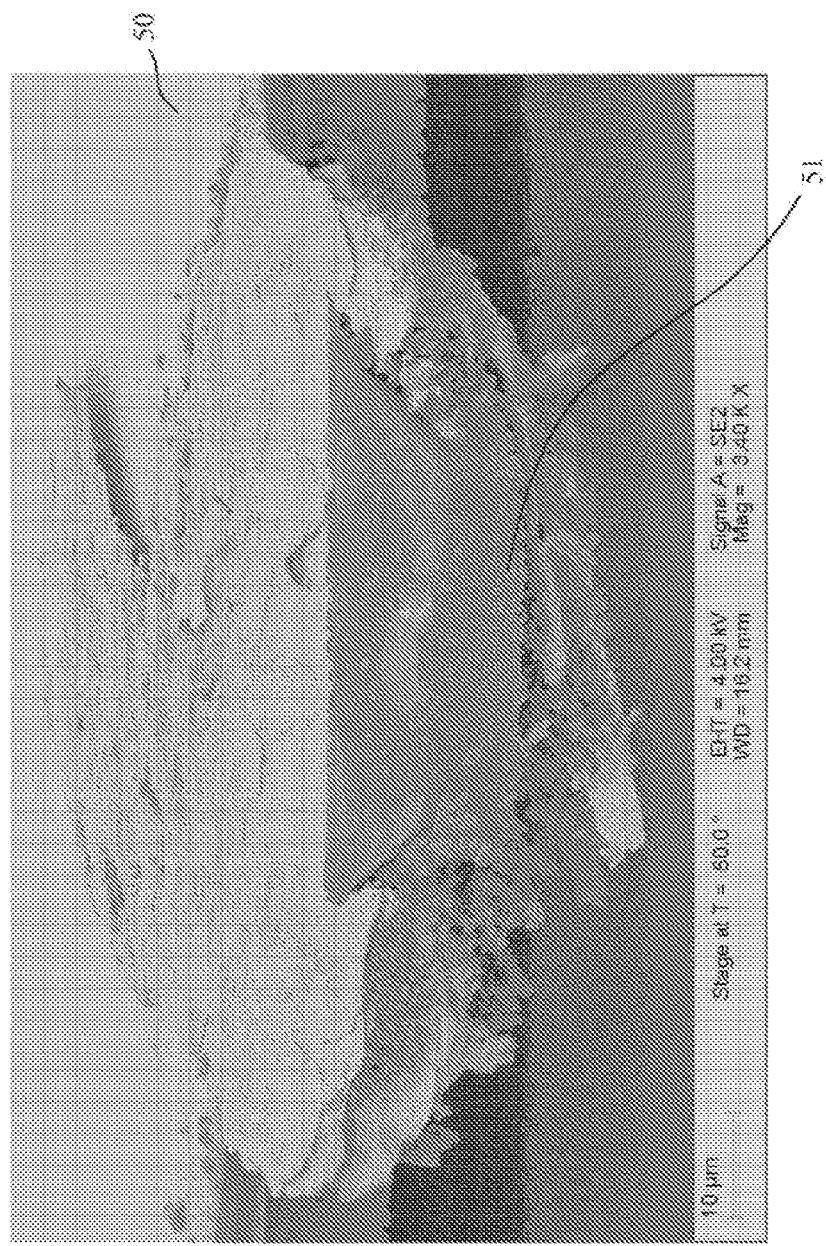
FIG. 14B provides scanning electron micrograph (SEM) depiction of the tip of the compliant beam after 10,000 contact cycles at 10 mN. It also shows wear of the silicon contact point as well as wear and displacement of the electroplated gold.
Figure 15:
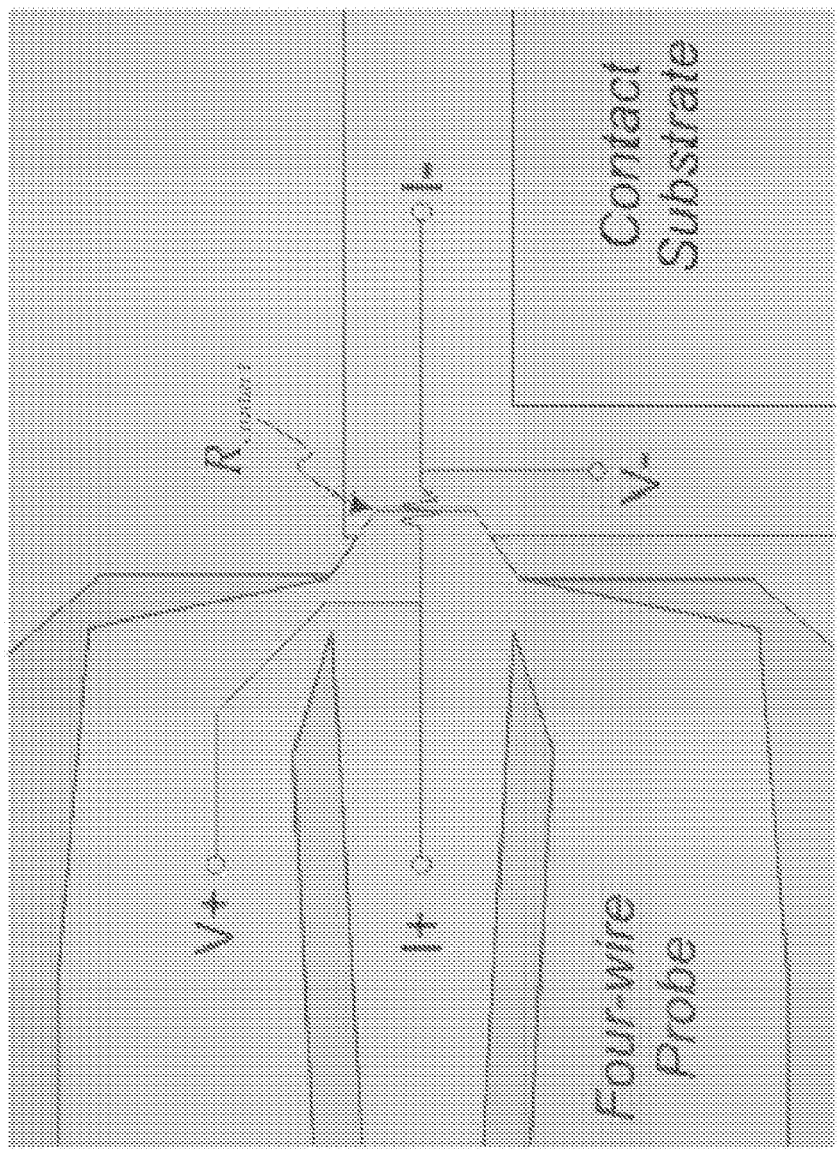
FIG. 15 provides a schematic diagram showing how the contact resistance is measured between the microfabricated compliant chip (i.e., probe) designed with one contact point and the silicon substrate's contact pad. Connections for the four-wire measurement are indicated by the overlayed circuit diagram.
Figure 16:
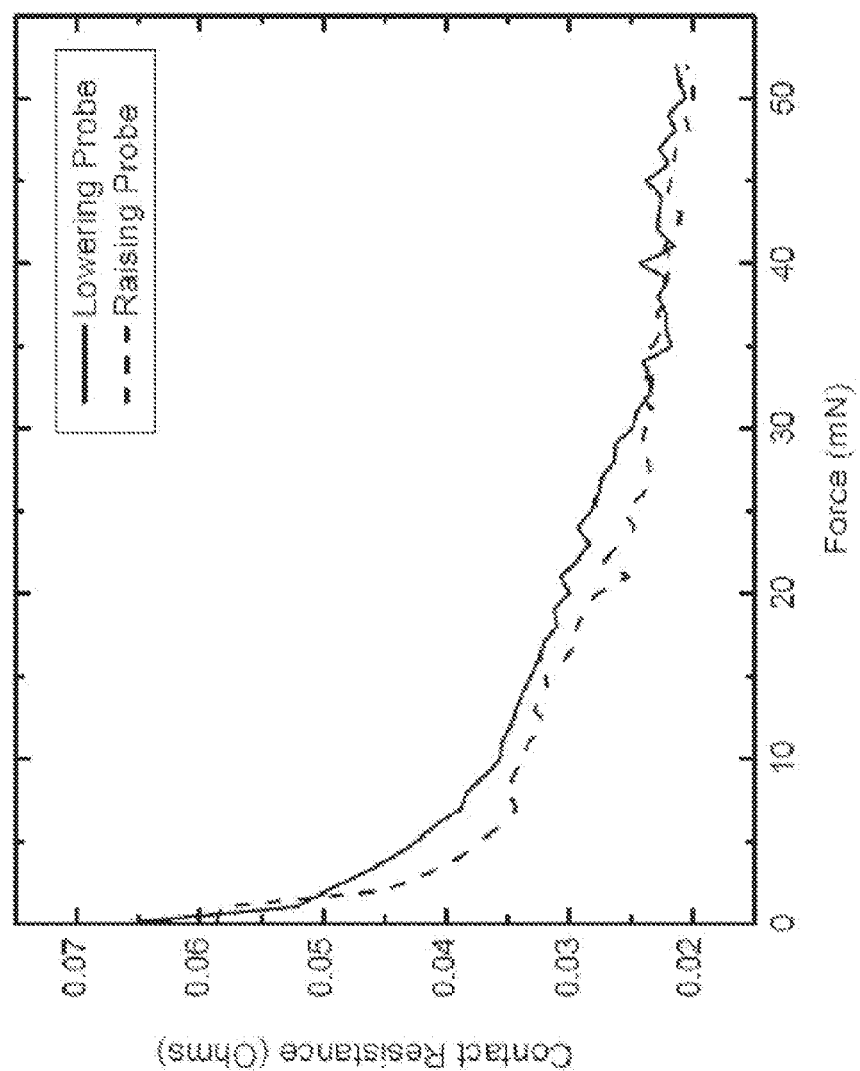
FIG. 16 graphically illustrates the measurement of the contact resistance plotted against the contact force of the microfabricated compliant chip (i.e., probe). Note that a contact resistance below 0.1 Ω is achieved at 1 mN.

Sufficient force for a low contact resistance is critical for maintaining low insertion loss and enabling DC biasing through the wafer probes. To verify that the mechanical design provides sufficient force to achieve a low contact resistance, a microfabricated compliant chip 10 with a single tip 51 was fabricated. This enables a fourwire measurement of a single contact point. The test probe is the same as shown in FIG. 9 and scanning electron micrographs (SEMs) of worn probe tips 51 indicate a contact area 40 μm wide and 5 to 10 μm long (see FIG. 14B). A load cell (Futek FSH02534) capable of measuring forces in the 0.2 mN to 100 mN range was fitted with a silicon substrate with gold contact pads. FIG. 15 shows how the probe and contact substrate are designed to enable a four-wire measurement of the probe's contact resistance, $R_{contact}$. The measurements in FIG. 16 demonstrate that a contact resistance of 0.07 Ω is achieved at 1 mN and that this resistance continues to decrease with additional force, approaching a minimum of 0.02 Ω at 55 mN.

The microfabricated compliant chip 10 fails at contact forces between 60 and 70 mN, generally cracking around the simulated point of maximum stress on the fillet. However, the failures are rarely observed as the bottom of the waveguide housing contacts the probed substrate before this force can be applied.

Clearly more than sufficient force is generated by the 15 μm thick silicon with this mechanical design. This suggests that the thinner probes required for higher frequency operation are feasible. Table II lists the amount of deflection required to produce 1 mN of force using this probe design with different substrate thicknesses and indicates that 5 μm thick silicon can be used if a sufficient amount of deflection can be tolerated in the landing of the microfabricated compliant chip 10. Using the guideline that a maximum thickness of $<\lambda_d/10$ is needed to eliminate substrate mode loss, 5 μm substrates can potentially be used to 1.7 THz.

B. DC Contact Lifetime Study

Figure 14A:
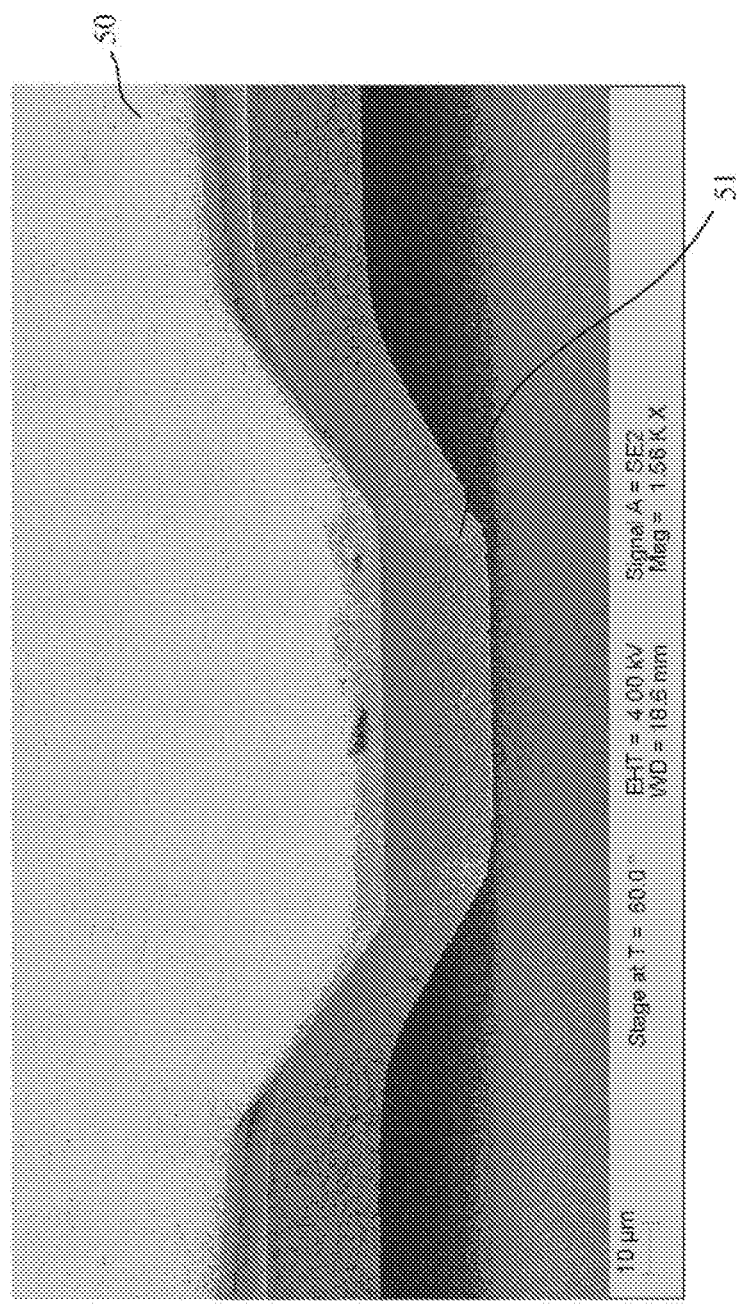
FIG. 14A provides scanning electron micrograph (SEM) depiction of the tip of the compliant beam before numerous contact cycles, i.e., before contact test.
Figure 17:
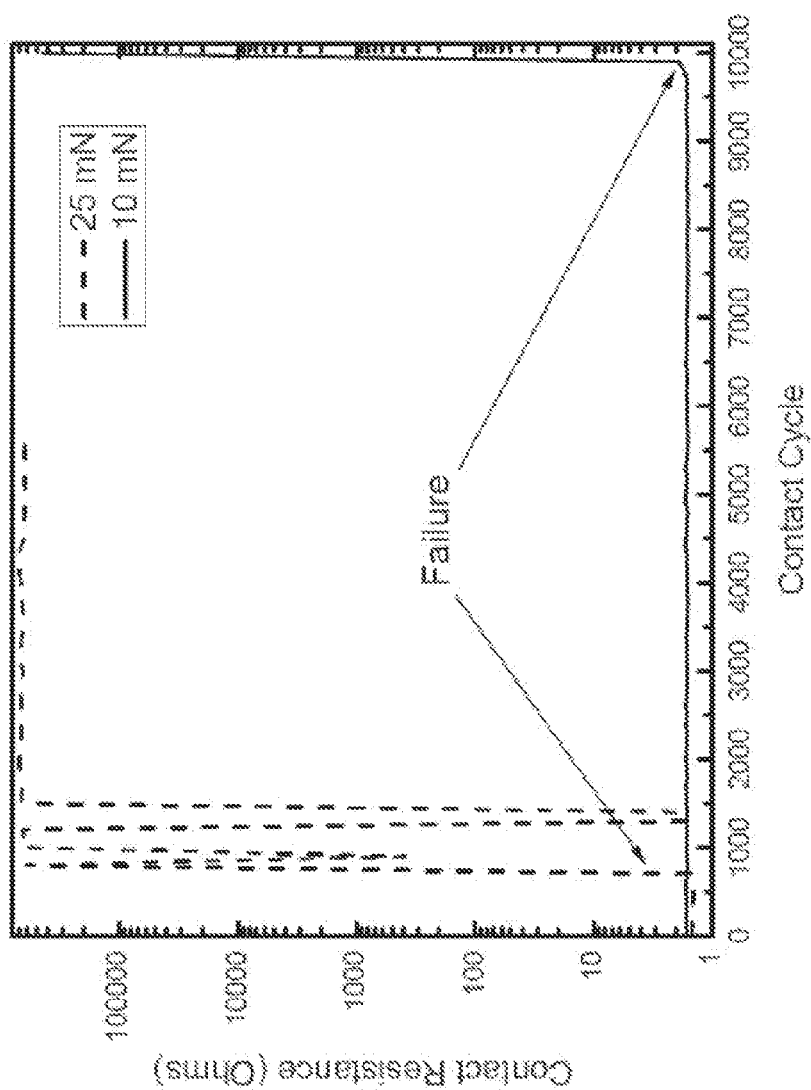
FIG. 17 graphically illustrates minimum contact resistance for each contact cycle highlighting the effect of excessive contact force on the probe's lifetime. The higher contact force of 25 mN (dashed line) drastically decreased the lifetime of probe to 700 contact cycles. Differences in low resistance measurements resulted from variations in the two-wire measurement setup between devices.

An initial lifetime study was conducted to characterize the wear and damage to the gold contacts resulting from multiple contact cycles. A computer controlled stage was assembled to bring a silicon wafer coated with gold into contact with the micromachined probe while monitoring the contact force and resistance. For simplicity, a two-wire measurement was used in this study. FIG. 17 graphically shows the measured contact resistance plotted against the number of contact cycles. The probe contact failed (indicated by the large increase in resistance) after 10,000 cycles with an applied contact force of 10 mN, whereas the lifetime is reduced to 700 cycles when a force of 25 mN is applied. The SEM photos in FIGS. 14A and 14B show the probe tip 51 before (FIG. 14A) the lifetime study and after failure (FIG. 14A). These images indicate that the failure is due to a combination of displacement of the electroplated gold and wear of the silicon supporting the contact tip. The displacement of the gold is of particular concern since the material will be pushed into the area between the ground and signal contact tips. This leads to shorting of the ground-signal-ground (GSG) probe tips 51 before the contact metal is abrasively removed, reducing the RF lifetime compared to the DC contact lifetime characterized here. This issue can be addressed by using a harder metal (such as a Gold/Cobalt alloy or Ruthenium) to form the probe tip 51, reducing the amount of material displaced during each contact cycle.

TABLE II

BEHAVIOR OF microfabricated compliant chip (PROBE) DESIGN WITH THINNER SUBSTRATES.

| Substrate Thickness (μm) | Maximum Deflection Before Failure (μm) | Deflection for 1 mN of force (μm) |
|---|---|---|
| 15 | 103 | 1.3 |
| 10 | 154 | 4.4 |
| 8 | 193 | 8.5 |
| 5 | 306 | 35 |
| 3 | 503 | 160 |

III. Conclusions

This Example and Experimental Set provides the design of microfabricated compliant chip 10 (i.e., micromachined probes) that can operate at submillimeter-wave frequencies. The mechanical design and characterization of the microfabricated compliant chip 10 presented here provides the foundation for the electromagnetic design, that shall be discussed later in this disclosure at Example and Experimental Set No. 2. By employing a silicon micromachining process, excellent mechanical characteristics are achieved by the choice of silicon as the mechanical material and photolithographic control over the substrate extents, enabling a robust mechanical design. Contact resistances below 0.1 Ω are measured at contact forces below 1 mN, comparable with lower frequency commercial probes. A lifetime study shows the probes are capable of forming this DC contact for over 9000 contact cycles.

Example and Experimental Results Set No. 2

I. Introduction

This Example and Experimental Set provides for, among other things, the design and characterization of a micromachined on-wafer probe for submillimeter-wave integrated circuit measurement. The Example and Experimental Set No. 1 (as provided in this disclosure above) presented the mechanical design and demonstrated that the probe produced thousands of low-resistance contacts. In this Example and Experimental Set, the RF design and performance of the probe is presented. The finite element simulation tool HFSS™ is used to model and design the various transitions required to couple from WR-1.5 rectangular waveguide to a probed object substrate. One-port measurements of the probes (microfabricated compliant chips) are presented at the WR-1.5 (500-750 GHz) band.

Two RF designs are pursued that are compatible with the same waveguide block. The designs primarily differ in the transmission line used to couple from the rectangular waveguide to the Ground-Signal-Ground (GSG) probe. Microstrip is one choice, as it is well characterized and less susceptible to loaded waveguide modes. The second design uses a lower-loss rectangular-coaxial transmission line, but is more susceptible to exciting resonances along the line.

Figure 18:
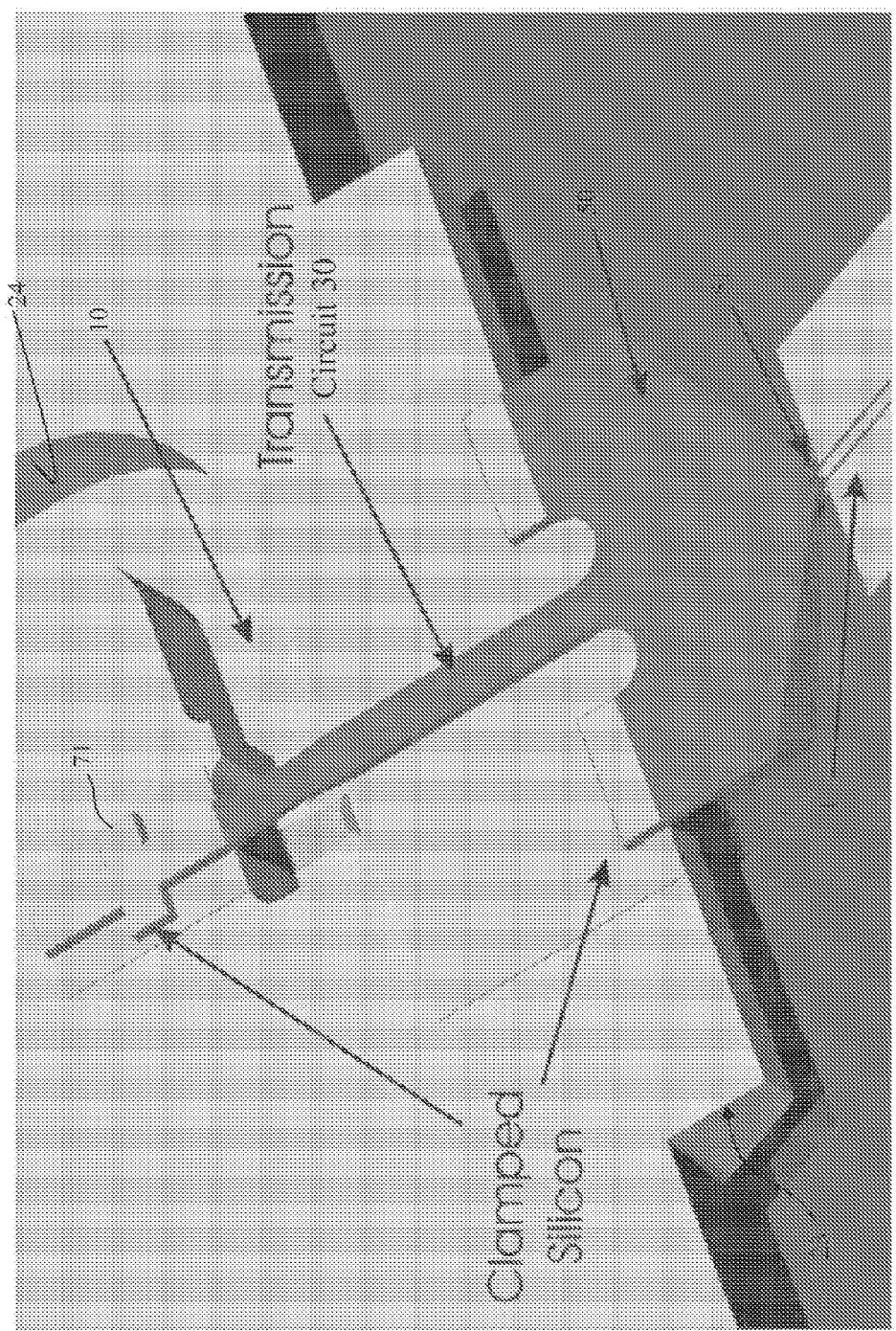
FIG. 18 schematically illustrates the microfabricated compliant chip in relation to waveguide block housing. The top half of the block is removed for clarity. Not visible on the underside of the chip is the conductor connecting the waveguide to the compliant beam.

FIG. 18 schematically shows a detail of the coaxial probe chip 10 (i.e., microfabricated compliant chip) resting on the bottom-half of the E-plane split waveguide housing 23. The conductors on the probe chip 10 are not visible in FIG. 18 as they face downwards to allow contact to the probed substrate 1. The submillimeter-wave signal couples from the rectangular waveguide 24 through an E-plane radial stub (i.e., waveguide probe) into the enclosed transmission line of the transmission circuit 30. The transmission line emerges from the housing 23 and transitions to the coplanar waveguide probe tips 51.

Figure 19A:
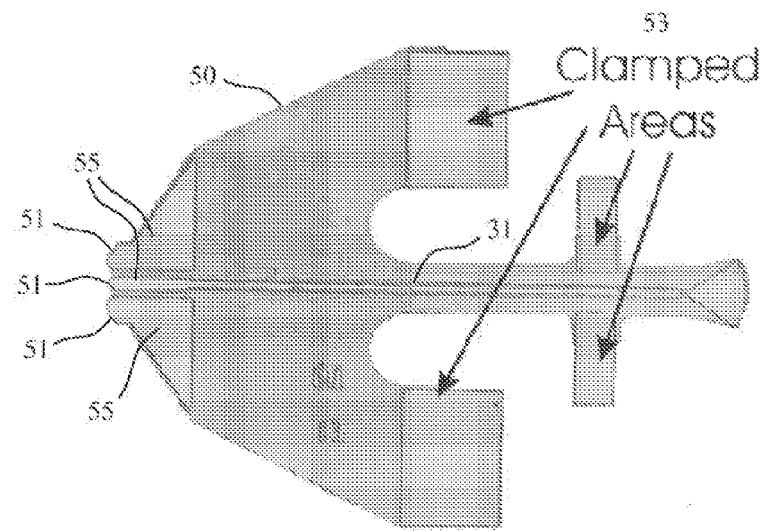
FIGS. 19A-19B schematically illustrate the microstrip and coaxial-based probe chips, respectively.
Figure 19B:
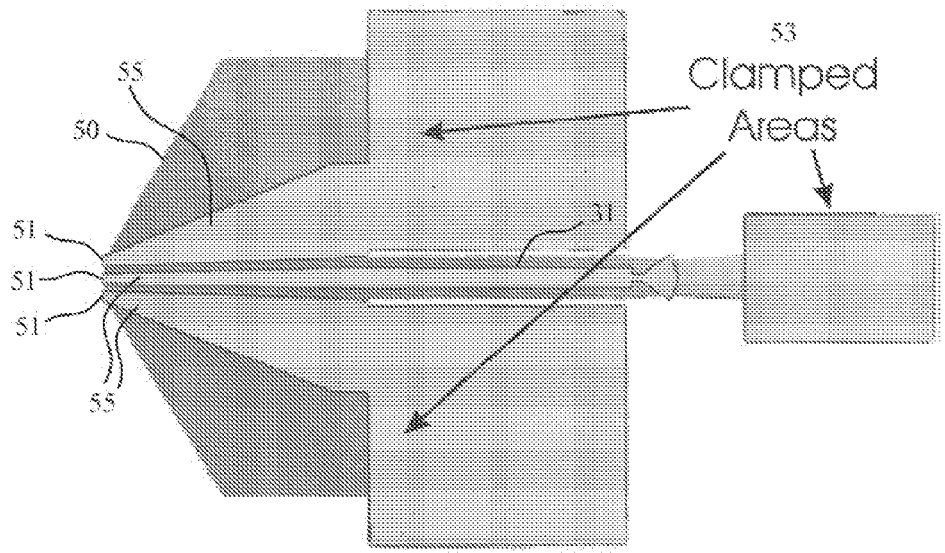

Microphotograph-like depictions of the probe chip layouts are schematically shown for the microstrip-based and coaxial-based probe chips in FIGS. 19A and 19B, respectively.

Characterization of the microfabricated compliant chip (probe) is done with one-port offset short measurements. Insertion loss of the probes over the WR-1.5 band (500-750 GHz) is found to be 6-10 dB and the corresponding return loss from 10-15 dB. Accordingly, the coaxial design exhibits and insertion loss 2 dB over better than the microstrip probe design.

II. Probe Design

Design of the microfabricated compliant chip (probe) primarily consists of two electromagnetic transitions: one from rectangular waveguide to a channel supported transmission line and a second from transmission line to the CPW on the probe tips. Because low insertion loss is critical to maintaining the dynamic range of the on-wafer measurement, two designs based on different transmission lines are pursued so that a lower loss design can be evaluated while still having a lower risk alternative. Details of these designs are described in the following sections of this Example and Experimental Set.

A. Microstrip Probe Design

As described in the Example and Experimental Set No. 1 (above), the substrate 11 of the microfabricated compliant chip (probe) is chosen to be 15 μm thick to avoid excitation of substrate modes while maintaining sufficient mechanical strength. A 50 Ω microstrip line silicon of this thickness has a conductor 12 μm wide (transmission line 31), as schematically shown in FIG. 20A. To allow the same waveguide block to be compatible with both transmission line designs, the microstrip line is suspended in the channel by beam leads, and a gold layer on the backside of the substrate is used to form the ground-plane. For these dimensions and using a conductivity of electroplated gold of $6 \times 10^6$ (S/m), the loss is found by HFSS simulation to be 3.7 dB/mm at 625 GHz. Although this amount of loss is high, it does not prohibit the use of microstrip as the probe tips and rectangular waveguide are separated by less than 1 mm.

To couple to the GSG probe tips, a via-based microstrip to CPW transition is used. This transition is simulated to have a return loss below 15 dB from 500 to 750 GHz.

B. Coaxial Probe Design

As schematically shown in FIG. 20B, the coaxial-based microfabricated compliant chip (probe) design uses a suspended substrate 11 to create a quasi-rectangular coax transmission line 31 with the channel formed by the waveguide housing as the outer conductor. To realize a 50 Ω line in this configuration the center conductor must be 35 µm wide, as shown in FIG. 20B. Assuming conductivities of $6 \times 10^6$ (S/m) for the gold center conductor and the $2 \times 10^7$ (S/m) for the aluminum channel, a line loss of 1.5 dB/mm at 625 GHz is expected, less than half than that of the microstrip line.

A disadvantage of the coaxial line is that it suffers from coupling to spurious modes at discontinuities in the substrate width. This is an important issue because silicon tabs are placed along the length of the probe chip to align and fix the chip to the waveguide block. The shortest clamping tab length possible, 75 µm, is set by the limits of the machining process used to fabricate the waveguide blocks. For the coaxial transmission line, this length is $\lambda_g/4$ at 625 GHz, and the discontinuity in the impedance is a concern.

C. Waveguide to Transmission Line Transition

Coupling to the microfabricated compliant (probe) chip transmission line from rectangular waveguide is accomplished by, for example, an E-plane radial-stub probe 25. For the coaxial design, the clamping tabs are moved away from the transmission line channel in order to prevent the resonances induced by a discontinuity in the substrate width. The microstrip design, which does not suffer from this moding issue, is clamped along the length of microstrip, avoiding the need to extend the substrate across the waveguide. This allows the use of a transition similar to that used for the lower frequency prototype probe.

Figure 21A:
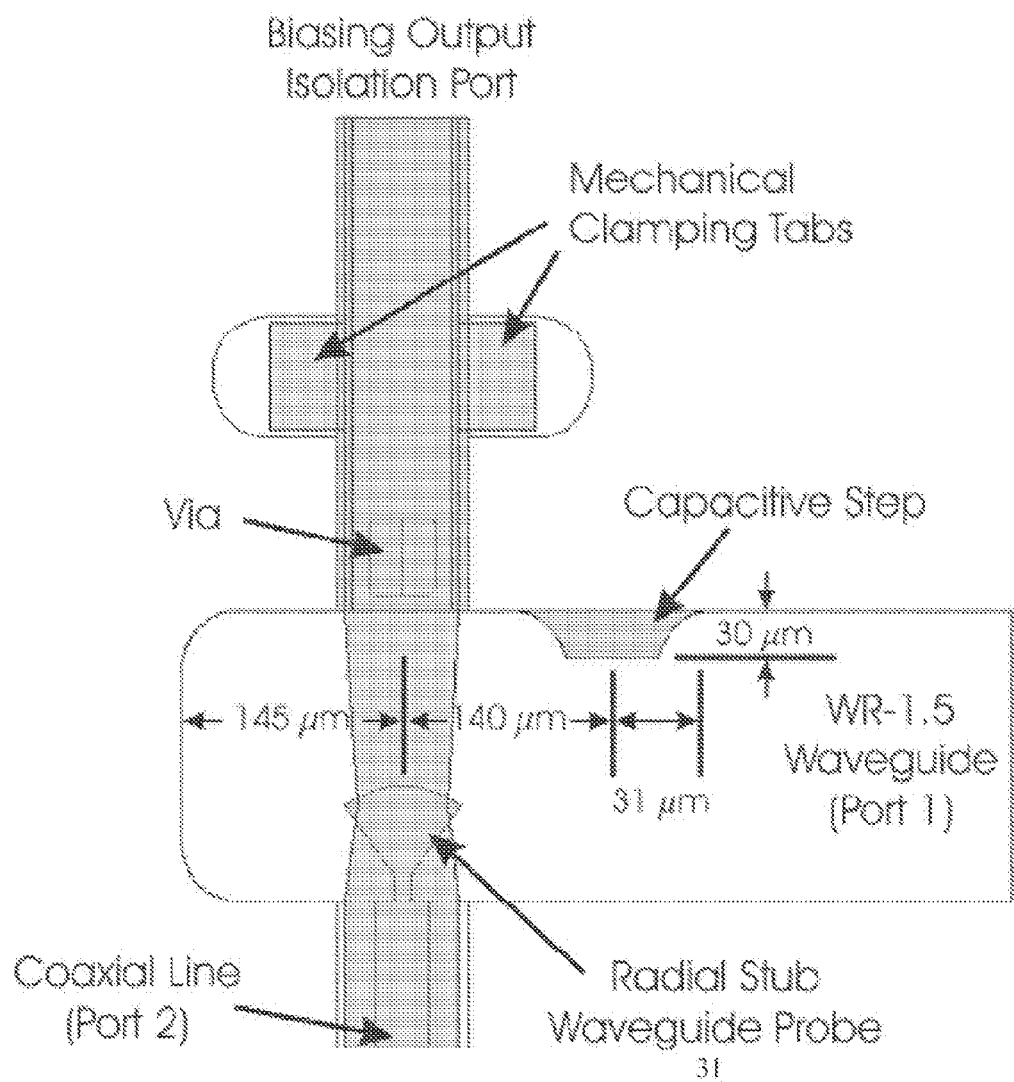
FIG. 21A schematically illustrates the 625 GHz waveguide to transmission line simulation model.

By extending the substrate across the waveguide for the coaxial design, the clamping area can be placed in an area away from the signal path, as shown in FIG. 21A. To ensure high isolation in this clamping channel, a 40 µm wide by 45 µm long via is placed at the edge of the waveguide wall. This allows the clamping tabs to be placed 150 µm back from the waveguide without significantly affecting the performance of the transition.

The clamping channel is 85 µm wide by 30 µm deep. This depth allows enough space for the 15 µm silicon with the 4 µm thick gold layers on the front and backside of the chip to be housed but does not couple to the rectangular waveguide mode. One side of the channel is designed to contact the backside gold and ground the via to the block. The channel leaves a 10 µm gap between the front side gold and the block so that future designs can incorporate built-in DC biasing by passing current through this channel to the center conductor of the probe.

The additional silicon in the waveguide makes optimization of the transition more difficult since it adds additional inductance to the total structure. A capacitive step 30 µm high and 62.5 µm wide is introduced in the waveguide wall 140 µm away from the center of the transition to compensate for the additional inductance of the waveguide structure. The back short is placed at 145 µm from the center of the radial probe. The minimum tool diameter for milling the rectangular waveguide is 75 µm, so the backshort and capacitive step have a corner rounding radius of 37.5 µm.

Figure 21B:
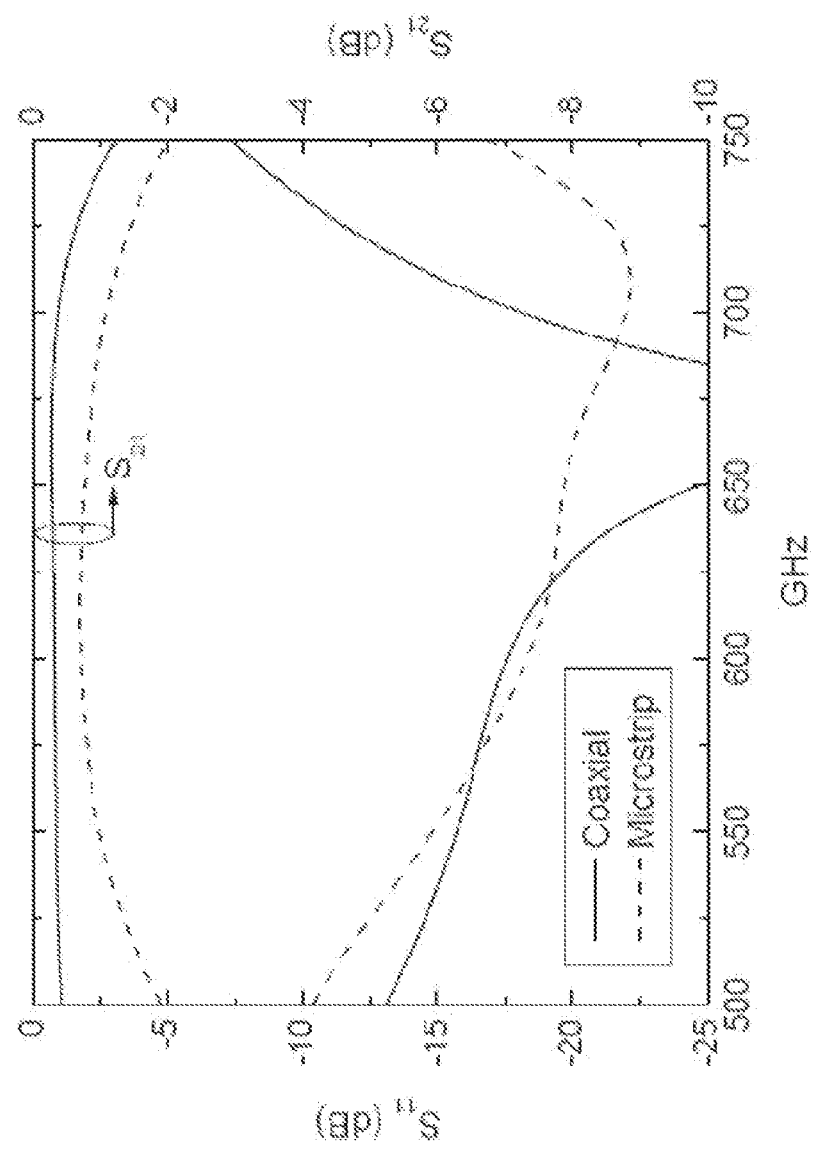
FIG. 21B graphically illustrates the results of waveguide to transmission line simulation model.

FIG. 21B schematically shows the simulated scattering parameters with reference planes the waveguide and the transmission line ports. The transmission line wave-port (Port 2 in FIG. 21A) is placed 300 µm away from the rectangular waveguide transition to allow energy coupled to cutoff modes at the transition to decay. The solid line shows the coaxial-based design is expected to have a −15 dB fractional bandwidth of 28% with an average insertion loss of 0.4 dB. The microstrip design shows a wider bandwidth of 32%. These simulations assume a gold conductivity for the conductors of $6 \times 10^6$ (S/m). Loss on the rectangular waveguide walls is neglected.

D. Probe to Substrate Coupling

Figure 22A:
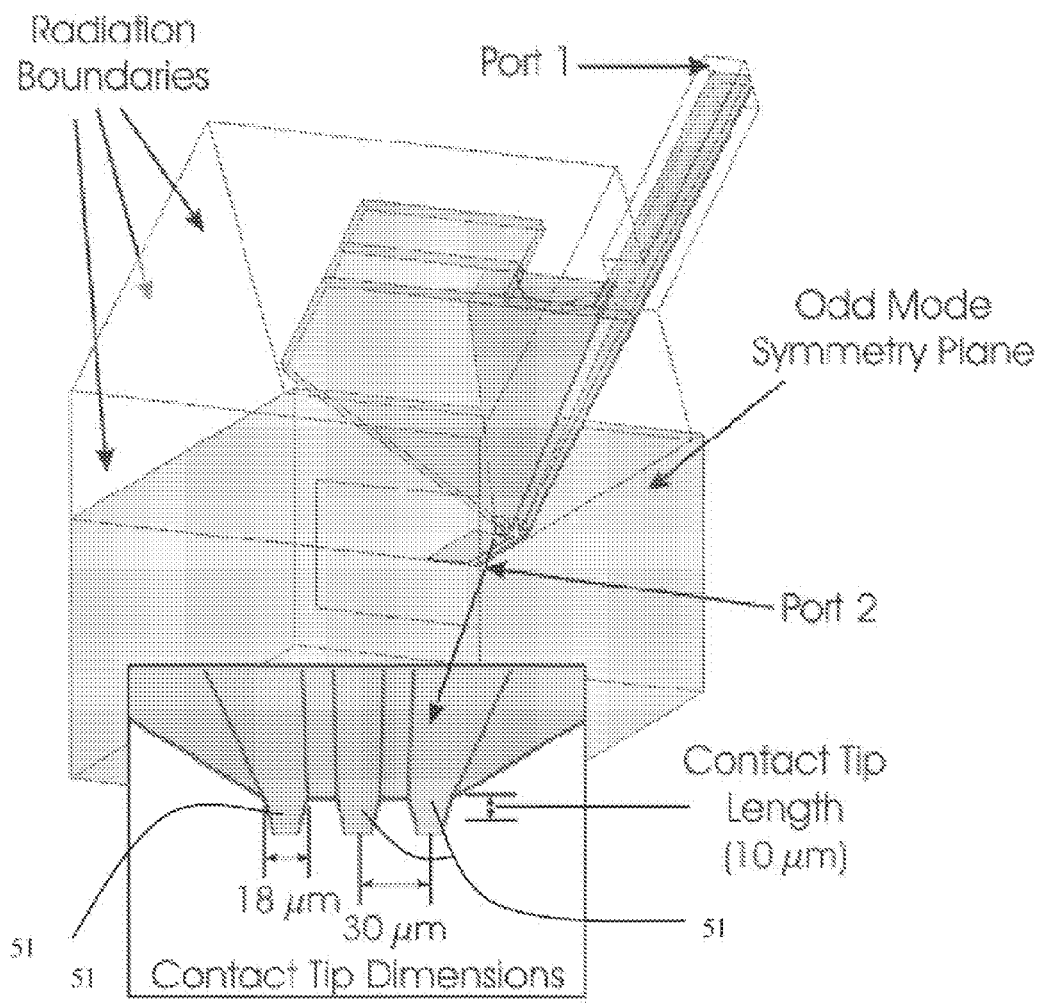
FIG. 22A schematically illustrates the 625 GHz rectangular coaxial to the probed substrate simulation model. The inset schematically shows the necessary break in the substrate required to form the contact tips.

The coupling from the CPW probe tips to the substrate's transmission line is very sensitive at submillimeter wavelengths. In particular, the length of the contact tips that extend from the probe to the DUT plays a strong role in the matching of this section. As both designs use CPW to couple to the probed substrate, only simulations for the coax design are shown. FIG. 22A shows the model of the coaxial line transition to the CPW probe tips contacting a probed substrate. Radiation boundaries are applied around the volume of air surrounding the probe tip to simulate an unenclosed environment and an odd-mode symmetry plane is used to reduce the model size in half.

The probe pitch is chosen to be 30 µm, center to center, based on the maximum CPW gap widths that can operate at these frequencies without excessive radiation into the substrate. The calibration wafer used in this work uses CPW dimensions of 52.5/5/10/5/52.5 µm on a silicon substrate ($\in_r=11:9$) to achieve a 50 Ω line. HFSS simulations of the CPW dimension along the probe show that the width of the conductors must be 18 µm at the contact tip 51 as shown in FIG. 22A.

Coupling to the substrate supported CPW line is sensitive to the contact tip length. The tips must extend from the bulk of the probe, as shown in the inset of FIG. 22A, to focus the force of the probe onto the metal to metal interface. This break in the substrate between the conductors increases the impedance of the CPW in that region, thus creating a mismatched section of transmission line at the interface between the probe and the substrate.

Figure 22B:
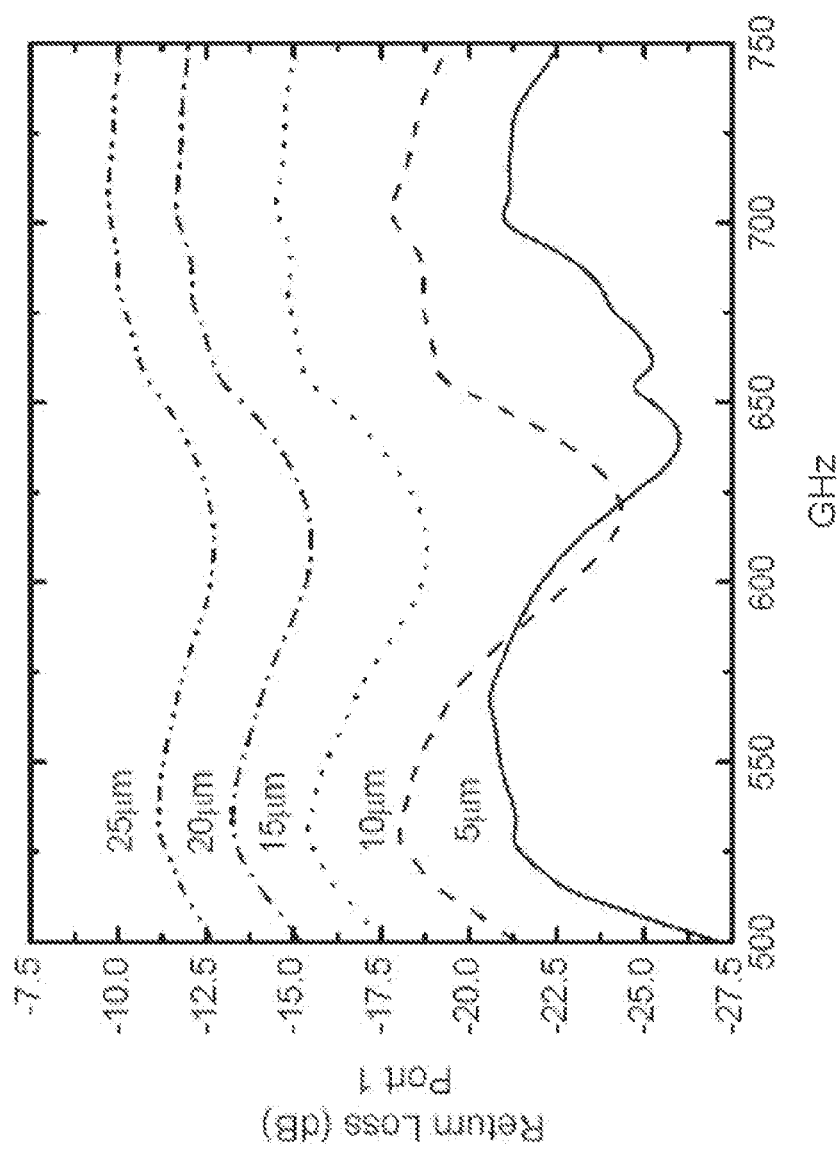
FIG. 22B graphically illustrates the return loss over a set of different contact tip lengths.

The influence of the contact tip length on the coupling to the probed substrate is studied by varying the tip lengths from 5 µm to 25 µm in the model and observing the return loss at the coaxial port. FIG. 22B shows that for any length greater than 10 µm the return loss is greater than −15 dB. Following the trend, the best performance should be achieved with no tips. However, without tip structures to increase the pressure at the gold-to-gold contacts it will be difficult to achieve a sufficient force to achieve a low-resistance contact on all three conductors simultaneously if the probe is not perfectly parallel to the probed substrate. To verify this claim, two tip lengths, 0 µm and 10 µm, were fabricated and tested. No successful calibrations were achieved with the 0 µm tip length probes. Consequently, the 10 µm contact tip length is used for the remainder of the design.

E. Full Probe Simulation

Figure 23A:
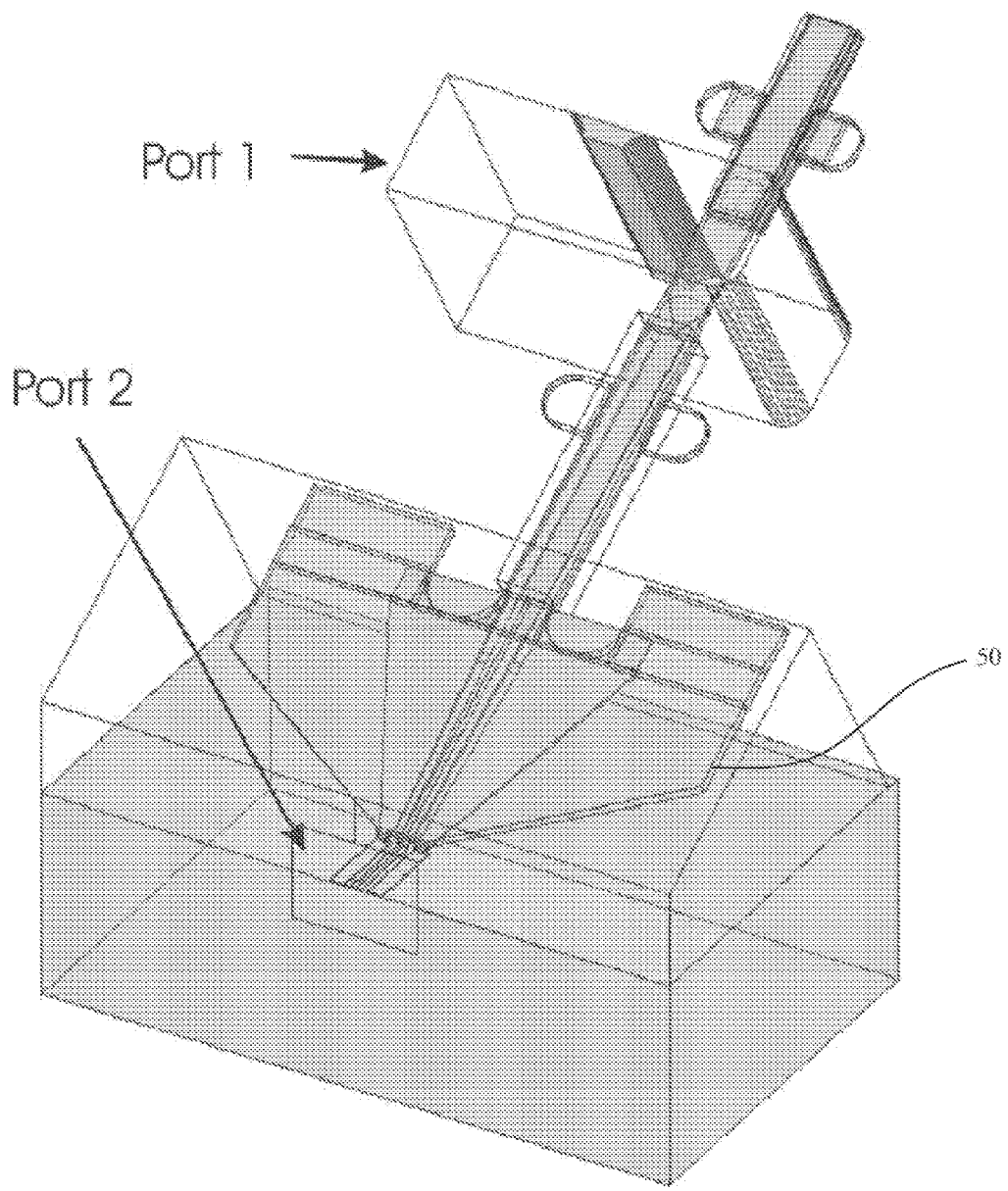
FIG. 23A schematically illustrates a full simulation of 625 GHz probe from waveguide to the probed substrate, whereby the simulation model being for the unbiased probed.
Figure 23B:
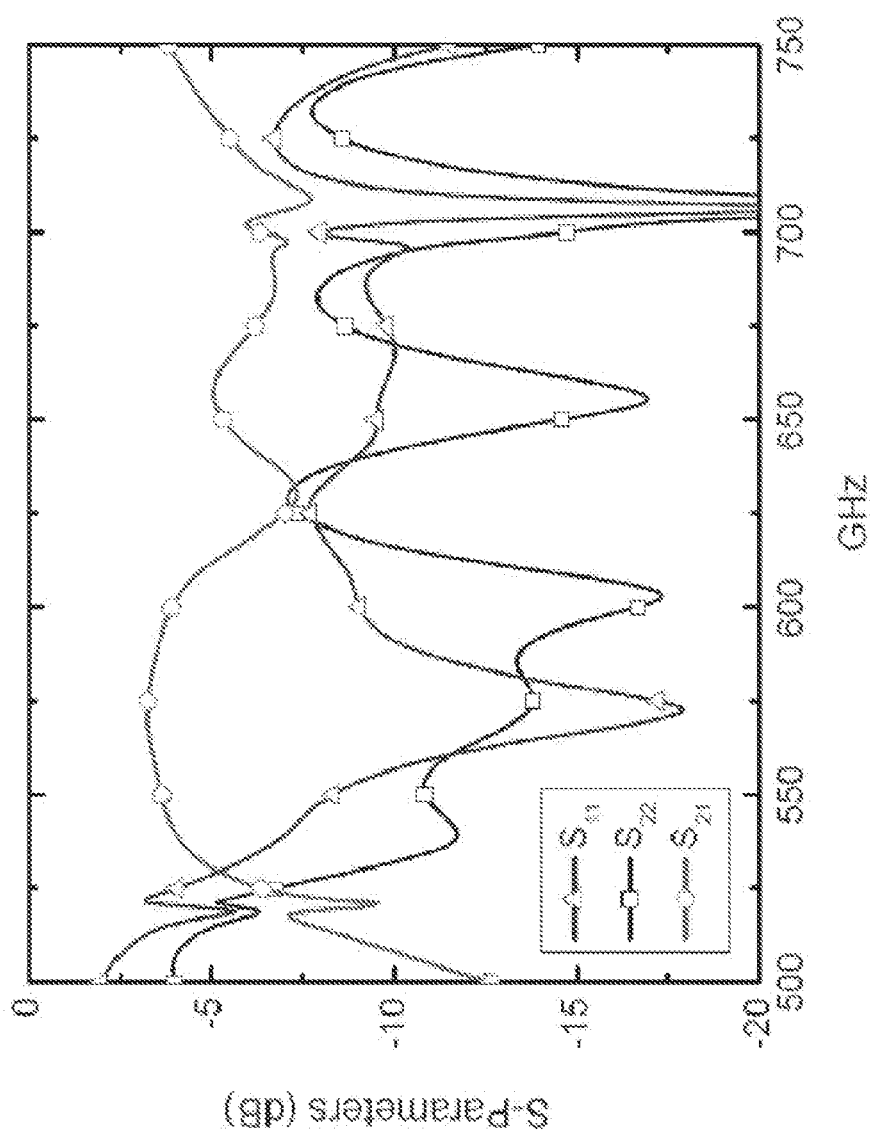
FIG. 23B graphically illustrates the results of the simulation model of FIG. 23A for the Microstrip design.
Figure 23C:
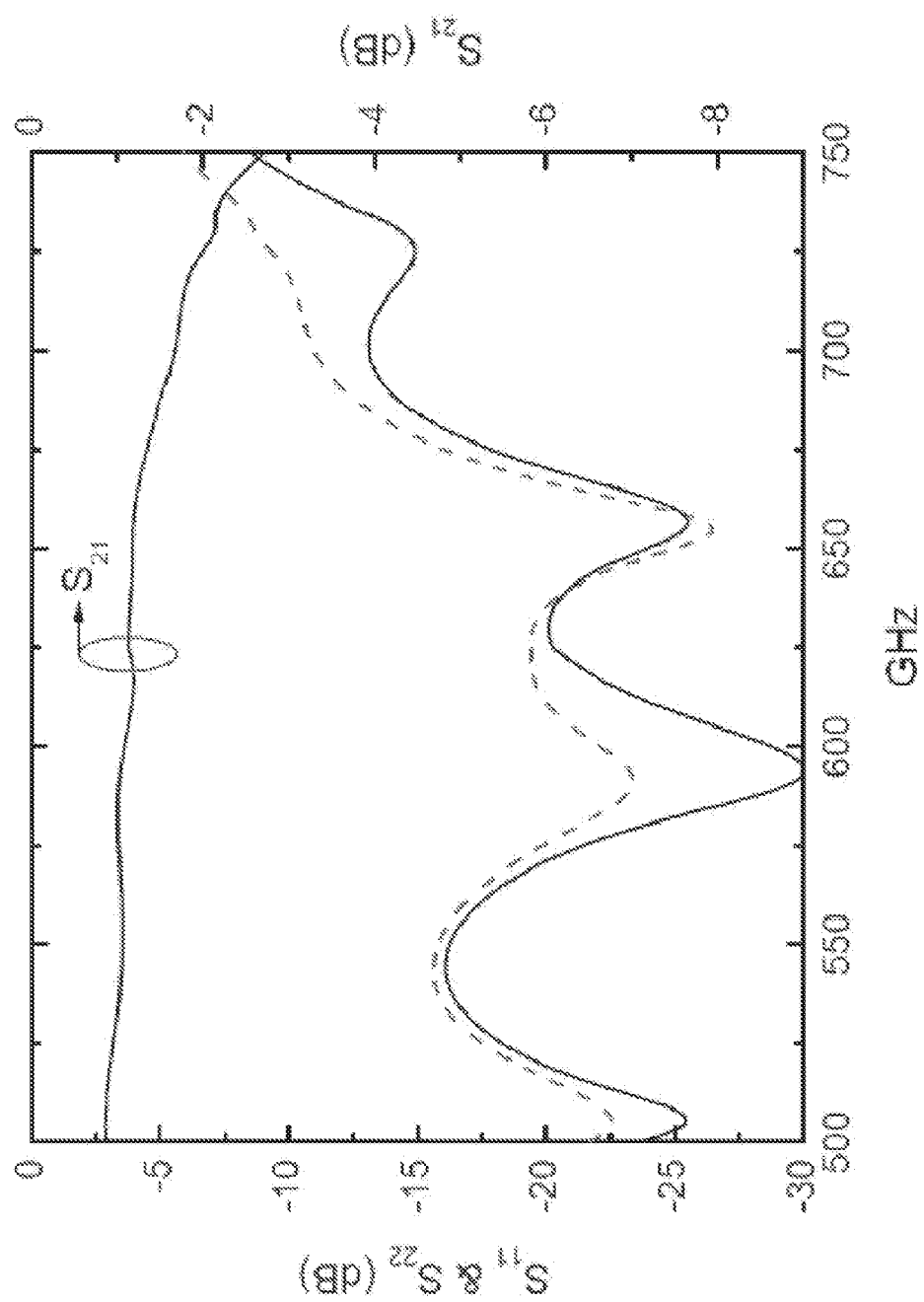
FIG. 23C graphically illustrates the results of the simulation model of FIG. 23A for the coaxial design.

FIG. 23A shows the full simulation model for the coaxial design which combines the rectangular waveguide transition and the transition to the probed substrate. The microstrip simulation is similar. A gold conductivity of $6 \times 10^6$ (S/m) is assumed. Radiation boundaries surround the probe and probed substrate to simulate an unenclosed environment. Also may be included is the simulated s-parameters with reference planes at the rectangular waveguide ports and the CPW line on the probed substrate. The 130 µm of CPW on the substrate is de-embedded to remove the line loss from the results. Neglecting loss in the rectangular waveguide and the probe housing, the average simulated insertion losses are 1.3 dB and 2.8 dB for the coaxial and microstrip-based probe, respectively.

III. One-Port Probe Characterization

The submillimeter s-parameter measurement system at the University of Virginia currently consists of a one-port VNA system consisting of a Virginia Diodes Inc. WR-1.5 frequency extender module (VDI WR1.5 VNAXTXRX) interfaced to a Rohde & Schwarz ZVA40 network analyzer. Full s-parameters of the probes are characterized by de-embedding with a two-tier offset short calibration.

The initial reference plane is set at the waveguide flange of the frequency extender by measuring four waveguide standards supplied with the VDI frequency extender: a short, an eighth-wavelength offset short, a quarter-wavelength offset short and a load. The error terms of the VNA system are calculated from the over-determined system by a least-squares fit. A second reference plane is set by mounting the probe block to the frequency extender and measuring five on-wafer offset shorts with the VNA calibrated to the waveguide flange. The lengths and effective electrical length at 625 GHz are listed in Table III. Each reflection standard is separated by 60° at mid-band so that the five calibration standards achieve equal coverage around the Smith chart. 70 µm of CPW line between the contact pads and the calibration reference plane is included in the calibration adding approximately 0.5 dB of loss to the de-embedded $S_{21}$ of the probes.

TABLE III

CALIBRATION STANDARD PHYSICAL AND ELECTRICAL DELAY OF THE 52.5/5/10/5/52.5 µM ($\epsilon_{eff}$ = 6:68) CPW DELAY SHORT LINES USED FOR CALIBRATION.

| Standard Number | Physical Length | Electrical Length at 625 GHz |
|---|---|---|
| 1 | 0 µm | 0° |
| 2 | 18 µm | 70° |
| 3 | 36 µm | 140° |
| 4 | 54 µm | 210° |
| 5 | 72 µm | 280° |

Figure 24A:
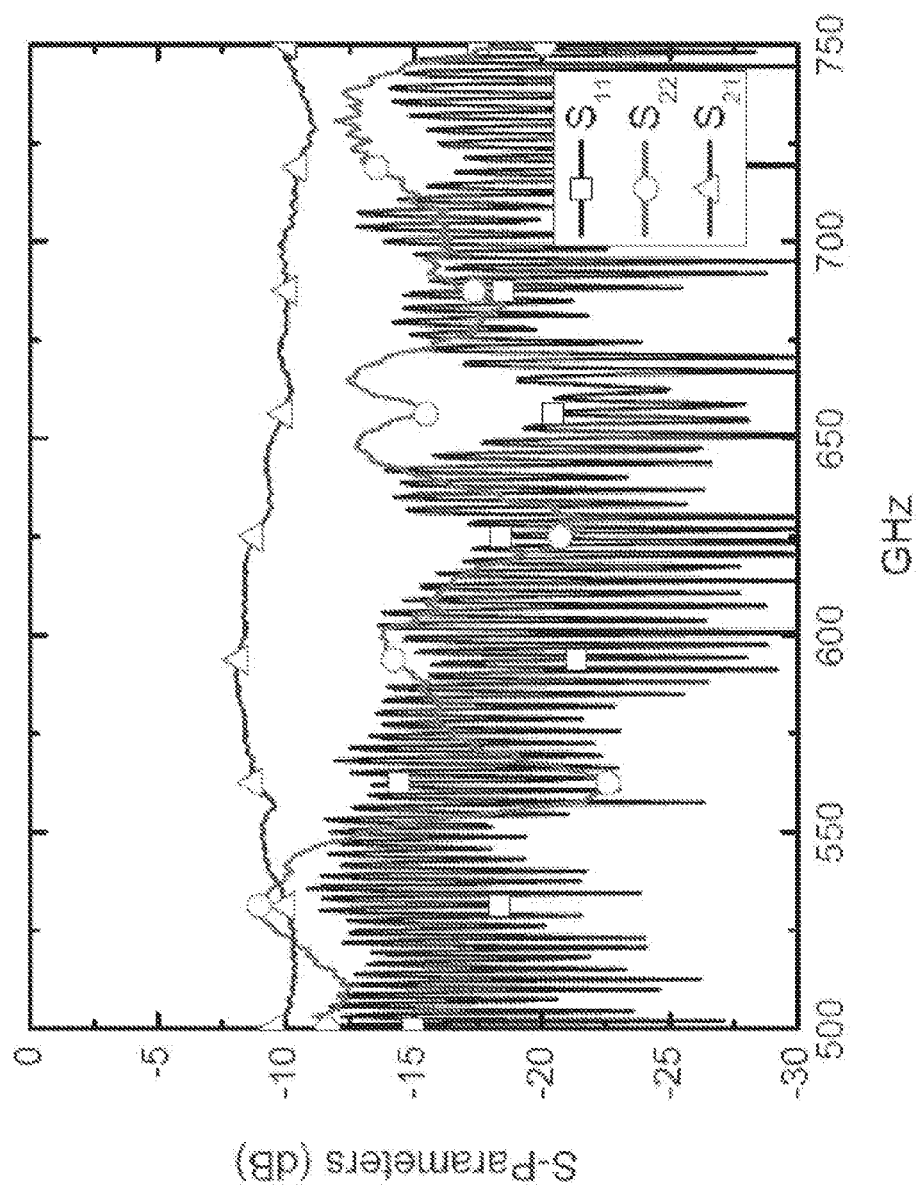
FIG. 24A graphically illustrates the one-port measurements of the 625 GHz waveguide probes for the microstrips design.

The error parameters of the probe are extracted with the least-squares method so that all five line lengths plus redundant measurements of the same standard can be included in the calibration. FIG. 24 shows the resulting de-embedded scattering parameters for the microstrip and coaxial probe designs, respectively. The mean insertion-loss for the coaxial design is 7.2 dB and for the microstrip design is 9.5 dB.

Table IV provides a detailed breakdown of the loss mechanisms of the probe from the waveguide flange to the calibrated reference plane on the probed substrate, comparing the predicted and the measured insertion loss at 625 GHz for the two probe designs. The rectangular waveguide loss of 0.076 dB/mm is a measured value and corresponds to other published waveguide losses that these frequencies. Conductor loss on the calibration substrate is modeled by HFSS and radiation into the substrate is calculated. These three losses are included in both the microstrip and coaxial designs' loss calculations.

Transmission line losses are calculated with densely meshed wave-port simulations of the transmission line geometries. Conductivities are assumed to be $6 \times 10^6$ (S/m) for the electroplated gold conductors and $2 \times 10^7$ (S/m) for the milled aluminum housing.

Probe radiation losses accounts for miscellaneous loss mechanisms separate from conductor losses. This value is found by analyzing the model in FIG. 22A without any conductor losses. Therefore, any energy lost into this model is radiated from the probe tip, injected into the substrate or coupled to other modes when the signal transfers from the probe to the probed substrate.

The measured values differ from the expected values by 1.3-1.8 dB. This discrepancy is likely due to the surface roughness of the structures (which was neglected in the simulations) as well as errors in the calibration producing uncertainty in the measurement of the probe. An error analysis shows that if the variation in the alignment of the probe to the standards and the repeatability of the probe is taken into account uncertainties of ±1.2 dB in $S_{21}$ at 625 GHz can be expected.

The most significant sources of loss are the rectangular waveguide (2.65 dB) and the conductor loss of the probe tips (1.2 dB). Shortening the probe tip length would reduce the associated conductor loss along the probe tip's CPW line, but this would impact the mechanical performance of the probe. The length of rectangular waveguide is largely dictated by the size of the waveguide flange used since the probe tip has to extend beyond the bottom of the waveguide flange to contact the substrate (See Example and Experimental Set No. 1). Significant reductions in the length of waveguide could be realized if a smaller flange, such as the Grammer miniature interface described by Hesler (See J. Hesler, A. Kerr, W. Grammer, and E. Wollack, "Recommendations for waveguide interfaces to 1 THZ," in 18th International Symposium on Space Terahertz Technology, 2007). This flange would reduce the diameter by half and consequently reduce the necessary length of waveguide by half.

IV. One-Port Calibration Verification

The de-embedded s-parameters of the probes indicate a reasonable match and insertion loss from the waveguide to the DUT. To demonstrate the probes can support a calibration on a probed substrate, a set of verification measurements were performed. The coaxial probe design is chosen as its lower insertion loss provides for greater dynamic range of the measurement. As the current measurement instrumentation in our laboratory is a one port system, we choose to measure offset shorts not included the calibration are used to verify and assess the probe performance. Five offset short-circuited lines are measured, but only four of them are used in the calibration. The last standard is de-embedded with the resulting calibration and compared against the expected phase of the offset short.

Figure 25A:
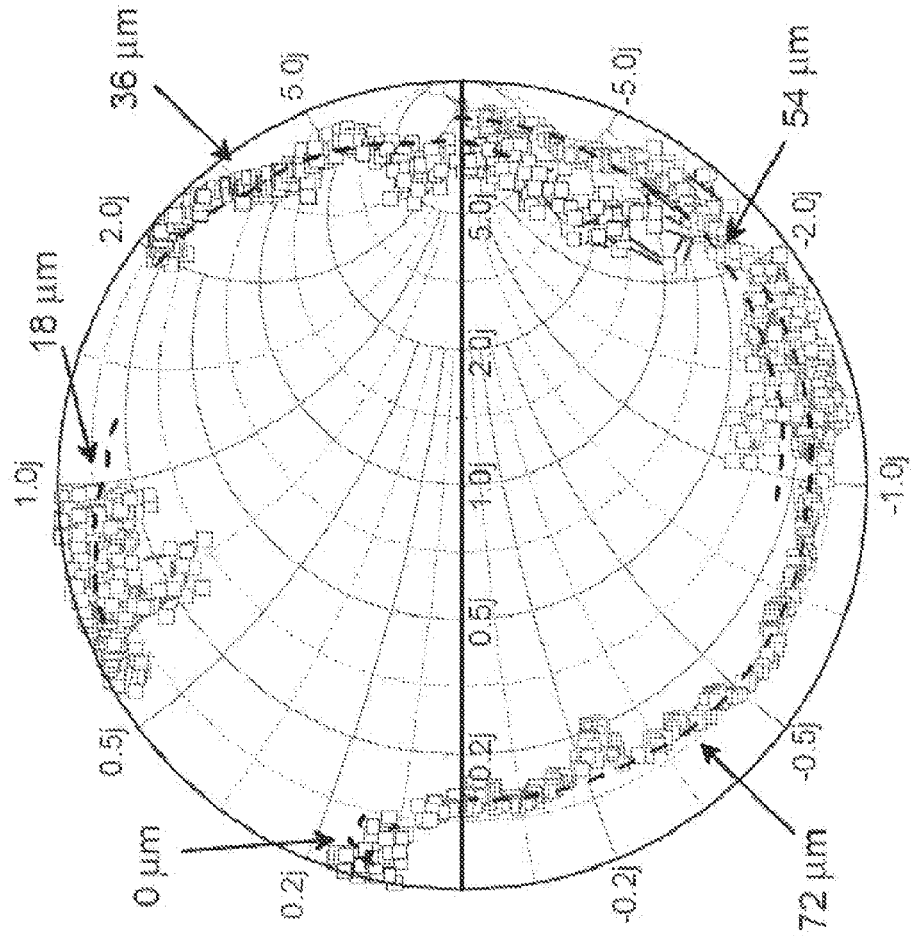
FIG. 25A graphically illustrates the measurements of offset short lines with calibrated on-wafer probes, which shows the position of the four offset shorts on the Smith chart.
Figure 25B:
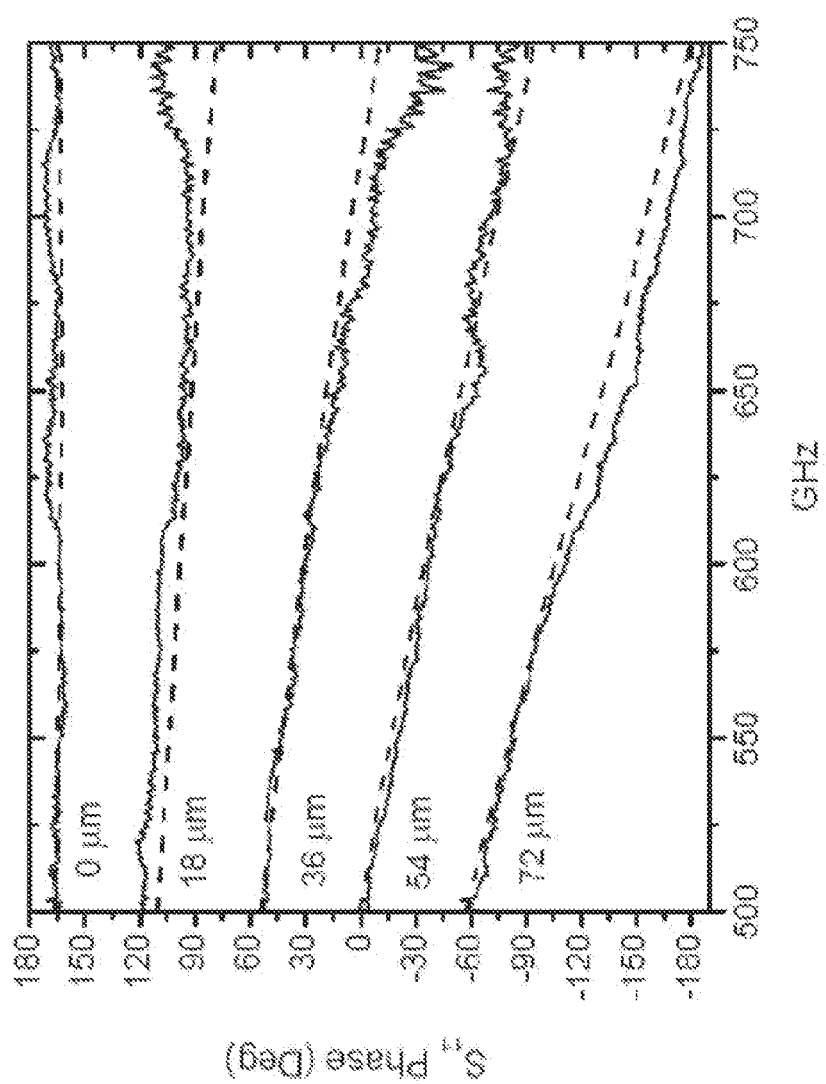
FIG. 25B graphically illustrates the measurements of offset short lines with calibrated on-wafer probes, which shows the phase of the verification offset short lines comparing the measured (solid) to the expected (dashed) value.

FIG. 25A shows different verification standards plotted on a Smith chart. This shows that there is some uncertainty in the magnitude response, but the measurement largely correspond to what is expected for the five offset short lines that are designed to be approximately 60° apart. In FIG. 25B, the measured phase of each line is plotted against its corresponding simulated phase. These measurements closely follow the modeled values, with the measured response varying from the model by 6° on average. The maximum variation from the expected value of the magnitude is 3.3 dB and the phase is 30°. These discrepancies are at the upper end of frequency band, where the insertion loss of the probe increases substantially. This results in a lower accuracy for this system at these frequencies.

TABLE IV

LOSSES IN UNBIASED PROBE AT 625 GHz

| Design | Structure | Length | Attenuation | Total Loss |
|---|---|---|---|---|
| | Waveguide | 34.8 mm | 0.076 dB/mm | 2.65 dB |
| | Calibration Substrate CPW (Conductor) | 70 µm | 5.8 dB/mm | 0.41 dB |
| | Calibration Substrate CPW (Radiation) | 70 µm | 1.6 dB/mm | 0.11 dB |
| Microstrip | Enclosed Microstrip | 450 µm | 3.7 dB/mm | 1.7 dB |
| | Microstrip to CPW transition (Simulation) | N/A | N/A | 0.4 dB |
| | Probe Microstrip | 330 µm | 3.6 dB/mm | 1.2 dB |
| | Probe CPW (Conductor) | 70 µm | 5.3 dB/mm | 0.4 dB |
| | Probe CPW (Radiation - Sim) | 120 µm | N/A | 0.1 dB |
| | Expected loss | | | 7.0 dB |
| | Measured Loss | | | 8.8 dB |
| Coaxial | Coaxial line | 450 µm | 1.5 dB/mm | 0.68 dB |
| | Probe CPW (Conductor) | 400 µm | 3.08 dB/mm | 1.23 dB |
| | Probe CPW (Radiation - Sim) | 400 µm | N/A | 0.3 dB |
| | Expected loss | | | 5.4 dB |
| | Measured Loss | | | 6.6 dB |

V. Conclusions

This Example and Experimental Set (as well as Example and Experimental Set No. 1 provided above) demonstrate, among other things, the design and measurement of the first on-wafer probe operating at 500 to 750 GHz. A silicon micromachined design is applied to achieve the necessary tolerances at these high frequencies. This Example and Experimental Set follows the design of the electromagnetic coupling structures that are compatible with the mechanical design presented in Example and Experimental Set No. 1. Two designs are tested that are based on different transmission line topologies. The microstrip design resulted in higher losses, due to the thin substrate and via-based transition required to couple to the GSG probe tips. The coaxial design required a more complex rectangular waveguide coupling structure to allow for the clamped areas to be moved away from the coaxial line, but one-port measurements show insertion losses to be 1-2 dB lower than the microstrip design. Overall, insertion losses for both designs are between 6-10 dB. The microfabricated compliant chip (probe) is shown to be able to support calibrated measurements in both one and two-port configurations.

Example and Experimental Results Set No. 3

I. Introduction

As schematically shown in FIG. 26, the microfabricated compliant chip 10 (i.e., micromachined probe chip) is housed in an E-plane split-waveguide metal-machined block 23. To contact the device, structure or material (not shown) on the probed substrate (not shown), the microfabricated compliant chip 10 (i.e., probe chip) extends beyond the metal housing 23 by 400 µm (chip extends beyond the housing a length of 400 µm) and terminates in coplanar waveguide (CPW) to form Ground-Signal-Ground (GSG) probe tips 51.

A notable feature of this design is the simple, self-aligning mounting process of the microfabricated compliant chip 10 (i.e., probe chip), which does not require any adhesives (or the like). Recesses (not shown) are milled into the waveguide block 23 with a depth precision of ±3 µm. The probe chip drops into these recesses and is subsequently aligned to the block to better than ±5 µm precision.

FIG. 26B provides an enlarged partial view of the area identified in FIG. 26A. FIG. 26C schematically illustrates the front side of the microfabricated compliant chip 10 (i.e., probe chip). In order to provide mechanical support to the chip as pressure is applied to the probe tip 51, the silicon substrate of the microfabricated compliant chip is clamped in or to the housing 23 (or between sections of the housing) by compressing electroplated gold 52 (e.g., beam leads) on both sides of the substrate 11. The substrate 11 is identified by the dashed lines in FIG. 26B). The recesses are used to align the microfabricated compliant chip 10 (i.e., probe chip) to effectively provide Port-I, which is the waveguide connection and Port-II, which is the CPW probe tips. As noted, the waveguide 24 height b=190 µm, which is half of the waveguide (WR-1.5) width a.

This Example and Experimental Set presents the repeatability of the mounting process and the lifetime of the microfabricated compliant chip (probe). In Experimental Set No. 2 above, two designs were evaluated that couple between waveguide and the probe tips with either a microstrip or a coaxial transmission line. The results presented in this Example and Experimental Set reflect the microstrip-based design, but both designs share a similar mechanical design, so the coaxial-based design should exhibit similar behavior.

II. Mechanical Test

The ultra-thin silicon is used as a substrate for the microstrip line and as a support for the mechanically active compliant beam 50. When compliant beam 50 of the probe contacts the test wafer, the silicon deflects and generates a force at the tip 51. The force induced by the microfabricated compliant chip (probe) with respect to the vertical distance the probe traveled can be modeled as a linear spring, $K_1$ (see FIG. 27)

Figure 27:
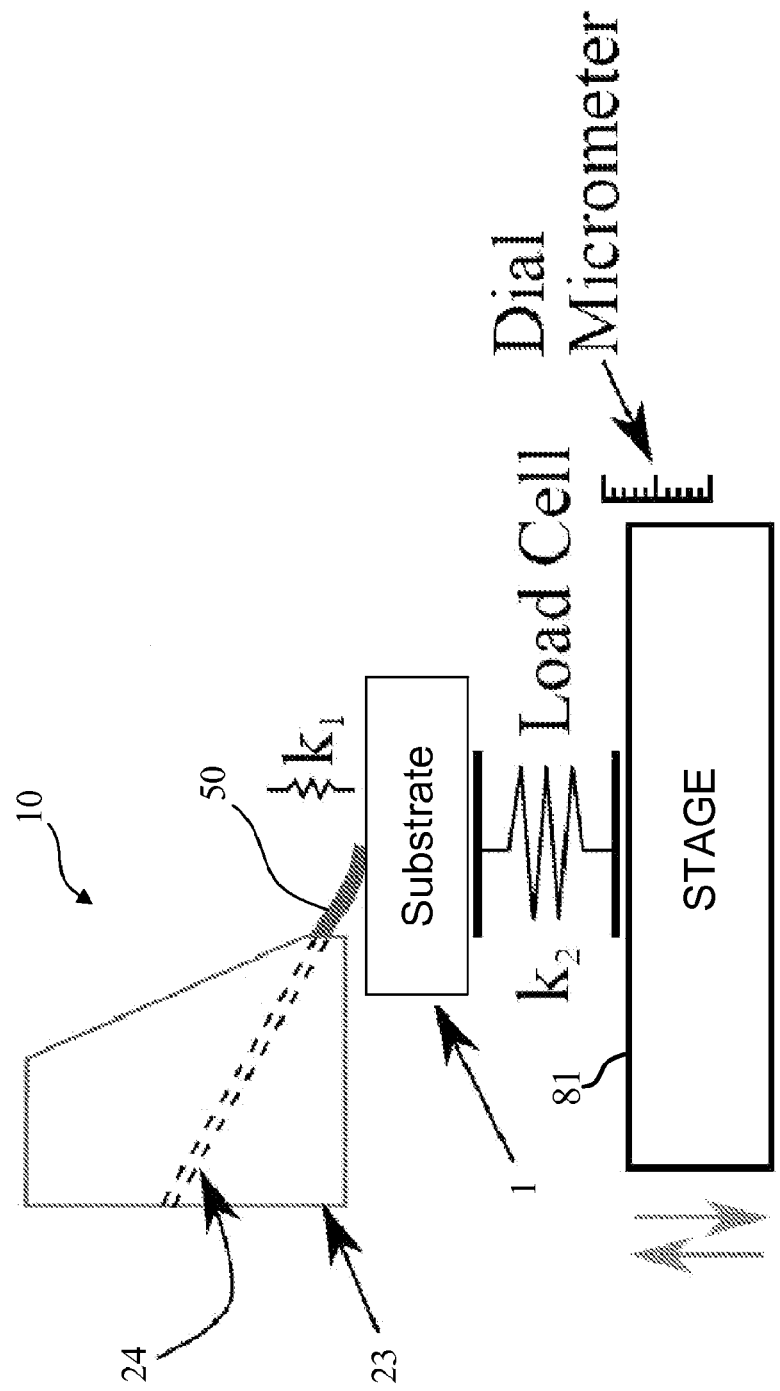
FIG. 27 schematically represents a mechanical test setup whereby the load cell is used to measure the amount of contact force being generated by the microfabricated compliant chip (i.e., probe chip).

The setup as schematically shown in FIG. 27 is used to measure the spring constant, $K_1$. A test wafer (i.e., object substrate 1) is attached to a load cell (Futek® FSH0234) that is used to monitor the contact force. A motor-driven stage 81 is used to move the test wafer 1 vertically. As the stage 81 rises, the microfabricated compliant chip 50 (silicon chip) contacts with the wafer 1 and generates force at the tip 51 of the compliant beam 50 that is measured by the load cell. During this process, the load cell also deflects and can be modeled as another spring, $K_2$. This setup is therefore a series connected two-spring system.

Figure 28:
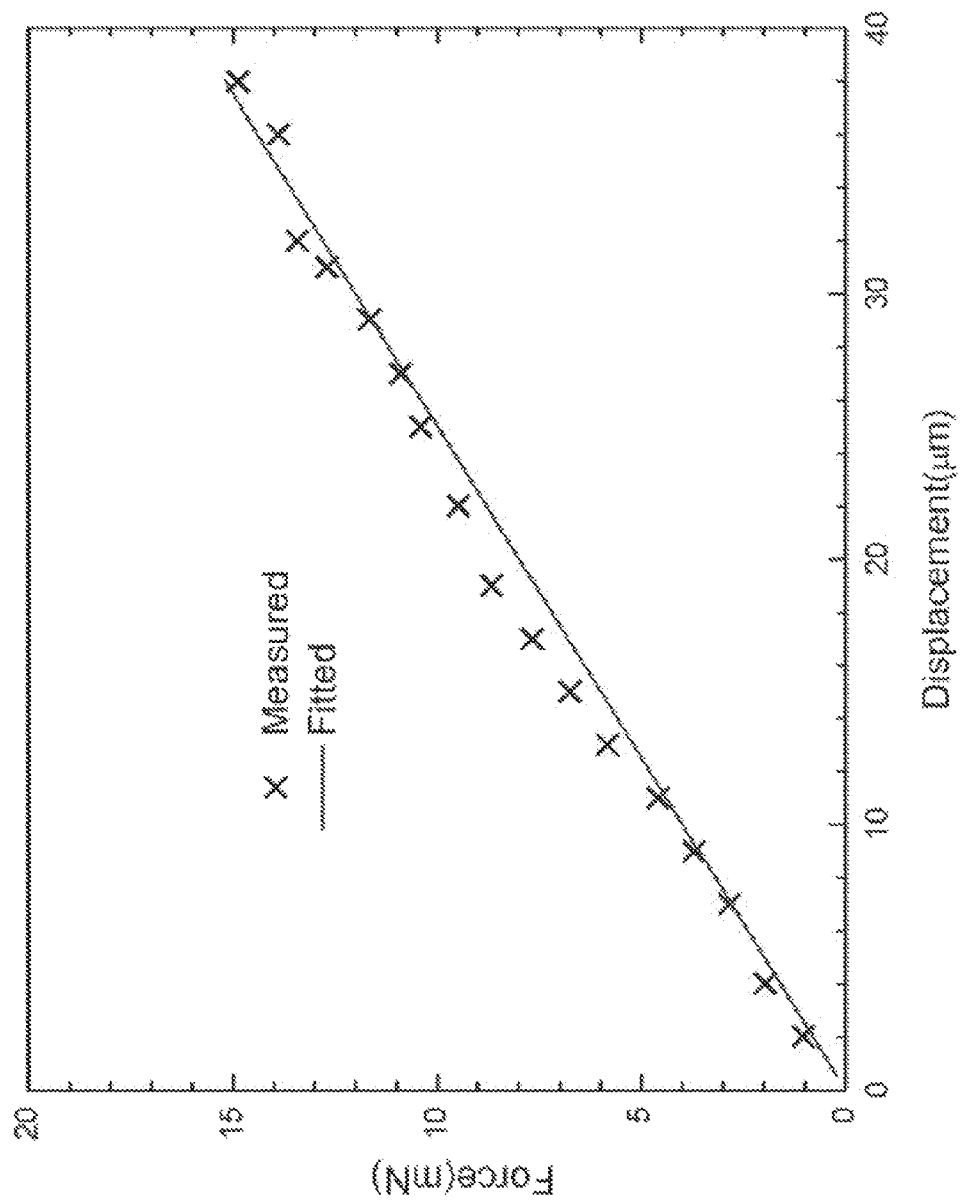
FIG. 28 schematically represents the mechanical test results of the microfabricated compliant chip (i.e., micromachined probe) using the setup shown in FIG. 27. Contact force vs. vertical motion of the stage.

Measuring the contact force with respect to the vertical motion of the stage 81 gives the total spring constant, $K_{total}$. A linear regression of the measured results are shown in FIG. 28 and give $K_{total}=0.40\pm0.02$ mN/µm.

For the series connected two-spring system, $$\frac{1}{K_{total}} = \frac{1}{K_1} + \frac{1}{K_2}.$$

The spring constant of the load cell, $K_2$, is independently measured, using a similar setup, to be $1.07\pm0.07$ mN/µm. Therefore, the spring constant of the probe is $K_1=0.65\pm0.08$ mN/µm.

Previous measurements (as shown in Example and Experimental Set No. 1 above) have shown that a micromachined silicon chip achieves a low contact resistance of 0.07 Ω at 1 mN per tip. However, higher contact force (>3 mN) may be required to ensure that all three tips 51 on the GSG 55 of the microfabricated compliant chip (probe) simultaneously contact to the CPW probing pads (not shown) with low resistance of the Device Under Test (DUT) (not shown) on the object wafer, given possible non-planarity of the probe with the Device Under Test (DUT).

To determine the minimum force required for good Radio Frequency (RF) contact, the microfabricated compliant chip (e.g., micromachined probe) is connected to a one-port WR-1.5 frequency extension unit from Virginia Diodes Inc. (VDI WR1.5 VNAXTXRX) with a Rhode and Schwarz ZVA-40 network analyzer as the backend. The network analyzer (not shown) is used to measure the reflection coefficient at the waveguide connection, Port-I of the microfabricated compliant chip (i.e., probe).

The gold contact pad on the test wafer shorts the CPW probe GSG tips as the stage moves up and the wafer contacts the probe. The phase of the reflection coefficient at Port-I responds to the change in probe tip contact and settles during this process. The contact force where the reflection coefficient settles is defined as the minimum contact force required for RF probing. Test results show that there is a dramatic change in the phase of the measured reflection coefficient when the contact force increases from 0 to 0.2 mN, and as the contact force increases, the reflection coefficient gradually settles. At 15 mN, the phase change in reflection coefficient with respect to contact force is within the phase measurement uncertainty.

III. RF Measurement

A two-tier calibration technique is used to obtain the scattering parameters of the microfabricated compliant chip (probe). With this method, the network analyzer is initially calibrated to a reference plane coincident with the frequency extension unit test port, using a waveguide short and delayed shorts of four different lengths. Because waveguide loads are generally unavailable in the WR-1.5 band, only waveguide delayed shorts, which can be accurately characterized from their dimensions, are used as calibration standards.

After the first tier in the calibration procedure, the microfabricated compliant chip (probe) is attached to the network analyzer test port. The second-tier calibration is performed by terminating the CPW probe tips with on-wafer calibration standards, a CPW short and four CPW delayed shorts that can also be accurately characterized from their dimensions. During second-tier calibration, a 20 mN contact force is used to ensure any non-planarity is overcome. The reflection coefficient measured at the network analyzer test port, $\Gamma^M$, is related to the scattering parameters of the probe, $S_{ij}$, and the reflection coefficient of the CPW short, $\Gamma_l$, by the bilinear transform, $$\Gamma^M = S_{11} + \frac{S_{21}S_{12}\Gamma_l}{1 - S_{22}\Gamma_l}.$$

Figure 29:
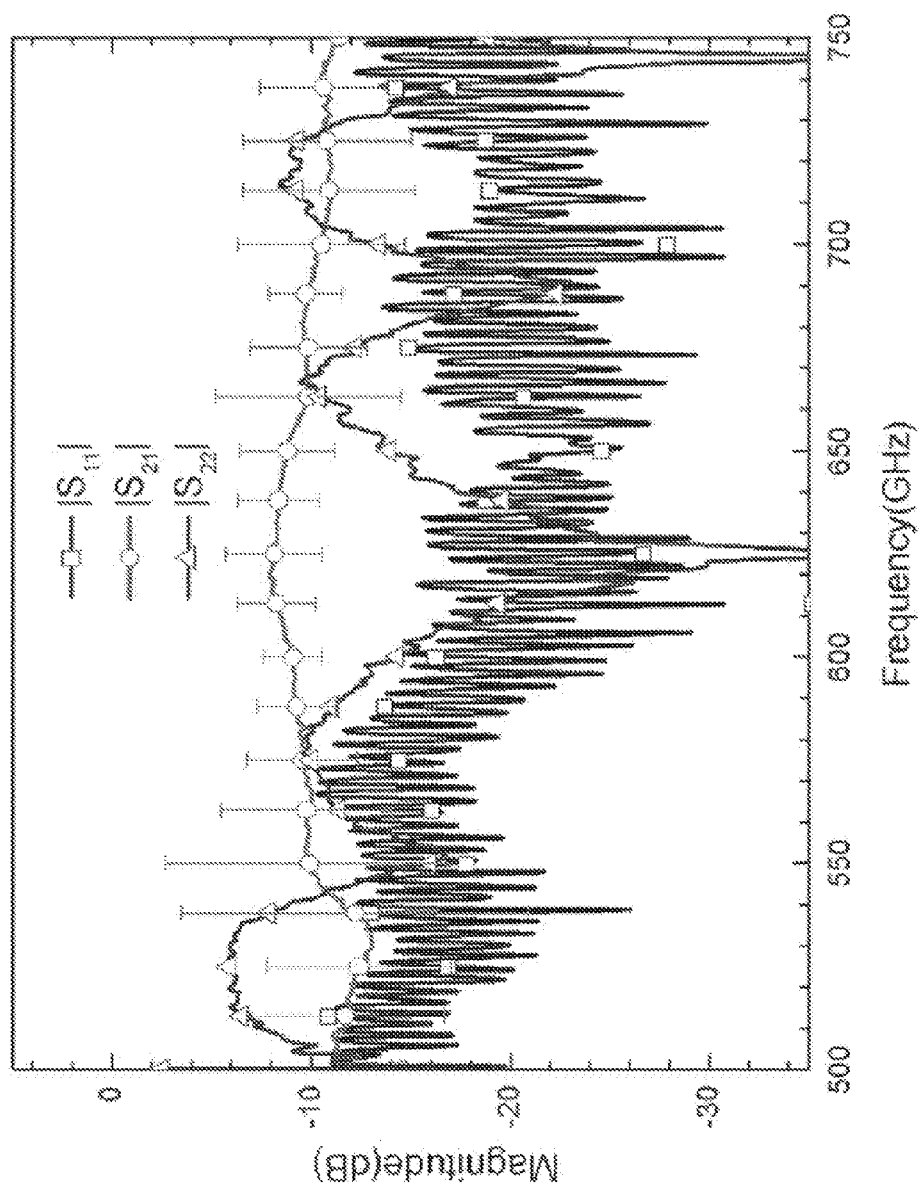
FIG. 29 graphically illustrates the measurement results of a microfabricated compliant chip (i.e., micromachined on-wafer probe).

By measuring the reflection coefficient of the microfabricated compliant chip (probe) with these on-wafer calibration standards, and noting that the probe is a reciprocal network, the scattering parameters of the probe are obtained. The S-parameters of a micromachined probe obtained by this one-port two-tier calibration method are shown in FIG. 29.

The insertion loss varies from 8 to 12 dB and the return loss is larger than 10 dB over most of the band from 500 to 750 GHz. The ripple in $S_{ii}$ is due to a standing wave in the rectangular waveguide because of misalignment at the waveguide connection. The uncertainty in this measurement is due to positioning error and noise in the network analyzer and can be quantified by the method detailed in reference T. Reck, L. Chen, C. Zhang, C. Groppi, H. Xu, A. Arsenovic, S. Barker, A. Lichtenberger, and R. Weikle, "Calibration accuracy of a 625 GHz on-wafer probe," in 76th ARFTG Microwave Measurement Conference Digest, December 2010, (of which is hereby incorporated by reference). The uncertainty in $S_{21}$ is calculated and shown in FIG. 29.

IV. Repeatability

As shown in FIG. 26, the microfabricated compliant chip 10 (i.e., probe chip) is aligned by the recesses in the waveguide block 23 to within ±5 µm. The fabrication process also introduces probe chip variations across the wafer, especially from misalignment in lithography.

Figure 30B:
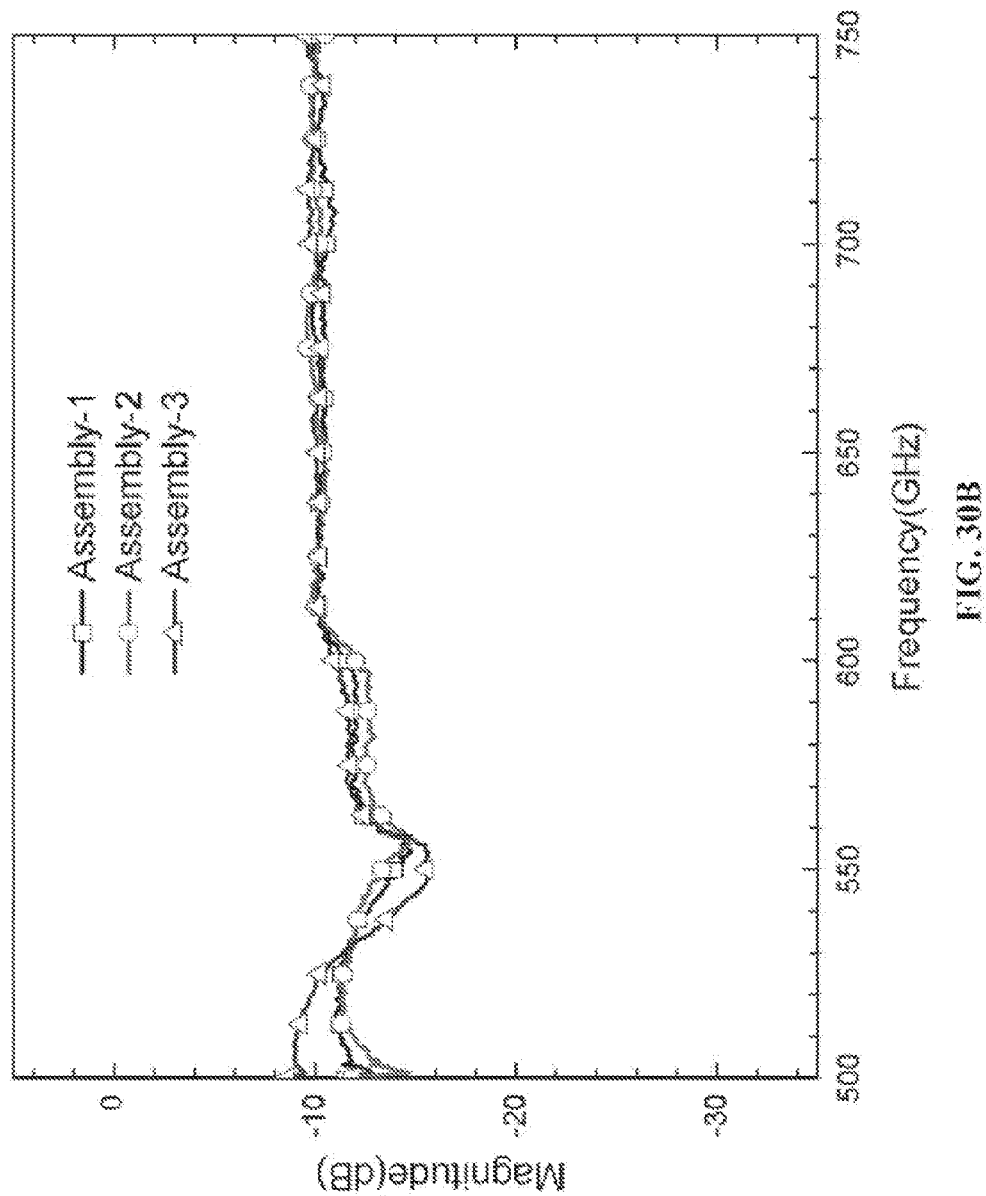
Figure 30C:
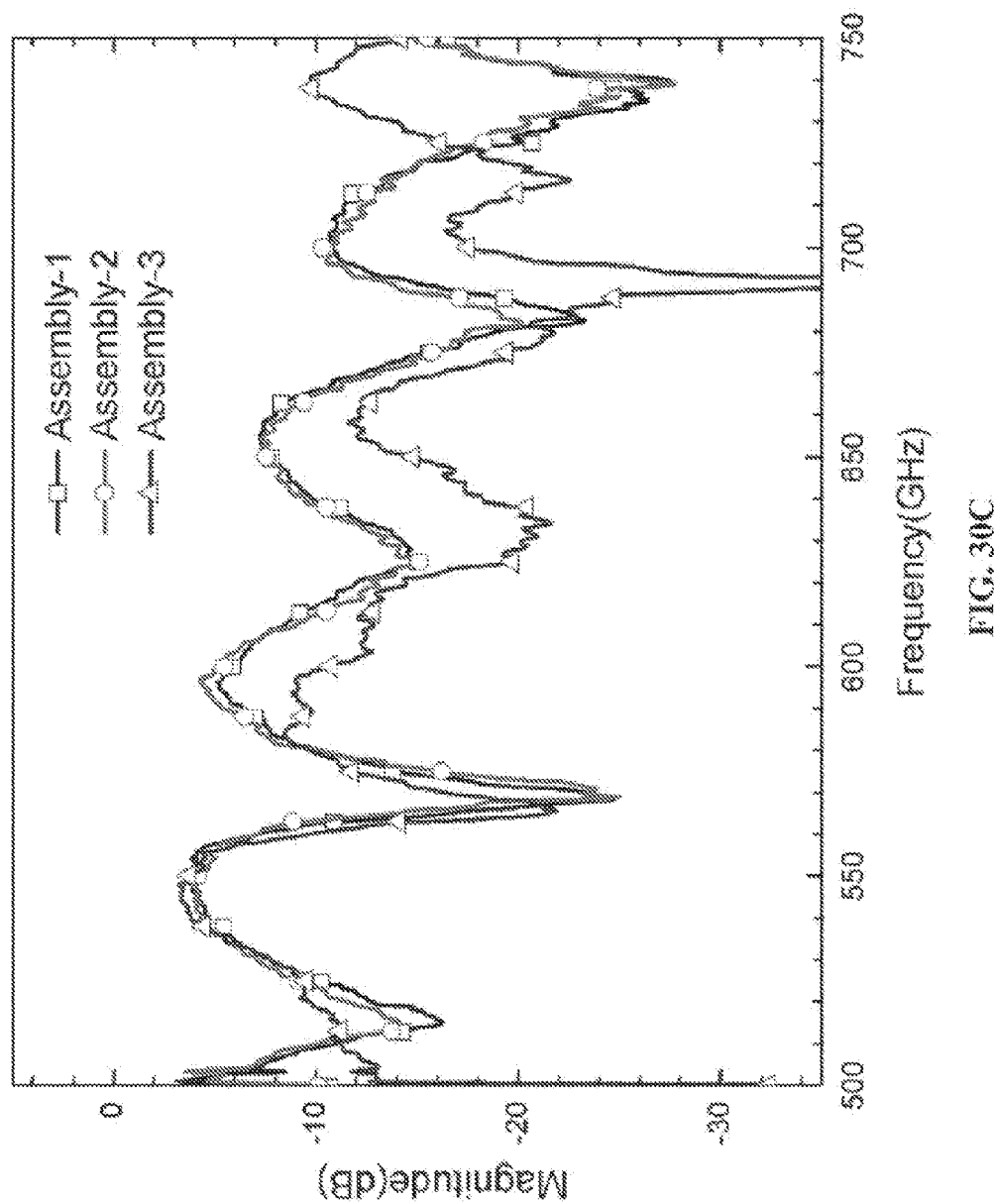

The uncertainty both in chip fabrication and assembly will result in variations in the probe performance. The sensitivity of the probe to the alignment precision is measured by mounting the same probe chip to a waveguide block three times and measuring the corresponding scattering parameters. These measurement results are shown in FIG. 30. The probe performance changes slightly but within the measurement uncertainty. The return loss at the CPW port (FIG. 30C) is degraded because of slightly oversized pins used in these measurements to align the two halves of the waveguide block.

Figure 31B:
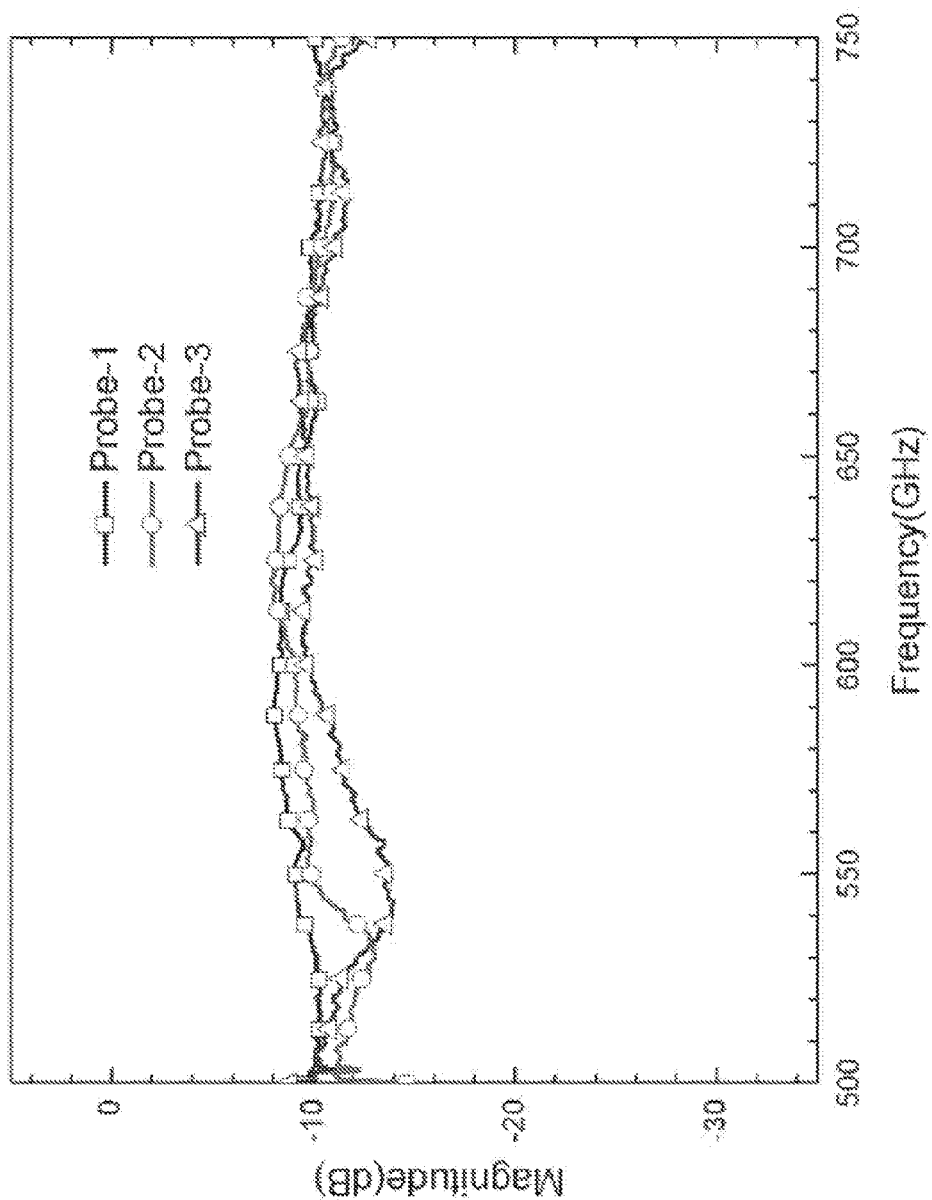
Figure 31C:
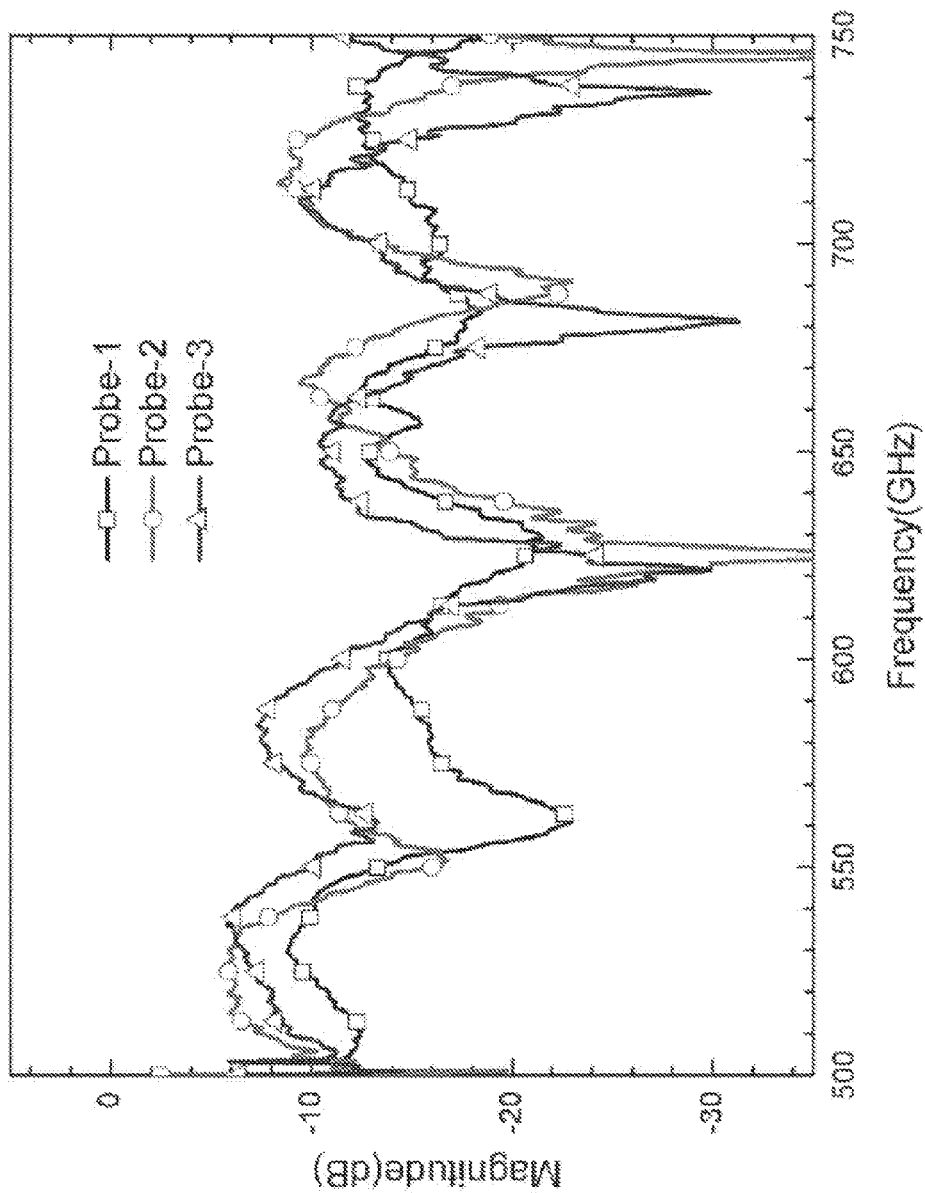

The microfabricated compliant chip (probe) performance with three different probe chips of the same design is shown in FIG. 31. The performance variations are due to the uncertainty both in chip fabrication and assembly. Therefore the variations are slightly larger but still within the measurement uncertainty. In these measurements the oversized pins were replaced resulting in better matching at the CPW port (FIG. 31C).

V. Reliability Tests

The microfabricated compliant chip (on-wafer probes) are designed to skate on the contact pad to break through surface contamination and to ensure a low resistance contact. However, this skating action adds to the wear of the probes. How fast the probes wear depends on factors including contact force as well as probe tip and bond pad materials. As shown in FIG. 26, the CPW probe tips 51 are fabricated on the ultrathin silicon substrate 11 by plated gold, which is 4 µm thick. Most contact pads of submillimeter-wave integrated circuits also use plated gold.

Figure 32A:
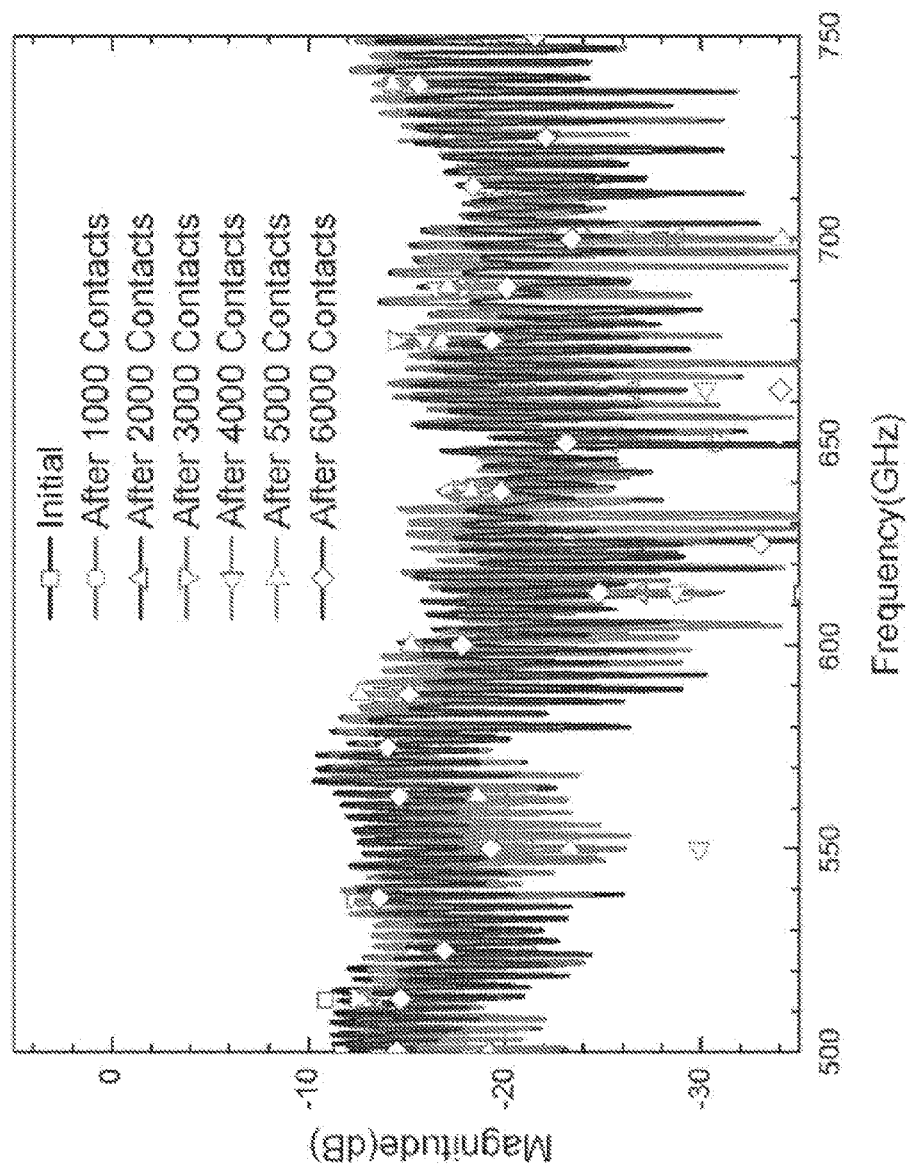
FIGS. 32A-32C graphically illustrate the measured S-parameters of the microfabricated compliant chip (i.e., micromachined probe) doing lifetime testing for: (a) Magnitude of $S_{11}$ (Waveguide side); (b) Magnitude of $S_{21}$; (c) Magnitude of $S_{22}$ (CPW side), respectively.
Figure 32B:
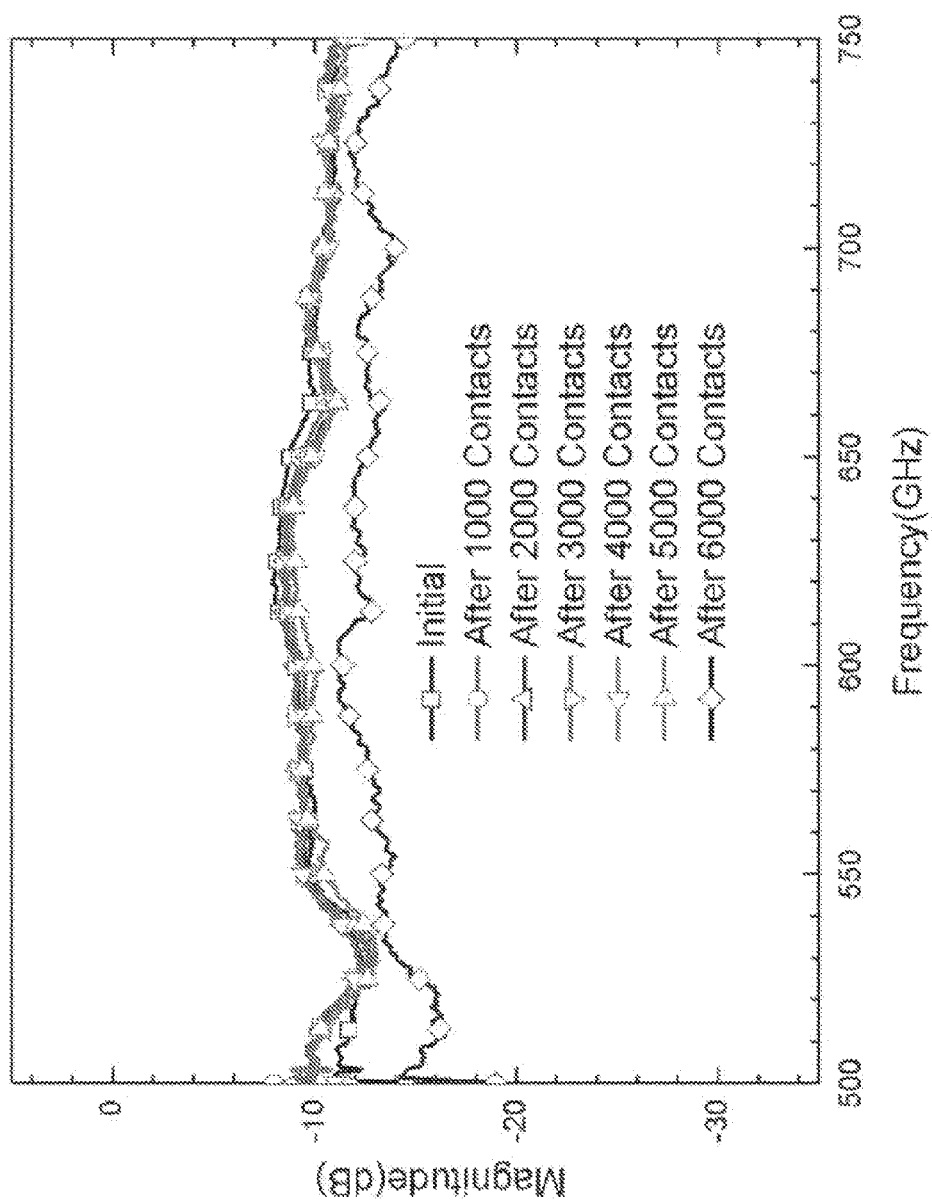
Figure 32C:
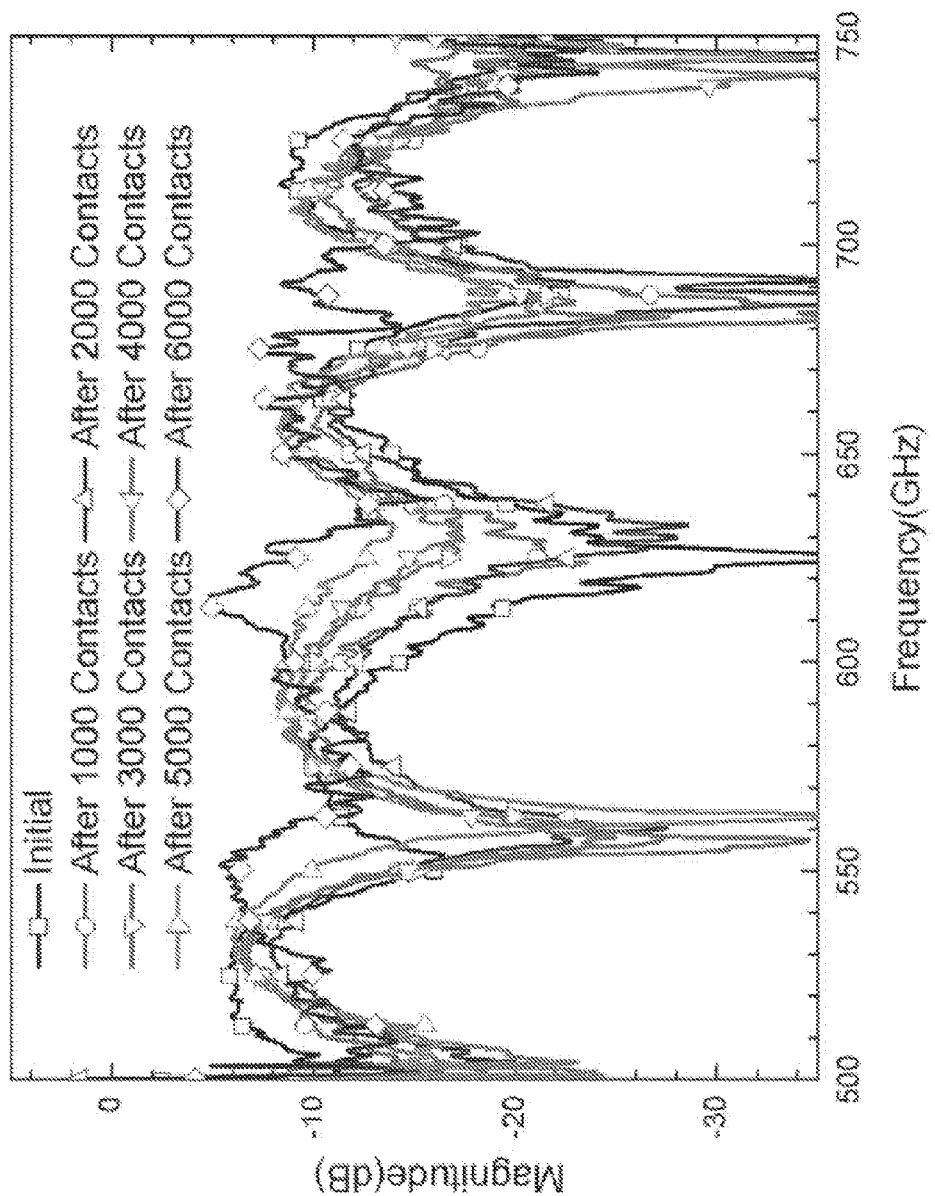

The setup in FIG. 27 is used again to test the lifetime of the microfabricated compliant chip 10 (e.g., micromachined probes). The motor stage 81 is raised up gradually until the contact force reaches 20 mN. Then the motor stage 81 is lowered until compliant beam 50 of the microfabricated compliant chip 10 (probe) and object substrate 1 are separated. This completes one contact cycle. The scattering parameters of the micromachined probe 10 are measured initially and after every 1,000 contact cycles by a one-port two-tier calibration. The measured results are shown in FIG. 32. The microfabricated compliant chip (micromachined probe) maintained consistent performance through 5,000 contacts and then was found to have degraded upon testing after 6,000 contacts.

Figure 33A:
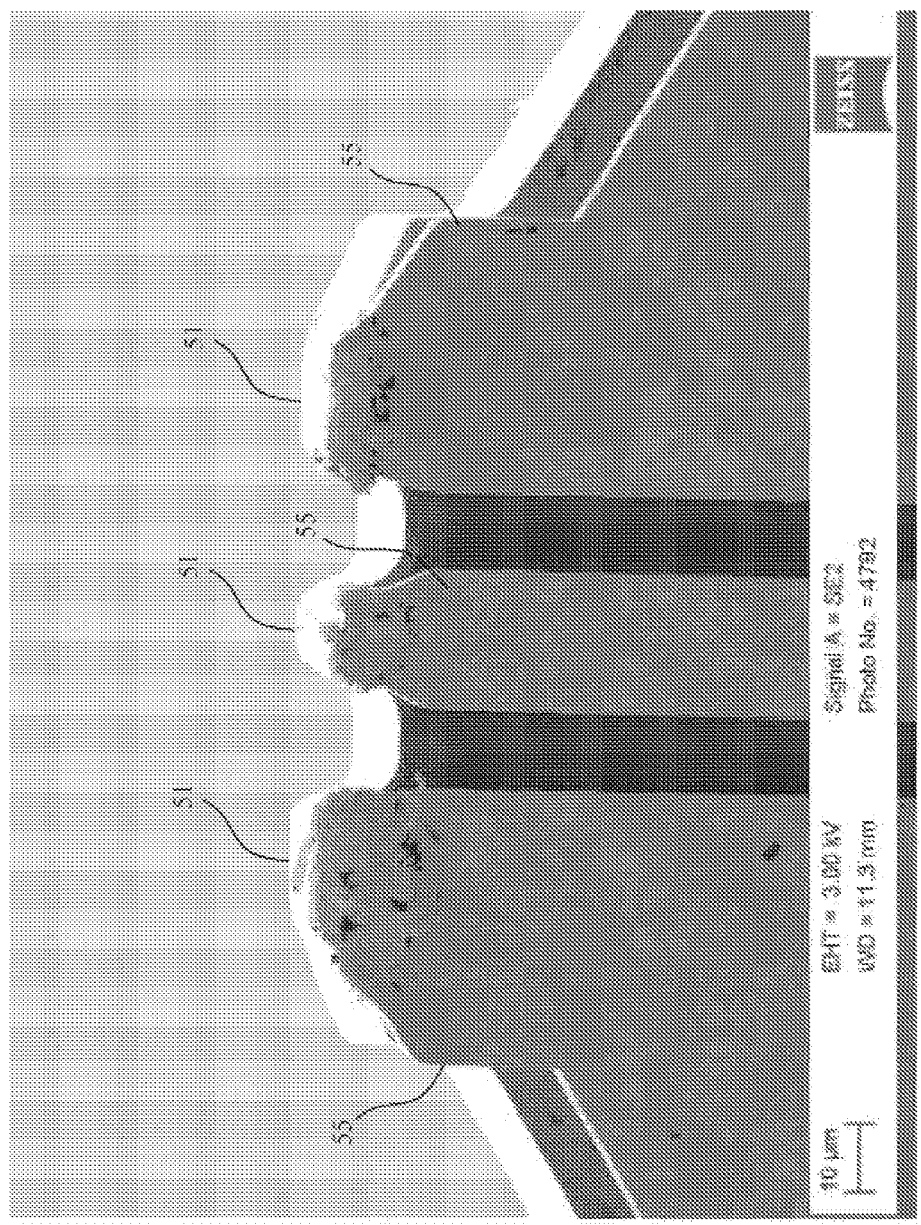
FIGS. 33A-33C provide scanning electron micrograph (SEM) depictions of images of the tips of the microfabricated compliant chip (i.e., micromachined probe) after: (a) 10 contacts; (b) 3000 contacts; and (c) 6000 contacts, respectively.
Figure 33B:
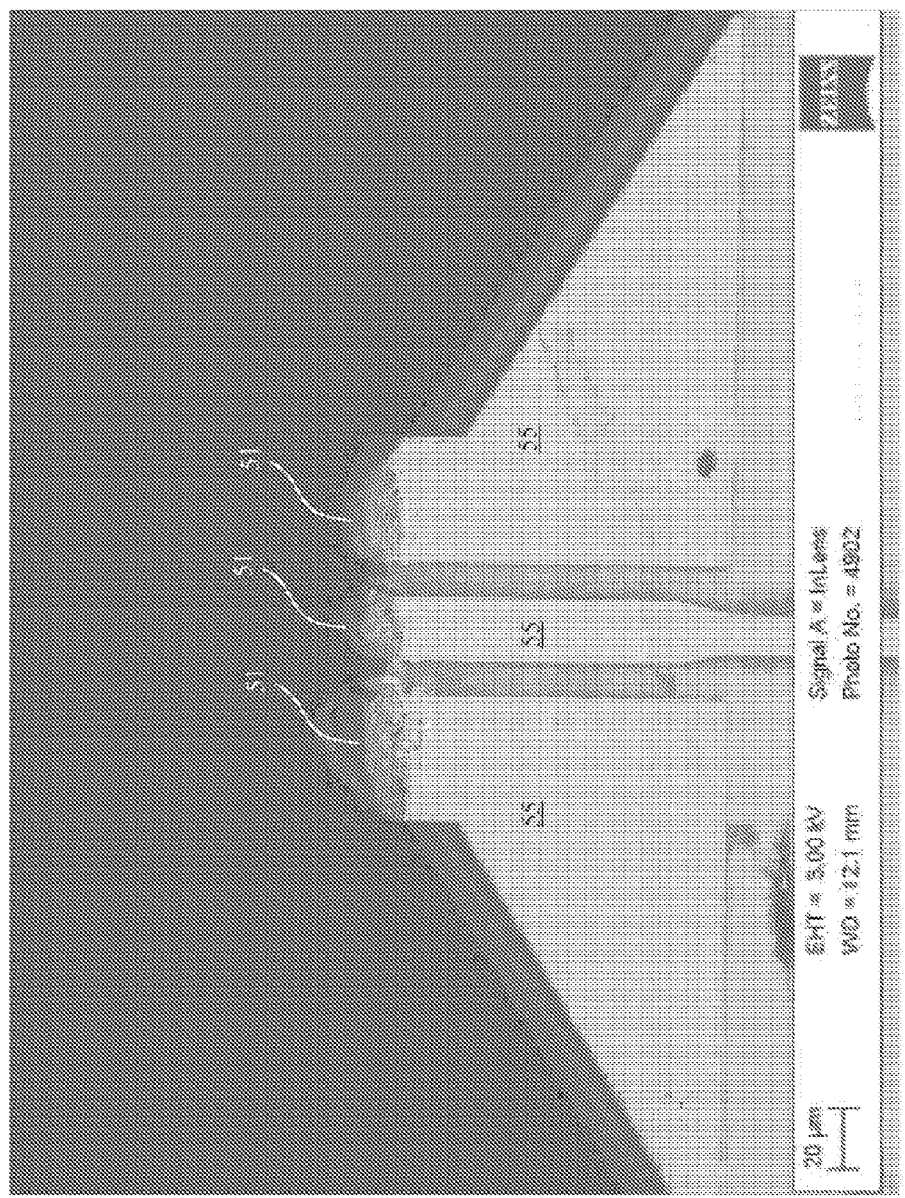
Figure 33C:
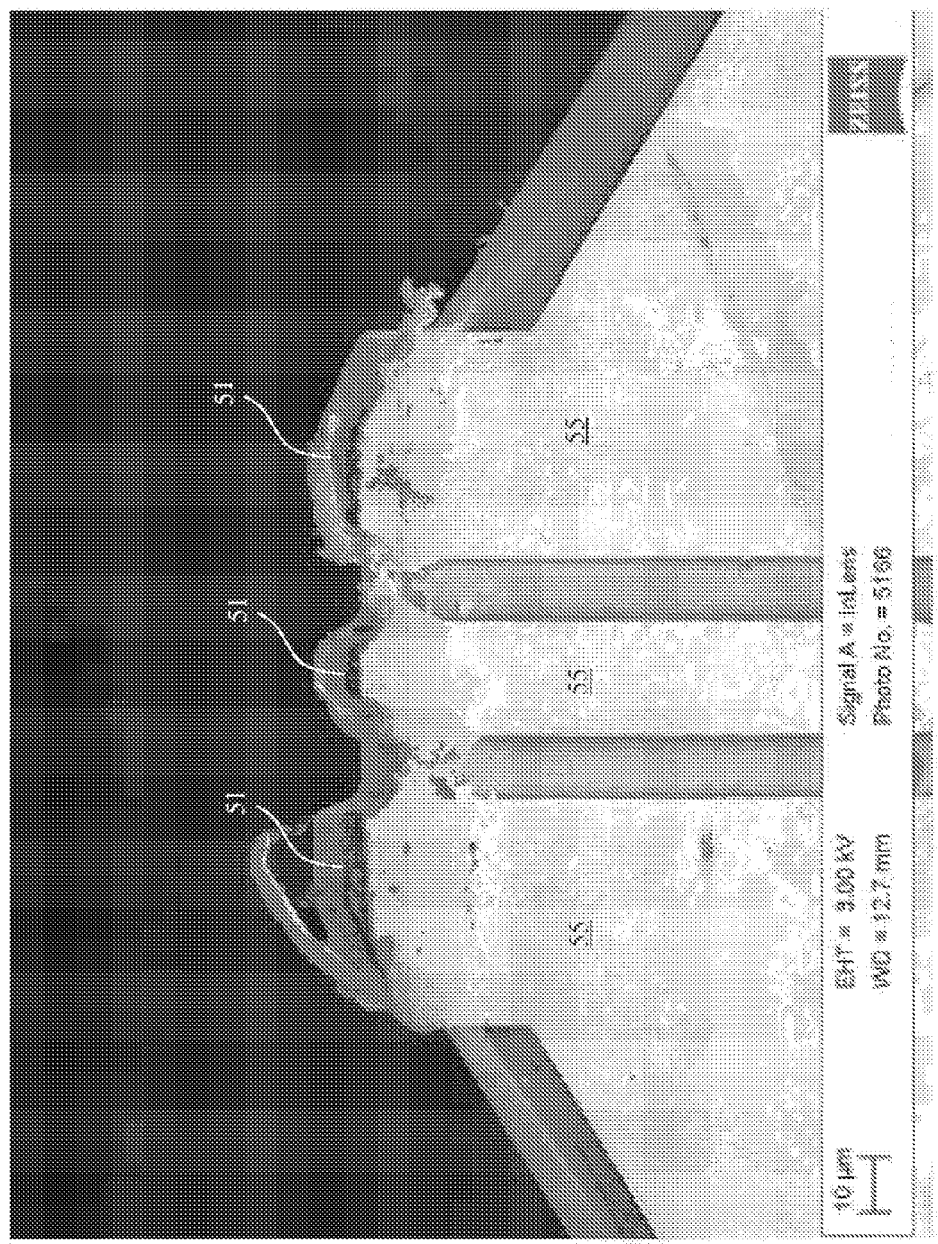

Scanning electron microscope images of the probe tips 51 after 10, 3,000 and 6,000 contacts are shown in FIGS. 33A, 33B, and 33C, respectively. The images show that the probe tips 51 picked up debris from the contact pad (of the DUT) and that this debris built up in the gap between the GSG probe tips 51, which eventually will cause the microfabricated compliant chip (probe) to fail in a short circuit.

VI. Conclusion

These particular measured results prove the feasibility of a reliable microfabricated compliant chip (on-wafer probe) in the terahertz frequency range (e.g., 500-750 GHz). At 20 mN contact force, the microfabricated compliant chip (micromachined probe) is capable of more than 5,000 contacts with consistent RF performance. This microfabricated compliant chip (probe) will significantly reduce the time and cost of submillimeter-wave and terahertz frequency monolithic integrated circuits testing.

Additional Examples

Example 1 includes a device for probing a structure on a surface of an object substrate, said device comprising:

a microfabricated compliant chip, wherein said microfabricated compliant chip comprises integrated electrical interconnects.

Example 2 may optionally include the device of example 1, wherein said microfabricated compliant chip is monolithic.

Example 3 may optionally include the device of example 1, wherein the structure on the object substrate comprises at least one of the following: microelectronic device; Microelectromechanical (MEM) device, material, or non-electronic device.

Example 4 may optionally include the device of example 1, wherein the material comprises a biological material, graphene, an atomic scale lattice structure, or an atomic scale lattice structure.

Example 5 may optionally include the device of example 1, wherein the surface on the object substrate comprises at least one of the following: an integrated circuit.

Example 6 may optionally include the device of example 1, wherein the surface on the object substrate comprises at least one of the following: sample of material with appropriate contacts or some other geometric feature that has been fabricated on the substrate surface.

Example 7 may optionally include the device of example 1, wherein said integrated electrical interconnects of said microfabricated compliant chip comprise:
    at least one compliant beam;
    at least one transmission circuit; and
    a waveguide transition element, wherein said at least one transmission circuit suitable to electrically interconnect said at least one compliant beam with said waive guide transition element.

Example 8 may optionally include the device of example 7, wherein said compliant beam is monolithic.

Example 9 may optionally include the device of example 7, wherein said waveguide transition element suitable to be electrically interconnected to a measurement instrument.

Example 10 may optionally include the device of example 9, wherein said measurement instrument comprises a network analyzer.

Example 11 may optionally include the device of example 1, wherein said microfabricated compliant chip being configured to be secured by a housing.

Example 12 may optionally include the device of example 11, wherein said securement comprises detachably engaging said microfabricated compliant chip to said housing.

Example 13 may optionally include the device of example 11, wherein said securement provided by compressive forces.

Example 14 may optionally include the device of example 13, wherein said compressive forces being adjustable.

Example 15 may optionally include the device of example 11 or 12, wherein said housing comprises an aperture configured to receive said microfabricated compliant chip.

Example 16 may optionally include the device of example 15, wherein said housing aperture comprises at least one of the following: slot, groove, recess, channel, tunnel, indentation, passage, split, or port.

Example 17 may optionally include the device of example 11 or 12, wherein said housing is configured to be re-usable when said microfabricated compliant chip is detached and replaced with another microfabricated compliant chip.

Example 18 may optionally include the device of example 7, wherein said integrated electrical interconnects of said microfabricated compliant chip further comprises:
    at least one of at least one bias current circuit or at least one bias voltage circuit, wherein said at least one bias current circuit or at least one bias voltage circuit is configured to electrically interconnect with the structure on a surface of an object substrate when said at least one compliant beam makes contact with said structure on a surface of an object substrate.

Example 19 may optionally include the device of example 1 or 7, wherein said microfabricated compliant chip is configured for millimeter-wave transmission, as defined by the range of about 30 GHz to about 300 GHz.

Example 20 may optionally include the device of example 1 or 7, wherein said microfabricated compliant chip is configured for sub millimeter-wave transmission, as defined by the range of about 300 GHz to about 3,000 GHz (3 THz).

Example 21 may optionally include the device of example 1 or 7, wherein said microfabricated compliant chip is configured for terahertz frequency, as defined the range of by about 100 GHz to about 10,000 GHz (10 THz).

Example 22 may optionally include the device of example 1 or 7, wherein said microfabricated compliant chip is configured to perform at about 100 GHz or less.

Example 23 may optionally include the device of example 1 or 7, wherein said microfabricated compliant chip is configured to perform in the range of about 100 GHz to about 340 GHz.

Example 24 may optionally include the device of example 1 or 7, wherein said microfabricated compliant chip is configured to perform in the range of about 340 GHz to about 500 GHz.

Example 25 may optionally include the device of example 1 or 7, wherein said microfabricated compliant chip is configured to perform in the range of about 500 GHz to about 750 GHz.

Example 26 may optionally include the device of example 1 or 7, wherein said microfabricated compliant chip is configured to perform in the range of about 600 GHz to about 900 GHz.

Example 27 may optionally include the device of example 1 or 7, wherein said microfabricated compliant chip is configured to perform in the range of about 750 GHz to about 1,100 GHz (1.1 THz).

Example 28 may optionally include the device of example 1 or 7, wherein said microfabricated compliant chip is configured to perform at less than about 1,500 GHz (1.5 THz).

Example 29 may optionally include the device of example 1 or 7, wherein said microfabricated compliant chip is configured to perform in the range of about 1,000 GHz (1 THz) to about 3,000 GHz (3 THz).

Example 30 may optionally include the device of example 1 or 7, wherein said microfabricated compliant chip is configured to perform at about equal to or less than about 3,000 GHz (3 THz).

Example 31 may optionally include the device of example 1 or 7, wherein said microfabricated compliant chip is configured to perform with direct current (DC), i.e., zero frequency transmission.

Example 32 may optionally include the device of example 1, wherein when said microfabricated compliant chip is pressed against the structure on a surface of an object substrate, the microfabricated compliant chip makes electrical contact between the structure on the surface and said integrated electrical interconnects.

Example 33 may optionally include the device of example 32, where the pressing causes flexure in said microfabricated compliant chip.

Example 34 may optionally include the device of example 7, wherein when said at least one compliant beam is pressed against the structure on a surface of an object substrate, said at least one compliant beam makes electrical contact between the structure on the surface and said integrated electrical interconnects.

Example 35 may optionally include the device of example 34, where the pressing causes flexure in said at least one compliant beam.

Example 36 may optionally include the device of example 7, wherein said at least one compliant beam comprises:

at least one contact tip, wherein said at least one contact tip electrically interconnected with said at least one compliant beam, and wherein said at least one contact tip configured to contact the structure on a surface of an object substrate when pressed against it.

Example 37 may optionally include the device of example 36, wherein said at least one contact tip configured to be compliant when said contact tip contacts the structure on a surface of an object substrate when pressed against it.

Example 38 may optionally include the device of example 36, wherein a plurality of said contact tips configured as a coplanar waive guide (CPW) in communication with said at least one transmission circuit.

Example 39 may optionally include the device of example 7, wherein said at least one compliant beam comprises:

a ground-signal-ground (GSG) circuit, wherein said ground-signal-ground (GSG) circuit electrically interconnected with said at least one transmission circuit, and wherein said at a ground-signal-ground circuit (GSG) configured to electrically interconnect with the structure on a surface of an object substrate when said at least one compliant beam is pressed against it.

Example 40 may optionally include the device of example 7, wherein said at least one compliant beam comprises:

a ground-signal (GS) circuit, wherein said ground-signal (GS) circuit electrically interconnected with said at least one transmission circuit, and wherein said at a ground-signal circuit (GS) configured to electrically interconnect with the structure on a surface of an object substrate when said at least one compliant beam is pressed against it.

Example 41 may optionally include the device of example 7, wherein said at least one compliant beam comprises:

a coplanar waive guide (CPW), said coplanar waive guide (CPW) in communication with said at least one transmission circuit.

Example 42 may optionally include the device of example 1, further comprising:

a secondary device for probing the structure on a surface of an object substrate, said secondary device comprising a secondary microfabricated compliant chip, wherein said secondary microfabricated compliant chip comprises secondary integrated electrical interconnects, and wherein said secondary microfabricated compliant chip being configured to be secured by a secondary housing.

Example 43 may optionally include the device of example 1, wherein said microfabricated compliant chip has a length about equal to or greater than about 20 mm.

Example 44 may optionally include the device of example 1, wherein said microfabricated compliant chip has a length about equal to or less than about 20 mm.

Example 45 may optionally include the device of example 1, wherein said microfabricated compliant chip has a length about equal to or less than about 10 mm.

Example 46 may optionally include the device of example 1, wherein said microfabricated compliant chip has a length about equal to or less than about 7 mm.

Example 47 may optionally include the device of example 1, wherein said microfabricated compliant chip has a length about equal to or less than about 5 mm.

Example 48 may optionally include the device of example 1, wherein said microfabricated compliant chip has a length about equal to or less than about 4 mm.

Example 49 may optionally include the device of example 1, wherein said microfabricated compliant chip has a length about equal to or less than about 3.1 mm.

Example 50 may optionally include the device of example 1, wherein said microfabricated compliant chip has a length about equal to or less than about 3 mm.

Example 51 may optionally include the device of example 1, wherein said microfabricated compliant chip has a length about equal to or less than about 2 mm.

Example 52 may optionally include the device of example 1, wherein said microfabricated compliant chip has a length about equal to or less than about 1 mm.

Example 53 may optionally include the device of example 1, wherein said microfabricated compliant chip has a length about equal to or less than about 500 µm.

Example 54 may optionally include the device of example 7, wherein said at least one compliant beam has a width about equal to or greater than about 3 mm (3,000 µm).

Example 55 may optionally include the device of example 7, wherein said at least one compliant beam has a width about equal to or less than about 3 mm (3,000 µm).

Example 56 may optionally include the device of example 7, wherein said at least one compliant beam has a width about equal to or less than about 2.5 mm (2,500 µm).

Example 57 may optionally include the device of example 7, wherein said at least one compliant beam has a width about equal to or less than about 2 mm (2,000 µm).

Example 58 may optionally include the device of example 7, wherein said at least one compliant beam has a width about equal to or less than about 1.5 mm (1,500 µm).

Example 59 may optionally include the device of example 7, wherein said at least one compliant beam has a width about equal to or less than about 1 mm (1,000 µm).

Example 60 may optionally include the device of example 7, wherein said at least one compliant beam has a width about equal to or less than about 750 µm.

Example 61 may optionally include the device of example 7, wherein said at least one compliant beam has a width about equal to or less than about 500 µm.

Example 62 may optionally include the device of example 7, wherein said at least one compliant beam has a width about equal to or less than about 300 µm.

Example 63 may optionally include the device of example 7, wherein said at least one compliant beam has a width about equal to or less than about 200 µm.

Example 64 may optionally include the device of example 7, wherein said at least one compliant beam has a width about equal to or less than about 100 µm.

Example 65 may optionally include the device of example 7, wherein said at least one compliant beam has a width about equal to or less than about 50 µm.

Example 66 may optionally include the device of example 11, wherein said microfabricated compliant chip extends beyond the housing a length about equal to or greater than about 1 cm (10 mm).

Example 67 may optionally include the device of example 11, wherein said microfabricated compliant chip extends beyond the housing a length about equal to or less than about 1 cm (10 mm).

Example 68 may optionally include the device of example 11, wherein said microfabricated compliant chip extends beyond the housing a length about equal to or less than about 1 mm (1,000 µm).

Example 69 may optionally include the device of example 11, wherein said microfabricated compliant chip extends beyond the housing a length about equal to or less than about 750 µm.

Example 70 may optionally include the device of example 11, wherein said microfabricated compliant chip extends beyond the housing a length about equal to or less than about 500 µm.

Example 71 may optionally include the device of example 11, wherein said microfabricated compliant chip extends beyond the housing a length about equal to or less than about 400 µm.

Example 72 may optionally include the device of example 11, wherein said microfabricated compliant chip extends beyond the housing a length about equal to or less than about 200 µm.

Example 73 may optionally include the device of example 11, wherein said microfabricated compliant chip extends beyond the housing a length about equal to or less than about 100 µm.

Example 74 may optionally include the device of example 11, wherein said microfabricated compliant chip extends beyond the housing a length about equal to or less than about 50 µm.

Example 75 includes a device for probing a structure on a surface of an object substrate, said device being configured to be secured by a housing that is configured to be able to electrically interconnect to a measurement instrument, wherein said device comprises:

a microfabricated compliant chip, wherein said microfabricated compliant chip comprises integrated electrical interconnects.

Example 76 may optionally include the device example 75, wherein said integrated electrically interconnects configured to electrically interconnect with the housing when said microfabricated compliant chip is secured by the housing.

Example 77 may optionally include the device of example 76, wherein said securement comprises detachably engaging said microfabricated compliant chip to the housing.

Example 78 may optionally include the device of example 77, wherein microfabricated compliant chip can be detached from the housing.

Example 79 may optionally include the device of example 77, wherein said detached microfabricated compliant chip is replaced with a replacement microfabricated compliant chip, said replacement microfabricated compliant chips being configured to be secured by the housing.

Example 80 includes a housing that is configured to be able to electrically interconnect to a measurement instrument, wherein said housing comprises:

an aperture that is configured to detachably engage with a microfabricated compliant chip that is used for probing a structure on a surface of an object substrate.

Example 81 may optionally include the device of example 80, wherein said housing is configured to be re-usable when said microfabricated compliant chip is detached and replaced with another microfabricated compliant chip or other device.

Example 82 includes a method of fabricating a device for probing a structure on a surface of an object substrate, said method comprising:

providing a substrate; and integrating electrical interconnects in said substrate to provide a microfabricated compliant chip.

Example 83 may optionally include the method of example 82, wherein said microfabricated compliant chip is monolithic.

Example 84 may optionally include the method of example 82, wherein the structure on the object substrate comprises at least one of the following:

microelectronic device; Microelectromechanical (MEM) device, material, or non-electronic device.

Example 85 may optionally include the method of example 82, wherein the material comprises a graphene, an atomic scale lattice structure, or an atomic scale lattice structure.

Example 86 may optionally include the method of example 82, wherein the surface on the object substrate comprises at least one of the following: an integrated circuit.

Example 87 may optionally include the method of example 82, wherein the surface on the object substrate comprises at least one of the following:

sample of material with appropriate contacts or some other geometric feature that has been fabricated on the substrate surface.

Example 88 may optionally include the method of example 82, wherein said integrated electrical interconnects of said microfabricated compliant chip comprise:

at least one compliant beam;

at least one transmission circuit; and a waveguide transition element, wherein said at least one transmission circuit suitable to electrically interconnect said at least one compliant beam with said waive guide transition element.

Example 89 may optionally include the method of example 88, wherein said compliant beam is monolithic.

Example 90 may optionally include the method of example 88, wherein said waveguide transition element suitable to be electrically interconnected to a measurement instrument.

Example 91 may optionally include the device of example 90, wherein said measurement instrument comprises a network analyzer.

Example 92 may optionally include the method of example 82, wherein said microfabricated compliant chip being configured to be secured by a housing.

Example 93 may optionally include the method of example 92, wherein said securement comprises detachably engaging said microfabricated compliant chip to said housing.

Example 94 may optionally include the method of example 92, wherein said securement provided by compressive forces.

Example 95 may optionally include the method of example 94, wherein said compressive forces being adjustable.

Example 96 may optionally include the method of example 92 or 93, wherein said housing comprises an aperture configured to receive said microfabricated compliant chip.

Example 97 may optionally include the method of example 96, wherein said housing aperture comprises at least one of the following: slot, groove, recess, channel, tunnel, indentation, passage, split, or port.

Example 98 may optionally include the method of example 92 or 93, wherein said housing is configured to be re-usable when said microfabricated compliant chip is detached and replaced with another microfabricated compliant chip.

Example 99 may optionally include the method of example 88, wherein said integrated electrical interconnects of said microfabricated compliant chip further comprises:

at least one of at least one bias current circuit or at least one bias voltage circuit, wherein said at least one bias current circuit or at least one bias voltage circuit is configured to electrically interconnect with the structure on a surface of an object substrate when said at least one compliant beam makes contact with said structure on a surface of an object substrate.

Example 100 may optionally include the method of example 82 or 88, wherein said microfabricated compliant chip is configured for millimeter-wave transmission, as defined by the range of about 30 GHz to about 300 GHz.

Example 101 may optionally include the method of example 82 or 88, wherein said microfabricated compliant chip is configured for sub millimeter-wave transmission, as defined the range of by about 300 GHz to about 3,000 GHz (3 THz).

Example 102 may optionally include the method of example 82 or 88, wherein said microfabricated compliant chip is configured for terahertz frequency, as defined the range of by about 100 GHz to about 10,000 GHz (10 THz).

Example 103 may optionally include the method of example 82 or 88, wherein said microfabricated compliant chip is configured to perform at about 100 GHz or less.

Example 104 may optionally include the method of example 82 or 88, wherein said microfabricated compliant chip is configured to perform in the range of about 100 GHz to about 340 GHz.

Example 105 may optionally include the method of example 82 or 88, wherein said microfabricated compliant chip is configured to perform in the range of about 340 GHz to about 500 GHz.

Example 106 may optionally include the method of example 82 or 88, wherein said microfabricated compliant chip is configured to perform in the range of about 500 GHz to about 750 GHz.

Example 107 may optionally include the method of example 82 or 88, wherein said microfabricated compliant chip is configured to perform in the range of about 600 GHz to about 900 GHz.

Example 108 may optionally include the method of example 82 or 88, wherein said microfabricated compliant chip is configured to perform in the range of about 750 GHz to about 1,100 GHz (1.1 THz).

Example 109 may optionally include the method of example 82 or 88, wherein said microfabricated compliant chip is configured to perform at less than about 1,500 GHz (1.5 THz).

Example 110 may optionally include the method of example 82 or 88, wherein said microfabricated compliant chip is configured to perform in the range of about 1,000 GHz (1 THz) to about 3,000 GHz (3 THz).

Example 111 may optionally include the method of example 82 or 88, wherein said microfabricated compliant chip is configured to perform at equal or less than about 3,000 GHz (3 THz).

Example 112 may optionally include the method of example 82 or 88, wherein said microfabricated compliant chip is configured to perform with direct current (DC), i.e., zero frequency transmission.

Example 113 may optionally include the method of example 82, wherein said microfabricated compliant chip has a about equal to or length greater than about 20 mm.

Example 114 may optionally include the method of example 82, wherein said microfabricated compliant chip has a length about equal to or less than about 20 mm.

Example 115 may optionally include the method of example 82, wherein said microfabricated compliant chip has a length about equal to or less than about 10 mm.

Example 116 may optionally include the method of example 82, wherein said microfabricated compliant chip has a length about equal to or less than about 7 mm.

Example 117 may optionally include the method of example 82, wherein said microfabricated compliant chip has a length about equal to or less than about 5 mm.

Example 118 may optionally include the method of example 82, wherein said microfabricated compliant chip has a length about equal to or less than about 4 mm.

Example 119 may optionally include the method of example 82, wherein said microfabricated compliant chip has a length about equal to or less than about 3.1 mm.

Example 120 may optionally include the method of example 82, wherein said microfabricated compliant chip has a length about equal to or less than about 3 mm.

Example 121 may optionally include the method of example 82, wherein said microfabricated compliant chip has a length about equal to or less than about 2 mm.

Example 122 may optionally include the method of example 82, wherein said microfabricated compliant chip has a length about equal to or less than about 1 mm.

Example 123 may optionally include the method of example 82, wherein said microfabricated compliant chip has a length about equal to or less than about 500 μm.

Example 124 may optionally include the method of example 88, wherein said at least one compliant beam has a width about equal to or greater than about 3 mm (3,000 μm).

Example 125 may optionally include the method of example 88, wherein said at least one compliant beam has a width about equal to or less than about 3 mm (3,000 mm).

Example 126 may optionally include the method of example 88, wherein said at least one compliant beam has a width about equal to or less than about 2.5 mm (2,500 μm).

Example 127 may optionally include the method of example 88, wherein said at least one compliant beam has a width about equal to or less than about 2 mm (2,000 mm).

Example 128 may optionally include the method of example 88, wherein said at least one compliant beam has a width about equal to or less than about 1.5 mm (1,500 μm).

Example 129 may optionally include the method of example 88, wherein said at least one compliant beam has a width about equal to or less than about 1 mm (1,000 μm).

Example 130 may optionally include the method of example 88, wherein said at least one compliant beam has a width about equal to or less than about 750 μm.

Example 131 may optionally include the method of example 88, wherein said at least one compliant beam has a width about equal to or less than about 500 μm.

Example 132 may optionally include the method of example 88, wherein said at least one compliant beam has a width about equal to or less than about 300 µm.

Example 133 may optionally include the method of example 88, wherein said at least one compliant beam has a width about equal to or less than about 200 µm.

Example 134 may optionally include the method of example 88, wherein said at least one compliant beam has a width about equal to or less than about 100 µm.

Example 135 may optionally include the method of example 88, wherein said at least one compliant beam has a width about equal to or less than about 50 µm.

Example 136 may optionally include the method of example 92, wherein said microfabricated compliant chip extends beyond the housing a length about equal to or greater than about 1 cm (10 mm).

Example 137 may optionally include the method of example 92, wherein said microfabricated compliant chip extends beyond the housing a length about equal to or less than about 1 cm (10 mm).

Example 138 may optionally include the method of example 92, wherein said microfabricated compliant chip extends beyond the housing a length about equal to or less than about 1 mm (1,000 µm).

Example 139 may optionally include the method of example 92, wherein said microfabricated compliant chip extends beyond the housing a length about equal to or less than about 750 µm.

Example 140 may optionally include the method of example 92, wherein said microfabricated compliant chip extends beyond the housing a length about equal to or less than about 500 µm.

Example 141 may optionally include the method of example 92, wherein said microfabricated compliant chip extends beyond the housing a length about equal to or less than about 400 µm.

Example 142 may optionally include the method of example 92, wherein said microfabricated compliant chip extends beyond the housing a length about equal to or less than about 200 µm.

Example 143 may optionally include the method of example 92, wherein said microfabricated compliant chip extends beyond the housing a length about equal to or less than about 100 µm.

Example 144 may optionally include the method of example 92, wherein said microfabricated compliant chip extends beyond the housing a length about equal to or less than about 50 µm.

Example 145 includes the method of fabricating a device used for probing a structure on a surface of an object substrate, said device being configured to be secured by a housing that is configured to be able to electrically interconnect to a measurement instrument, wherein method comprises:

providing a substrate; and integrating electrical interconnects in said substrate to provide a microfabricated compliant chip.

Example 146 may optionally include the device of example 145, wherein said integrated electrically interconnects configured to electrically interconnect with the housing when said microfabricated compliant chip is secured by the housing.

Example 147 may optionally include the method example 145, wherein said securement comprises detachably engaging said microfabricated compliant chip to the housing.

Example 148 may optionally include the method of example 147, wherein microfabricated compliant chip can be detached from the housing.

Example 149 may optionally include the method of example 147, wherein said detached microfabricated compliant chip is replaced with a replacement microfabricated compliant chip, said replacement microfabricated compliant chips being configured to be secured by the housing.

Example 150 includes the method of testing a structure on a surface of an object substrate, wherein said testing method comprises:

probing the surface of an object substrate, wherein said probing is accomplished with said device of any one of examples 1, 7, 75, or 80. Further, wherein the device (including the microfabricated compliance chip, as well as related systems to the device) may include subject matter of one or more of any combination of the examples discussed in Examples nos. 1-81.

REFERENCES

The devices, systems, compositions, computer program products, methods of use, methods of fabrication, methods of testing and related methods of various embodiments of the invention disclosed herein may utilize aspects disclosed in the following references, applications, publications and patents and which are hereby incorporated by reference herein in their entirety:

[1] W. Deal, "Solid-state amplifiers for terahertz electronics," in Proceedings of the IEEE MTT-S International Microwave Symposium, 2010.

[2] J. Hacker, M. Seo, A. Young, Z. Griffith, M. Urteaga, T. Reed, and M. Rodwell., "THz MMICs based on InP HBT technology," in Proceedings of the IEEE MTT-S International Microwave Symposium, 2010.

[3] A. Fung, D. Dawson, L. Samoska, K. Lee, T. Gaier, P. Kangaslahti, C. Oleson, A. Denning, Y. Lau, and G. Boll, "Two-port vector network analyzer measurements in the 218-344 and 356-500-GHz frequency bands," Microwave Theory and Techniques, IEEE Transactions on, vol. 54, no. 12, pp. 4507-4512, December 2006.

[4] S. Liu and G. Boll, "A new probe for w-band on-wafer measurements," in Microwave Symposium Digest, 1993, IEEE MTT-S International, 1993, pp. 1335-1338 vol. 3.

[5] R. Bass, A. Lichtenberger, R. Weikle, S. Pan, E. Bryerton, J. Kooi, and C. Walker, "Ultra-thin silicon chips for submillimeter-wave applications," in Proceedings of the Fifteenth International Symposium on Space THz Technology, March 2004.

[6] J. W. Kooi, G. Chattopadhyay, S. Withington, F. Rice, J. Zmuidzinas, C. Walker, and G. Yassin, "A full-height waveguide to thinfilm microstrip transition with exceptional RF bandwidth and coupling efficiency," International Journal of Infrared and Millimeter Waves, vol. 24, no. 3, pp. 261-284, March 2003.

[7] E. M. Godshalk, "Wafer probing at w-band," September 1993, pp. 848-850.

[8] "The infinity probe for on-wafer device characterization and modeling to 110 GHZ," Cascade Microtech, Tech. Rep., 2004.

[9] "Infinity probe: high-frequency performance with low, stable contact resistance," Cascade Microtech, Inc, Beaverton, Oreg. 97006, Tech. Rep., 2008.

[10] J. Schimkat, "Contact measurements providing basic design data for microrelay actuators," Sensors and Actuators A: Physical, vol. 73, no. 1-2, pp. 138-143, 1999. [Online]. Available: http://www.sciencedirect.com/science/article/B6THG-3WWKPDW-1F/2/27c17f2b6bd61b893f706210565ca324

[11] I. Chasiotis, C. Bateson, K. Timpano, A. McCarty, N. Barker, and J. Stanec, "Strain rate effects on the mechanical behavior of nanocrystalline Au films," Thin Solid Films, vol. 515, no. 6, pp. 3183-3189, 2007, tMS 2005—Mechanical Behaviour of Thin Films and Small Structures—TMS 2005. [Online] Available: http://www.sciencedirect.com/science/article/B6TW0—4JCBN4F-5/2/0d8c70a8e8b0fc0b3ac34377f55b75bb.

[12] D. Son, J.-J. Kim, T. W. Lim, and D. Kwon, "Evaluation of fatigue strength of LIGA nickel film by microtensile tests," Scripta Materialia, vol. 50, pp. 1265-1269, May 2004.

[13] "Fused silica," Del Mar Ventures, Tech. Rep., 2007, http://www.sciner.com/Opticsland/FS.htm. [Online]. Available: http://www.sciner.com/Opticsland/FS.htm

[14] K. Hjort, J. Soderkvist, and J. A. Schweitz, "Gallium arsenide as a mechanical material," Journal of Micromechanics and Microengineering, vol. 4, no. 1, p. 1, 1994. [Online]. Available: http://stacks.iop.org/0960-1317/4/i=1/a=001

[15] H. Belsinger and et al., "A fracture criterion for gallium arsenide wafers," Engineering Fracture Mechanics, vol. 48, no. 2, pp. 199-205, May 1994.

[16] "Aluminum oxide," Accuratus, Tech. Rep., 2002, http://www.accuratus.com/alumox.html. [Online]. Available: http://www.accuratus.com/alumox.html

[17] "Silicon nitride," Accuratus, Tech. Rep., 2002, http://www.accuratus.com/silinit.html. [Online]. Available: http://www.accuratus.com/silinit.html

[18] "Kapton polyimide film," Du Pont, Tech. Rep., 2010, http://www2.dupont.com/Kapton/. [Online]. Available: http://www2.dupont.com/Kapton/[19]

[19] J. S. Danel and G. Delapierre, "Quartz: a material for microdevices," Journal of Micromechanics and Microengineering, vol. 1, no. 4, p. 187, 1991. [Online]. Available: http://stacks.iop.org/0960-1317/1/i=4/a=001

[20] X. Li, T. Kasai, S. Nakao, H. Tanaka, T. Ando, M. Shikida, and K. Sato, "Measurement for fracture toughness of single crystal silicon film with tensile test," Sensors and Actuators A: Physical, vol. 119, no. 1, pp. 229-235, 2005. [Online]. Available: http://www.sciencedirect.com/science/article/B6THG-4CY0GYV-1/2/390b1252940707c4776e9761c6 cc3a5b

[21] M. Afsar, H. Chi, and X. Li, "Millimeter wave complex refractive index, complex dielectric permittivity and loss tangent of high purity and compensated silicon," in Precision Electromagnetic Measurements, 1990. CPEM '90 Digest, Conference on, 11-14 1990, pp. 238-239.

[22] F. P. Beer, J. E. Russell Johnston, and J. T. DeWolf, Mechanics of Materials. McGraw-Hill, 2002.

[23] M. Riaziat, R. Majidi-Ahy, and I.-J. Feng, "Propagation modes and dispersion characteristics of coplanar waveguides," Microwave Theory and Techniques, IEEE Transactions on, vol. 38, no. 3, pp. 245-251, March 1990.

[24] L. Chen, C. Zhang, T. J. Reck, C. Groppil, A. Arsenovic, A. Lichtenberger, R. M. Weikle, and N. S. Barker, "Terahertz micromachined onwafer probes: Repeatability and robustness," in International Microwave Symposium, 2011, accepted.

[25] E. Rabinowicz, Friction and Wear of Materials. John Wiley & Sons, Inc., 1995.

[26] A. Broue, J. Dhennin, F. Courtade, P.-L. Charvet, P. Pons, X. Lafontan, and R. Plana, "Thermal and topological characterization of Au, Ru and Au/Ru based MEMS contacts using nanoindenter," pp. 544-547, 2010.

[27] Z. Zhou and K. Melde, "Development of a broadband coplanar waveguide-to-microstrip transition with vias," Advanced Packaging, IEEE Transactions on, vol. 31, no. 4, pp. 861-872, November 2008.

[28] T. Reck, L. Chen, C. Zhang, C. Groppi, H. Xu, A. Arsenovic, S. Barker, A. Lichtenberger, and R. Weikle, "Micromachined on-wafer probes," Microwave Symposium Digest (MTT), 2010 IEEE MTT-S International, pp. 65-68, May 2010.

[29] C. Risacher, V. Vassilev, A. Pavolotsky, and V. Belitsky, "Waveguideto-microstrip transition with integrated bias-T," IEEE Microwave and Wireless Components Letters, vol. 13, no. 7, pp. 262-264, July 2003.

[30] D. Kasilingam and D. Rutledge, "Surface-wave losses of coplanar tranmission lines," Microwave Symposium Digenst, MTT-S International, vol. 83, no. 1, pp. 113-116, may 1983.

[31] J. Ou and M. Caggiano, "Determine two-port s-parameters from oneport measurements using calibration substrate standards," May 2005, pp. 1765-1768 Vol. 2.

[32] K. Wong, "Uncertainty analysis of the weighted least squares VNA calibration," ARFTG Microwave Measurements Conference, Fall 2004. 64th, pp. 23-31, December 2004.

[33] "Virginia Diodes Inc. waveguide band designations," Virginia Diodes Inc., Tech. Rep., 2009, http://www.virginiadiodes.com/.

[34] T. Reck, L. Chen, C. Zhang, C. Groppi, H. Xu, A. Arsenovic, S. Barker, A. Lichtenberger, and R. Weikle, "Calibration accuracy of a 625 GHZ on-wafer probe," in 76th ARFTG Microwave Measurement Conference Digest, December 2010.

[35] J. Hesler, A. Kerr, W. Grammer, and E. Wollack, "Recommendations for waveguide interfaces to 1 THZ," in 18th International Symposium on Space Terahertz Technology, 2007.

[36] P. Siegel, "Terahertz technology," Microwave Theory and Techniques, IEEE Transactions on, vol. 50, pp. 910-928, March 2002.

[37] R. Lai, X. Mei, W. Deal, W. Yoshida, Y. Kim, P. Liu, J. Lee, J. Uyeda, V. Radisic, M. Lange, et al., "Sub 50 nm InP HEMT Device with fmax Greater than 1 THz," in IEEE International Electron Devices Meeting, 2007. IEDM 2007, pp. 609-611, 2007.

[38] L. Samoska, W. Deal, G. Chattopadhyay, D. Pukala, A. Fung, T. Gaier, M. Soria, V. Radisic, X. Mei, and R. Lai, "A Submillimeter-Wave HEMT Amplifier Module With Integrated Waveguide Transitions Operating Above 300 GHz," Microwave Theory and Techniques, IEEE Transactions on, vol. 56, pp. 1380-1388, June 2008.

[39] A. Fung, D. Dawson, L. Samoska, K. Lee, C. Oleson, and G. Boll, "On-wafer vector network analyzer measurements in the 220-325 GHz frequency band," in Microwave Symposium Digest, 2006. IEEE MTT-S International, pp. 1931-1934, IEEE, 2007.

[40] T. J. Reck, L. Chen, C. Zhang, C. Groppi, H. Xu, A. Arsenovic, N. S. Barker, A. Lichtenberger, and R. M. Weikle, "Micromachined on wafer probes," in Microwave Symposium Digest, 2010, IEEE MTT-S International, June 2010.

[41] R. Bass, A. Lichtenberger, R. Weikle, S. Pan, E. Bryerton, J. Kooi, and C. Walker, "Ultra-thin silicon chips for submillimeter-wave applications," in Proceedings of the Fifteenth International Symposium on Space THz Technology, March 2004

[42] U.S. Pat. No. 4,727,319, Shahriary, I., "Apparatus for On-Wafer Tasting of Electrical Circuits", Feb. 23, 1988.

[43] U.S. Pat. No. 5,003,253, Majidi-Ahy, et al., "Millimeter-Wave Active Probe System", Mar. 26, 1991.

[44] U.S. Pat. No. 6,759,859 B2, Deng, et al., "Resilient and Rugged Multi-Layered Probe", Jul. 6, 2004.

[45] U.S. Pat. No. 6,930,497 B2, Deng, et al., "Flexible Multi-Layered Probe for Measuring a Signal from an Object", Aug. 16, 2005.

[46] U.S. Patent Application Publication No. US 2003/0112024 A1, Deng, et al., "Resilient and Rugged Probe", Jun. 19, 2003.

[47] U.S. Patent Application Publication No. US 2004/0189334 A1, Deng, et al., "Flexible Multi-Layered Probe", Sep. 30, 2004.

[48] U.S. Patent Application Publication No. US 2005/0201683 A1, Ghiron, et al., Sep. 15, 2005.

[49] U.S. Pat. No. 7,233,160 B2, Hayden, et al., "Wafer Probe", Jun. 19, 2007.

[50] U.S. Pat. No. 7,456,646 B2, Hayden, et al., "Wafer Probe", Nov. 25, 2008.

[51] U.S. Pat. No. 7,495,461, B2, Hayden, et al., "Wafer Probe", Feb. 24, 2009.

[52] U.S. Pat. No. 6,242,930 B1, Matsunaga, et al., "High-Frequency Probe Capable of Adjusting Characteristic Impedance in End Part and Having the End Part Detachable", Jun. 5, 2001.

[53] U.S. Pat. No. 4,849,689, Gleason, et al., "Microwave Wafer Probe Having Replaceable Probe Tip", Jul. 18, 1989.

[54] U.S. Pat. No. 7,619,419 B2, Campbell, R., "Wideband Active-Passive Differential Signal Probe", Nov. 17, 2009.

[55] U.S. Pat. No. 4,641,140, Heckaman, et al., "Miniaturized Microwave Transmission Link", Feb. 3, 1987.

[56] U.S. Pat. No. 4,894,612, Drake, et al., "Soft Probe for Providing High Speed On-Wafer Connections to a Circuit", Jan. 16, 1990.

[57] U.S. Pat. No. 7,504,842 B2, Schwindt, R., "Probe Holder for Testing of a Test Device", Mar. 17, 2009.

[58] U.S. Pat. No. 5,477,159, Hamling, D., "Integrated Circuit Probe Fixture with Detachable High Frequency Probe Carrier", Dec. 19, 1995.

[59] U.S. Pat. No. 5,231,349, Majidi-Ahy, et al., "Millimeter-Wave Active Probe System", Jul. 27, 1993.

[60] EP Patent Application Publication No. 0 367 542 A3, Gleason, et al., "Microwave Wafer Probe Having Replaceable Probe Tip", May 9, 1990; Application No. 89311203.7, filed Oct. 30, 1989.

[61] EP Patent Application Publication No. 0 367 542 A2, Gleason, et al., "Microwave Wafer Probe Having Replaceable Probe Tip". May 9, 1990; Application No. 89311203.7, filed Oct. 20, 1989.

[62] U.S. Pat. No. 7,427,868, B2, Strid, et al., "Active Wafer Probe", Sep. 23, 2008.

[63] U.S. Pat. No. 7,449,899 B2, Campbell, et al., "Probe for High Frequency Signals", Nov. 11, 2008.

[64] U.S. Pat. No. 4,827,211 B2, Strid, et al., "Wafer Probe", May 2, 1989.

[65] U.S. Pat. No. 7,304,488 B2, Gleason, et al., "Shielded Probe for High-Frequency Testing of a Device Under Test", Dec. 4, 2007.

[66] U.S. Pat. No. 7,436,194 B2, Gleason, et al., "Shielded Probe with Low Contact Resistance for Testing a Device Under Test", Oct. 14, 2008.

[67] U.S. Pat. No. 7,501,842, B2, Gleason, et al., "Shielded Probe for Testing a Device Under Test", Mar. 10, 2009.

[68] U.S. Patent Application Publication No. US2008/0042671 A1, Gleason, et al., "Probe for Testing a Device Under Test", Feb. 21, 2008; U.S. patent application Ser. No. 11/975,471, filed Oct. 19, 2007.

[69] International Patent Application Publication No. WO 2004/107401 A2, Gleason, et al., "Probe for Testing a Device Under Test", Dec. 9, 2004; International Patent Application Serial No. PCT/US2004/012806, filed Apr. 26, 2004.

[70] U.S. Pat. No. 5,565,788, Burr, et al., "Coaxial Wafer Probe with Tip Shielding", Oct. 15, 1996.

[71] U.S. Pat. No. 7,498,829 B2, Gleason, et al., "Shielded Probe for Testing a Device Under Test", Mar. 3, 2009.

[72] U.S. Pat. No. 7,394,269 B2, Gleason, et al., "Probe for Testing a Device Under Test", Jul. 1, 2008.

[73] U.S. Pat. No. 7,271,603 B2, Gleason, et al., "Shielded Probe for Testing a Device Under Test", Sep. 18, 2007.

[74] U.S. Pat. No. 7,057,404 B2, Gleason, et al., "Shielded Probe for Testing a Device Under Test", Jun. 6, 2006.

[75] U.S. Pat. No. 7,688,097 B2, Hayden, et al., "Wafer Probe", Mar. 30, 2010.

[76] U.S. Pat. No. 7,898,273, B2, "Gleason, et al., "Probe for Testing a Device Under Test", Mar. 1, 2011.

It should be understood that the above dimensions are exemplary for the illustrated applications, and should not be construed as limiting the invention. While remaining within the scope of the present invention, actual dimensions may vary and may be influenced by a variety of factors and limitations—including the present invention system, devices and methods as well as environmental factors or device under test (DUT) factors. Accordingly, various systems, methods, and devices (including dimensions) may be employed within the context of the present invention.

Unless clearly specified to the contrary, there is no requirement for any particular described or illustrated activity or element, any particular sequence or such activities, any particular size, speed, material, duration, contour, dimension or frequency, or any particularly interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. It should be appreciated that aspects of the present invention may have a variety of sizes, contours, shapes, compositions and materials as desired or required.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. A device for probing a structure on a surface of an object substrate, said device comprising a compliant chip, wherein said compliant chip comprises a monolithic integrated circuit assembly comprising integrated electrical interconnects, said integrated electrical interconnects including:
   at least one compliant beam oriented at a specified non-parallel angle with respect to said surface of said object substrate, said at least one compliant beam configured to electrically and mechanically probe said structure on said object substrate;
   at least one transmission circuit; and
   a waveguide transition element, wherein said at least one transmission circuit suitable to electrically interconnect said at least one compliant beam with said waveguide transition element.

2. The device of claim 1, wherein said compliant chip is configured to be secured by a housing.

3. The device of claim 2, wherein said compliant chip is configured to be secured by said housing including a detachable engagement of said compliant chip to said housing.

4. The device of claim 2, wherein said securement is provided by compressive forces.

5. The device of claim 2, wherein said housing comprises an aperture configured to receive said compliant chip.

6. The device of claim 5, wherein said housing aperture comprises at least one of the following: slot, groove, recess, channel, tunnel, indentation, passage, split, or port.

7. The device of claim 2, wherein said housing is configured to be re-usable when said compliant chip is detached and replaced with another compliant chip.

8. The device of claim 1, wherein said integrated electrical interconnects of said compliant chip further comprises:
   at least one of at least one bias current circuit or at least one bias voltage circuit, wherein said at least one bias current circuit or at least one bias voltage circuit is configured to electrically interconnect with said structure on said surface of said object substrate when said at least one compliant beam makes contact with said structure on said surface of said object substrate.

9. The device of claim 1, wherein said compliant chip is configured to perform with direct current (DC) transmission.

10. The device of claim 1, wherein when said compliant chip is pressed against said structure on a surface of said object substrate, the compliant chip makes electrical contact between said structure on said surface and said integrated electrical interconnects.

11. The device of claim 10, where the pressing causes flexure in said compliant chip.

12. The device of claim 1, wherein said at least one compliant beam comprises:
   at least one contact tip, wherein said at least one contact tip electrically interconnected with said at least one compliant beam, and wherein said at least one contact tip configured to contact said structure on said surface of said object substrate when pressed against it.

13. The device of claim 12, wherein said at least one contact tip configured to be compliant when said contact tip contacts the structure on a surface of an object substrate when pressed against it.

14. The device of claim 12, wherein a plurality of said contact tips configured as a coplanar waveguide (CPW) in communication with said at least one transmission circuit.

15. The device of claim 1, wherein said at least one compliant beam comprises:
   a ground-signal (GS) circuit, wherein said ground-signal (GS) circuit electrically interconnected with said at least one transmission circuit, and wherein said at a ground-signal circuit (GS) configured to electrically interconnect with the structure on a surface of an object substrate when said at least one compliant beam is pressed against it.

16. The device of claim 1, further comprising:
   a secondary device for probing the structure on a surface of an object substrate, said secondary device comprising a secondary compliant chip, wherein said secondary compliant chip comprises a secondary monolithic integrated circuit assembly comprising secondary integrated electrical interconnects, and wherein said secondary compliant chip is configured to be secured by a secondary housing.

17. A device for probing a structure on a surface of an object substrate, said device comprising a compliant chip, wherein said compliant chip comprises a monolithic integrated circuit assembly comprising integrated electrical interconnects;
   wherein said integrated electrical interconnects of said compliant chip comprise:
      at least one compliant beam oriented at a specified non-parallel angle with respect to said surface of said object substrate;
      at least one transmission circuit; and
      a waveguide transition element, wherein said at least one transmission circuit suitable to electrically interconnect said at least one compliant beam with said waveguide transition element;
   wherein said compliant chip is configured to be secured by a housing;
   wherein when said compliant beam is pressed against said structure on said surface of said object substrate: (1) said pressing causes flexure in said compliant beam; and (2) said compliant beam makes electrical contact between said structure and said integrated electrical interconnects.

18. The device of claim 17, wherein said integrated electrical interconnects of said compliant chip further comprise:
   at least one of at least one bias current circuit or at least one bias voltage circuit, wherein said at least one bias current circuit or at least one bias voltage circuit is configured to electrically interconnect with the structure on a surface of an object substrate when said at least one compliant beam makes contact with said structure on a surface of an object substrate.

19. A method of testing a structure on a surface of an object substrate, wherein said testing method comprises:
   electrically probing said surface of an object substrate using a device comprising a compliant chip, wherein said compliant chip comprises a monolithic integrated circuit assembly including integrated electrical interconnects; and
   electrically interconnecting the device to a measurement instrument;
   wherein said integrated electrical interconnects of said compliant chip comprise:
      at least one compliant beam oriented at a specified non-parallel angle with respect to said surface of said object substrate;
      at least one transmission circuit; and
      a waveguide transition element, wherein said at least one transmission circuit suitable to electrically interconnect said at least one compliant beam with said waveguide transition element; and
   wherein the electrically probing said surface of said object substrate comprises pressing said compliant beam against said structure on said surface of said object substrate, including (1) causing flexure in said compliant beam; and (2) establishing electrical contact between said structure and said integrated electrical interconnects using said compliant beam.

20. The method of claim 19, wherein the surface on the object substrate comprises a sample of material with appropriate contacts or some other geometric feature that has been fabricated on the substrate surface.

21. The method of claim 19, comprising securing said compliant chip using a housing.

22. The method of claim 21, wherein said securement comprises detachably engaging said compliant chip to said housing.

23. The method of claim 22, wherein said securement provided by compressive forces.

24. The method of claim 21, wherein said housing comprises an aperture configured to receive said compliant chip.

25. The method of claim 24, wherein said housing aperture comprises at least one of the following: slot, groove, recess, channel, tunnel, indentation, passage, split, or port.

26. The method of claim 21, wherein said housing is configured to be re-usable when said compliant chip is detached and replaced with another compliant chip.

27. The method of claim 19, wherein said integrated electrical interconnects of said compliant chip further comprise:
   at least one of at least one bias current circuit or at least one bias voltage circuit, wherein said at least one bias current circuit or at least one bias voltage circuit is configured to electrically interconnect with the structure on a surface of an object substrate when said at least one compliant beam makes contact with said structure on a surface of an object substrate; and
   wherein the method comprising biasing the structure on the surface of the object substrate using at least one of the bias current circuit or the bias voltage circuit.

* * * * *